(12) United States Patent
Song et al.

(10) Patent No.: US 11,837,570 B2
(45) Date of Patent: Dec. 5, 2023

(54) LIGHT EMITTING DEVICE PACKAGE

(71) Applicant: SUZHOU LEKIN SEMICONDUCTOR CO., LTD., Taicang (CN)

(72) Inventors: June O Song, Seoul (KR); Ki Seok Kim, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 0 days.

(21) Appl. No.: 17/824,204

(22) Filed: May 25, 2022

(65) Prior Publication Data

US 2022/0293548 A1  Sep. 15, 2022

Related U.S. Application Data

(62) Division of application No. 16/646,623, filed as application No. PCT/KR2018/010827 on Sep. 14, 2018, now Pat. No. 11,373,973.

(30) Foreign Application Priority Data

Sep. 15, 2017 (KR) .................. 10-2017-0118981

(51) Int. Cl.
*H01L 23/00* (2006.01)
*H01L 33/48* (2010.01)
(Continued)

(52) U.S. Cl.
CPC ............ *H01L 24/32* (2013.01); *H01L 33/486* (2013.01); *H01L 33/60* (2013.01); *H01L 33/62* (2013.01);
(Continued)

(58) Field of Classification Search
CPC ......... H01L 33/54; H01L 33/48; H01L 24/24; H01L 33/486; H01L 23/49861;
(Continued)

(56) References Cited

U.S. PATENT DOCUMENTS

2007/0187706 A1   8/2007  Higashi et al.
2008/0191227 A1*  8/2008  Kimura .................. H01L 33/62
                                            257/E33.057
(Continued)

FOREIGN PATENT DOCUMENTS

JP       2007-220852 A    8/2007
KR   10-2012-0056164 A    6/2012
(Continued)

OTHER PUBLICATIONS

International Search Report dated Dec. 28, 2018 issued in Application No. PCT/KR2018/010827.

*Primary Examiner* — Mouloucoulaye Inoussa
(74) *Attorney, Agent, or Firm* — Birch, Stewart, Kolasch & Birch, LLP

(57) ABSTRACT

A light emitting device package including a package body comprising a first opening; a light emitting device disposed in the first opening and including a first bonding part and a second bonding part; a first conductor disposed below the first bonding part; and a second conductor disposed below the second bonding part. Further, the first conductor is electrically connected to the first bonding part, and the second conductor is electrically connected to the second bonding part.

20 Claims, 26 Drawing Sheets

(51) Int. Cl.
*H01L 33/60* (2010.01)
*H01L 33/62* (2010.01)
*H01L 33/50* (2010.01)

(52) U.S. Cl.
CPC .. *H01L 33/502* (2013.01); *H01L 2224/32237* (2013.01)

(58) Field of Classification Search
CPC ......... H01L 24/32; H01L 33/62; H01L 33/60; H01L 24/20; H01L 24/92; H01L 24/82; H01L 24/19; H01L 23/49548; H01L 24/13; H01L 24/29; H01L 24/16; H01L 24/83; H01L 33/50; H01L 33/502; H01L 33/38; H01L 33/44; H01L 33/22; H01L 24/14; H01L 33/641; H01L 33/20; H01L 33/0075; H01L 33/382; H01L 33/56; H01L 33/005; H01L 24/48; H01L 33/483; H01L 24/45; H01L 24/49; H01L 25/0753; H01L 25/167; H01L 33/52; H01L 33/508; H01L 33/505; H01L 2224/13123; H01L 2224/32225; H01L 2224/13139; H01L 2224/13155; H01L 2224/13164; H01L 2224/13117; H01L 2224/13173; H01L 2224/16235; H01L 2224/13169; H01L 2224/13109; H01L 2924/12041; H01L 2224/13138; H01L 2224/13166; H01L 2224/13176; H01L 2224/13186; H01L 2224/13111; H01L 2224/92144; H01L 2224/13144; H01L 2224/13163; H01L 2224/13181; H01L 2224/24245; H01L 2224/13171; H01L 2224/73217; H01L 2224/12105; H01L 2224/13178; H01L 2924/01322; H01L 2933/0066; H01L 2933/0058; H01L 2224/48139; H01L 2924/01042; H01L 2924/12035; H01L 2224/48228; H01L 2924/0103; H01L 2924/01014; H01L 2224/45124; H01L 2924/01013; H01L 2224/83192; H01L 2224/92247; H01L 2924/01078; H01L 2924/01028; H01L 2924/01005; H01L 2924/01012; H01L 2924/01074; H01L 2924/01079; H01L 2224/45147; H01L 2924/01063; H01L 2924/12044; H01L 2924/00014; H01L 2924/01006; H01L 2924/01032; H01L 2924/01077; H01L 2224/49175; H01L 2224/73204; H01L 2924/01024; H01L 2924/01025; H01L 2924/09701; H01L 2224/48227; H01L 2933/005; H01L 2224/16225; H01L 2933/0033; H01L 2933/0041; H01L 2224/13013
USPC .... 174/252, 266, 260, 255; 977/742, 98, 99, 977/415, E29.324, E21.499, E33.057, 977/E33.072, E21.53; 438/7, 16, 51, 26
See application file for complete search history.

(56) References Cited

U.S. PATENT DOCUMENTS

| | | |
|---|---|---|
| 2009/0078956 A1 | 3/2009 | Tseng et al. |
| 2009/0101897 A1 | 4/2009 | Murphy et al. |
| 2010/0207218 A1* | 8/2010 | Taguchi ................. H01L 24/05 29/832 |
| 2011/0300644 A1* | 12/2011 | Akimoto ............... H01L 33/508 257/E21.53 |
| 2012/0168206 A1* | 7/2012 | Sekine .............. H01L 23/49827 174/266 |
| 2013/0026502 A1 | 1/2013 | Park |
| 2013/0037842 A1* | 2/2013 | Yamada ................. H01L 33/60 257/E33.072 |
| 2014/0332839 A1* | 11/2014 | Choi ....................... H01L 24/17 257/99 |
| 2016/0035952 A1* | 2/2016 | Yamada ................ H01L 33/005 438/27 |
| 2016/0218262 A1* | 7/2016 | Aketa .................... H01L 33/486 |
| 2017/0244012 A1 | 8/2017 | Choi et al. |
| 2018/0211942 A1* | 7/2018 | Hung .................. H01L 25/0753 |
| 2019/0019926 A1 | 1/2019 | Lee et al. |
| 2019/0019929 A1* | 1/2019 | Lim ....................... H01L 33/62 |
| 2019/0027641 A1* | 1/2019 | Lee ....................... H01L 33/486 |
| 2019/0088824 A1* | 3/2019 | Kim ....................... H01L 33/54 |
| 2019/0088837 A1 | 3/2019 | Lee et al. |
| 2019/0207062 A1 | 7/2019 | Kim et al. |
| 2019/0333896 A1 | 10/2019 | Song et al. |
| 2019/0334063 A1 | 10/2019 | Kim et al. |
| 2019/0334066 A1 | 10/2019 | Lim et al. |
| 2020/0058829 A1 | 2/2020 | Kim et al. |
| 2020/0279982 A1 | 9/2020 | Lim et al. |
| 2020/0287107 A1 | 9/2020 | Lim et al. |
| 2020/0303596 A1 | 9/2020 | Lim et al. |
| 2020/0335675 A1 | 10/2020 | Kim et al. |
| 2020/0411738 A1 | 12/2020 | Kim et al. |

FOREIGN PATENT DOCUMENTS

| | | |
|---|---|---|
| KR | 10-2013-0014197 A | 2/2013 |
| KR | 10-2014-0061797 A | 5/2014 |
| KR | 10-2015-0141337 A | 12/2015 |

* cited by examiner

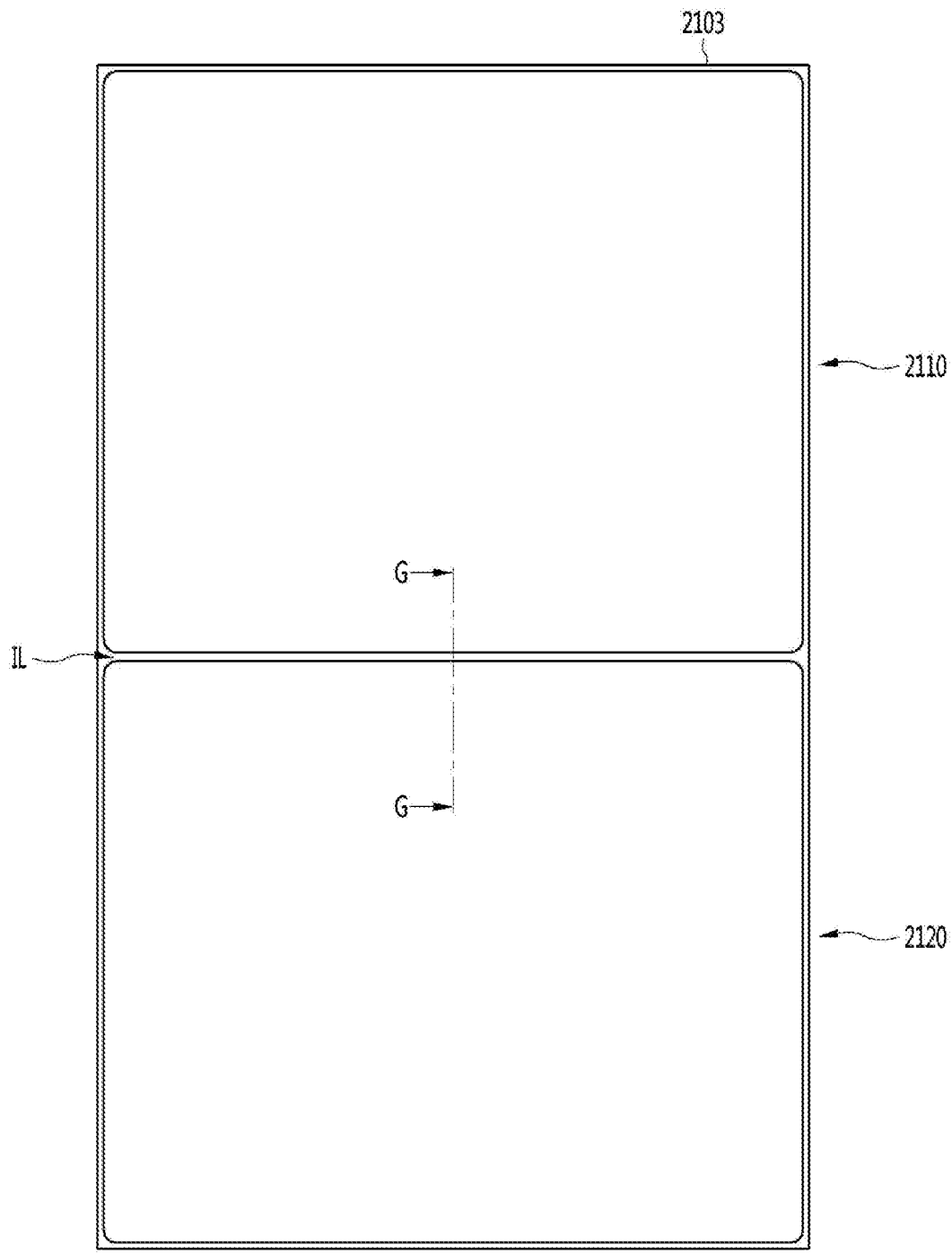

LIGHT EMITTING DEVICE PACKAGE

CROSS-REFERENCE TO RELATED PATENT APPLICATIONS

This application is a Divisional application of U.S. application Ser. No. 16/646,623, filed on Mar. 12, 2020 (now U.S. Pat. No. 11,373,973 issued on Jun. 28, 2022), which is the U.S. National Stage Application under 35 U.S.C. § 371 of PCT Application No. PCT/KR2018/010827, filed on Sep. 14, 2018, which claims priority to Korean Patent Application No. 10-2017-0118981, filed on Sep. 15, 2017, whose entire disclosures are hereby incorporated by reference.

TECHNICAL FIELD

Embodiments relate to a semiconductor device package, a method of manufacturing a semiconductor device package, and a light source device.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

As the semiconductor devices capable of providing high output are requested, studies on the semiconductor devices capable of increasing in output by applying high power are being conducted.

Also, in the semiconductor device package, studies on methods of improving light extraction efficiency of the semiconductor device and improving the brightness at a stage of the package are being conducted. Also, in the semiconductor device package, studies on methods of improving bonding strength between the package electrode and the semiconductor device are being conducted.

Also, in the semiconductor device package, studies on methods of reducing the manufacturing costs and improving the manufacturing yield through the improvement of process efficiency and the structural change are being conducted.

SUMMARY

Embodiments provide a semiconductor device package that is capable of improving light extraction efficiency and electrical characteristics, a method of manufacturing the semiconductor device package, and a light source device.

Embodiments provide a semiconductor device package that is capable of improving process efficiency and proposing a new package structure to reduce manufacturing costs and improve manufacturing yield, a method of manufacturing the semiconductor device package, and a light source device.

Embodiments provide a semiconductor device package that is capable of preventing re-melting from occurring in a bonding area of the semiconductor device package while the semiconductor device package is re-bonded to a substrate or the like, and a method of manufacturing the semiconductor device package.

A light emitting device package according to an embodiment may comprises: a first package body comprising first and second openings; a second package body disposed on the first package body and comprising a third opening; a light emitting device disposed in the third opening; a first resin disposed between an upper surface of the first package body and the light emitting device; and a second resin disposed in the third opening, wherein the upper surface of the first package body may be bonded to a lower surface of the second package body, wherein the first package body may comprise a recess that is recessed from the upper surface to a lower surface of the first package body, wherein the first resin may be disposed in the recess, wherein the first resin and the second resin may comprise materials different from each other, and wherein the first resin may contact the light emitting device and the second resin.

According to an embodiment, at least one of the first package body and the second package body may comprise a wavelength conversion material.

According to an embodiment, at least one of the first package body and the second package may be formed of a transparent resin.

According to an embodiment, at least one of the first package body and the second package may be formed of a reflective resin.

According to an embodiment, the first package body and the second package body may comprise materials different from each other.

According to an embodiment, the first package body and the second package body may comprise different materials selected from PPA, PCT, EMC, SMC, and PI, and the first package body may comprise a reflective material, and the second package body may comprise a wavelength conversion material.

According to an embodiment, the first package body and the second package body may comprise different materials selected from PPA, PCT, EMC, SMC, and PI, and the first package body may comprise a wavelength conversion material, and the second package body may comprise a reflective material.

According to an embodiment, the first package body and the second package body may comprise different materials selected from PPA, PCT, EMC, SMC, and PI, and the first package body may be formed of a transparent resin, and the second package body may comprise at least one of a wavelength conversion material and a reflective material.

According to an embodiment, the light emitting device may further comprise an adhesion layer disposed between the first package body and the second package body.

According to an embodiment, the light emitting device may comprise a first bonding part disposed on the first opening and a second bonding part disposed on the second opening, the recess may be provided in a closed loop shape around the first and second openings, and when viewed from an upper side of the light emitting device, the light emitting device may have a size greater than a closed loop area provided by the recess.

Advantageous Effects

According to the semiconductor device package and the method of manufacturing the semiconductor device package according to the embodiment, there is the advantage in improving the light extraction efficiency, the electrical characteristics, and the reliability.

According to the semiconductor device package and the method of manufacturing the semiconductor device package according to the embodiment, there is the advantage in improving the process efficiency and proposing the new package structure to reduce the manufacturing costs and improve the manufacturing yield.

The semiconductor device package according to the embodiment may be provided with the body having the high reflectance to prevent the reflector from being discolored, thereby improving the reliability of the semiconductor device package.

According to the semiconductor device package and the method of manufacturing the semiconductor device according to the embodiment, there is the advantage in preventing the re-melting phenomenon from occurring in the bonding area of the semiconductor device package while the semiconductor device package is re-bonded on the substrate and the like, or thermally treated.

BRIEF DESCRIPTION OF THE DRAWINGS

FIGS. 15a and 15b are views explaining a process of performing an isolation process by the method of manufacturing the light emitting device according to an embodiment of the present invention.

DETAILED DESCRIPTION

Hereinafter, embodiments will be described with reference to the accompanying drawings. In the description of embodiments, it will be understood that when a layer (or film), region, pattern or structure is referred to as being 'on/over' or 'under' another layer (or film), region, pattern or structure, the terminology of 'on/over' and 'under' includes both the meanings of 'directly' and 'indirectly'. In addition, the criteria for the on/over or under each layer will be described based on the drawings, but the embodiment is not limited thereto.

Hereinafter, a semiconductor device package and a method of manufacturing the semiconductor device package according to embodiments will be described with reference to the accompanying drawings. Hereinafter, a description will be given based on a case in which a light emitting device is applied as an example of a semiconductor device.

Figure 1:
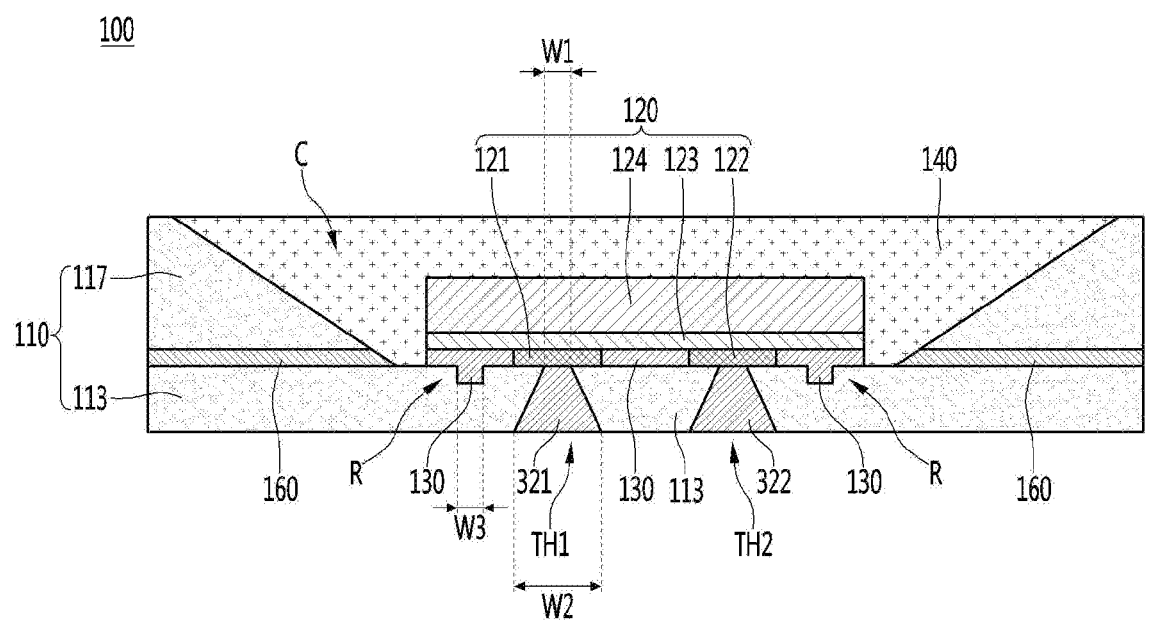
FIG. 1 is a view of a light emitting device package according to an embodiment of the present invention.

First, a light emitting device package according to an embodiment of the present invention will be described with reference to FIGS. 1 to 3. FIG. 1 is a view of a light emitting device package according to an embodiment of the present invention, FIG. 2 is an exploded perspective view explaining the light emitting device package according to an embodiment of the present invention, and FIG. 3 is a view explaining an arrangement relationship between a package body, a recess, and an opening of the light emitting device package according to an embodiment of the present invention.

Figure 2:
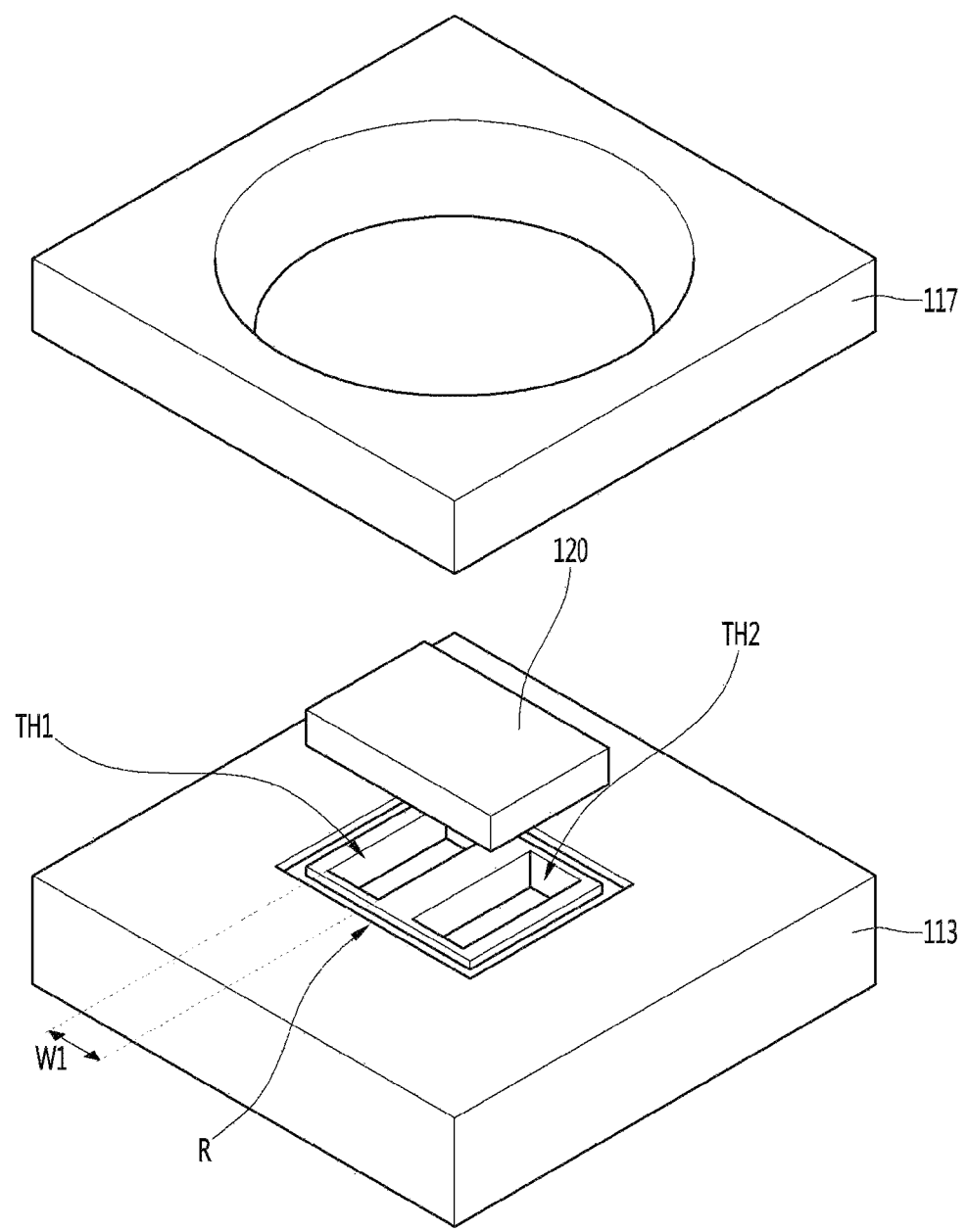
FIG. 2 is an exploded perspective view explaining the light emitting device package according to an embodiment of the present invention.
Figure 3:
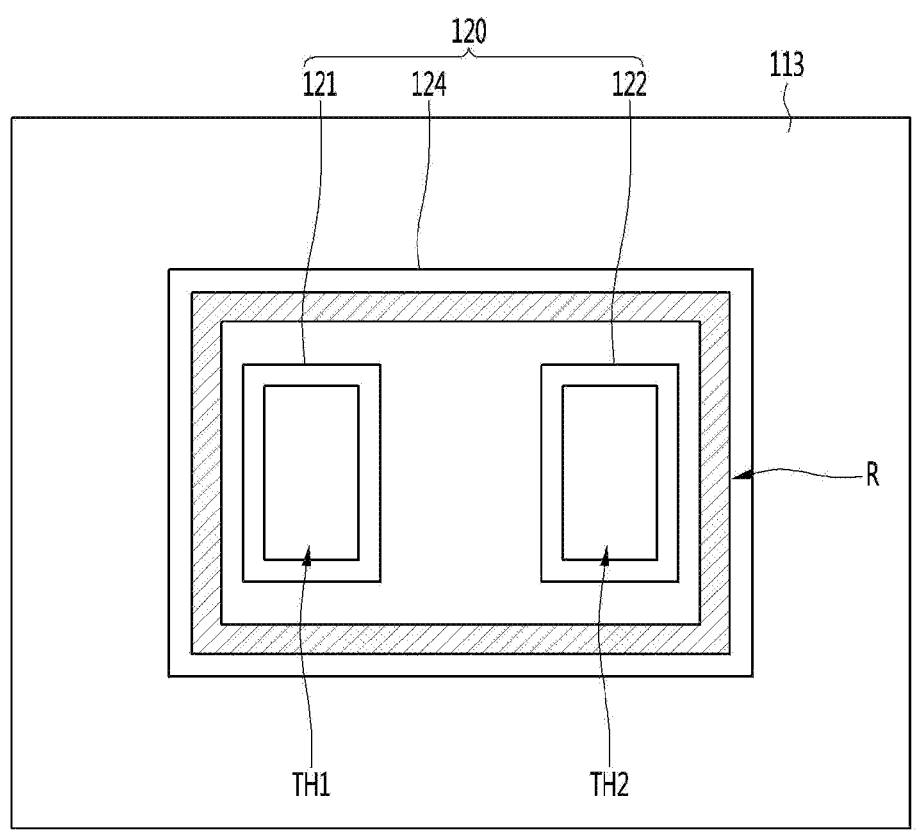
FIG. 3 is a view explaining an arrangement relationship between a package body, a recess, and an opening of the light emitting device package according to an embodiment of the present invention.

As illustrated in FIGS. 1 to 3, a light emitting device package 100 according to the embodiment may comprise a package body 110 and a light emitting device 120.

The package body 110 may comprise a first package body 113 and a second package body 117. The second package body 117 may be disposed on the first package body 113. The second package body 117 may be disposed around an upper surface of the first package body 113. The second package body 117 may provide a cavity C in the upper surface of the first package body 113. The second package body 117 may comprise an opening passing through the upper and lower surfaces thereof.

In other words, the first package body 113 may be referred to as a lower body, and the second package body 117 may be referred to as an upper body. Also, according to an embodiment, the package body 110 may not comprise the second package body 117 that provides the cavity but may comprise only the first package body 113 that provides a flat upper surface.

The second package body 117 may reflect light emitted from the light emitting device 120 in an upward direction. The second package body 117 may be disposed to be inclined with respect to the upper surface of the first package body 113.

The package body 110 may comprise the cavity C. The cavity may comprise a lower surface and a side surface inclined from the lower surface to the upper surface of the package body 110.

According to an embodiment, the package body 110 may have a structure having the cavity C or may have a structure having a flat upper surface without the cavity C.

For example, the package body 110 may be formed of at least one selected from a group including polyphthalamide (PPA), polychloro triphenyl (PCT), a liquid crystal polymer (LCP), polyamide9T (PA9T), silicone, an epoxy molding compound (EMC), a silicone molding compound (SMC), ceramic, polyimide (PI), photo sensitive glass (PSG), sapphire ($Al_2O_3$), and the like. Also, the package body 110 may comprise a reflective material of a high refractive filler, such as $TiO_2$ and $SiO_2$. The package body 110 may comprise a wavelength conversion material such as a quantum dot and a phosphor.

According to an embodiment, the first package body 113 and the second package body 117 may comprise different materials. For example, the first package body 113 and the second package body 117 may be bonded to each other after being formed of different materials in different processes. For example, the first package body 113 and the second package body 117 may be bonded to each other through an adhesion layer 160.

The adhesion layer 160 may be disposed between the first package body 113 and the second package body 117. The adhesion layer 160 may be disposed on the upper surface of the first package body 113. The adhesion layer 160 may be disposed on the lower surface of the second package body 117. The adhesion layer 160 may be disposed around the light emitting device 120 to provide the cavity.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120. When the adhesion layer 160 has a reflective function, the adhesion layer 160 may comprise white silicone.

Each of the first package body 113 and the second package body 117 may comprise at least one selected from resin materials including polyphthalamide (PPA), polychloro triphenyl (PCT), a liquid crystal polymer (LCP), polyamide9T (PA9T), silicone, an epoxy molding compound (EMC), a silicone molding compound (SMC), polyimide (PI), and the like, as a base material.

Also, each of the first package body 113 and the second package body 117 may comprise at least one of the reflective material and the wavelength conversion material. Also, the first package body 113 and the second package body 117 may not comprise the reflective material and the wavelength conversion material. Each of the first package body 113 and the second package body 117 may be formed of a transparent resin.

The first package body 113 and the second package body 117 may comprise different base materials. The first package body 113 and the second package body 117 may comprise different resins.

For example, the first package body 113 may comprise a reflective material and the second package body 117 may comprise a wavelength conversion material. Also, the first package body 113 may comprise the wavelength conversion material, and the second package body 117 may comprise the reflective material.

According to an embodiment, the first package body 113 may comprise the reflective material, and the second package body 117 may comprise the reflective material and the wavelength conversion material. Also, the first package body 113 may comprise the reflective material and the wavelength conversion material, and the second package body 117 may comprise the wavelength conversion material.

In the light emitting device package 100 according to the embodiment, the first package body 113 and the second package body 117 including different base materials may be formed separately in different processes and then be manufactured in a modular manner through an optional combination that is capable of satisfying characteristics required for the application product. A method of manufacturing the light emitting device package according to an embodiment will be described later.

According to an embodiment, the light emitting device 120 may comprise a first bonding part 121, a second bonding part 122, a light emitting structure 123, and a substrate 124.

The light emitting device 120 may comprise the light emitting structure 123 disposed under the substrate 124. The light emitting structure 123 may comprise a first conductivity type semiconductor layer, a second conductivity type semiconductor layer, an active layer disposed between the first conductivity type semiconductor layer and the second conductivity type semiconductor layer. The first bonding part 121 may be electrically connected to the first conductivity type semiconductor layer. Also, the second bonding part 122 may be electrically connected to the second conductivity type semiconductor layer.

The light emitting device 120 may be disposed on the package body 110. The light emitting device 120 may be disposed on the first package body 113. The light emitting device 120 may be disposed in the cavity C provided by the second package body 117.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed between the light emitting structure 123 and the first package body 113. The second bonding part 122 may be disposed between the light emitting structure 123 and the first package body 113.

Each of the first bonding part 121 and the second bonding part 122 may be provided as a single layer or a multilayer by using one or more materials selected from a group including Ti, Al, Sn, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, and Ni/$IrO_x$/Au/ITO, or an alloy thereof.

As illustrated in FIGS. 1 to 3, the light emitting device package 100 according to the embodiment may comprise a first opening TH1 and a second opening TH2.

The package body 110 may comprise the first opening TH1 passing through the lower surface of the package body 110 from the lower surface of the cavity C. The package body 110 may comprise the second opening TH2 passing through the lower surface of the package body 110 from the lower surface of the cavity C.

For example, the first package body 113 may have a flat lower surface and may comprise an upper surface parallel to the lower surface. The first and second openings TH1 and TH2 may pass through the upper and lower surfaces of the first package body 113.

The first opening TH1 may be provided in the first package body 113. The first opening TH1 may be provided to pass through the first package body 113. The first opening TH1 may be provided to pass through the upper and lower surfaces of the first package body 113 in a first direction.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be provided in the first package body 113. The second opening TH2 may be provided to pass through the first package body 113. The second opening TH2 may be provided to pass through the upper and lower surfaces of the first package body 113 in the first direction.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The first opening TH1 and the second opening TH2 may be spaced apart from each other. The first opening TH1 and the second opening TH2 may be spaced apart from each other under the lower surface of the light emitting device 120.

According to an embodiment, a width W1 of an upper region of the first opening TH1 may be less than or equal to a width of the first bonding part 121. Also, a width of the upper region of the second opening TH2 may be less than or equal to a width of the second bonding part 122.

Also, the width W1 of the upper region of the first opening TH1 may be less than or equal to a width W2 of a lower region of the first opening TH1. Also, the width of the upper region of the second opening TH2 may be less than or equal to a width of a lower region of the second opening TH2.

The first opening TH1 may be provided in an inclined shape of which a width gradually decreases from the lower region to the upper region. The second opening TH2 may be provided in an inclined shape of which a width gradually decreases from the lower region to the upper region.

However, the present invention is not limited thereto, and an inclined surfaces between the upper and lower regions of the first and second openings TH1 and TH2 may have a plurality of inclined surfaces having different inclinations, and each of the inclined surfaces may be disposed at a curvature. A width between the first opening TH1 and the second opening TH2 on an area of the lower surface of the first package body 113 may be provided to several hundred micrometers. A width between the first opening TH1 and the second opening TH2 on an area of the lower surface of the first package body 113 may be provided to 100 micrometers to 150 micrometers.

The width between the first opening TH1 and the second opening TH2 on the area of the lower surface of the first package body 113 may be selected to be provided to a predetermined distance or more so as to prevent electrical short circuit from occurring between the bonding parts when the light emitting device package 100 according to an embodiment is mounted on a circuit board, a submount, and the like.

Referring to FIGS. 1 to 3, the light emitting device package 100 according to an embodiment may comprise a recess R. The recess R may be provided to be recessed from the lower surface of the cavity C to the lower surface of the package body 110.

The recess R may be provided in the first package body 113. The recess R may be provided to be recessed from the upper surface to the lower surface of the first package body 113. The recess R may be disposed under the light emitting device 120.

The recess R may be provided between the first opening TH1 and the second package body 117. Also, the recess R may be provided between the second opening TH2 and the second package body 117. For example, the recess R may be provided in a closed loop shape under the light emitting device 120.

When viewed from an upper side of the light emitting device 120, the recess R may be disposed between the first bonding part 121 and the second package body 117 disposed adjacent to the first opening TH1.

Also, when viewed from the upper side of the light emitting device 120, the recess R may be disposed between the second bonding part 122 and the second package body 117 disposed adjacent to the second opening TH2.

The recess R may be provided in a closed loop shape around the first and second openings TH1 and TH2.

When viewed from the upper side of the light emitting device 120, a size of the light emitting device 120 may be greater than a closed loop area provided by the recess R.

When viewed from the upper side of the light emitting device 120, a closed loop defined by the recess R may be provided inside an outline connecting four side surfaces of the light emitting device 120 to each other.

As illustrated in FIG. 1, the light emitting device package 100 according to an embodiment may comprise a first resin 130.

The first resin 130 may be disposed in the recess R. The first resin 130 may be disposed between the light emitting device 120 and the first package body 113. The first resin 130 may be disposed between the first bonding part 121 and the second bonding part 122. For example, the first resin 130 may be disposed to contact a side surface of the first bonding part 121 and a side surface of the second bonding part 122.

The first resin 130 may be disposed around the first bonding part 121 to seal the upper region of the first opening TH1. The first resin 130 may be disposed around the second bonding part 122 to seal the upper region of the second opening TH2.

The first resin 130 may provide stable fixing force between the light emitting device 120 and the first package body 113. For example, the first resin 130 may be disposed to directly contact the upper surface of the first package body 113. Also, the first resin 130 may be disposed to directly contact the lower surface of the light emitting device 120.

For example, the first resin 130 may comprise at least one of an epoxy-based material, a silicone-based material, or a hybrid material including the epoxy-based material and the silicone-based material. Also, the first resin 130 may reflect light emitted from the light emitting device 120. When the first resin 130 has a reflective function, the first resin 130 may comprise white silicone. When the first resin 130 has the reflection function, the first resin 130 may be formed of a material including, for example, $TiO_2$, $SiO_2$, and the like. The first resin 130 may be referred to as an adhesive.

According to an embodiment, a depth of the recess R may be less than a depth of the first opening TH1 or a depth of the second opening TH2.

The depth of the recess R may be determined in consideration of adhesion force of the first resin 130. Also, the recess R may have a depth T1 in consideration of the stable strength of the first package body 113 and/or have a depth T1 determined to prevent the light emitting device package 100 from being cracked by heat emitted from the light emitting device 120.

The recess R may provide an appropriate space, in which an underfill process is performed, under the light emitting device 120. The recess R may be provided to be greater than or equal to a first depth so that the first resin 130 can be sufficiently provided between the lower surface of the light emitting device 120 and the upper surface of the first package body 113. Also, the recess R may be provided to be less than or equal to a second depth so as to provide stable strength of the first package body 113.

The depth and width W3 of the recess R may affect a formation position and fixing force of the first resin 130. The depth and width W3 of the recess R may be determined so that sufficient fixing force is provided by the first resin 130 disposed between the first package body 113 and the light emitting device 120.

For example, the depth of the recess R may be provided to several tens of micrometers. The depth of the recess R may be provided in a range from 40 micrometers to 60 micrometers.

Also, the width W3 of the recess R may be provided to hundreds of micrometers. The width W3 of the recess R may be provided in a range from 140 micrometers to 160 micrometers. For example, the width W3 of the recess may be provided to 150 micrometers.

The first and second bonding parts 121 and 122 of the light emitting device 120 may be sealed from the outside by the first resin 130 provided in the recess R. The first resin 130 may be provided in a closed loop shape under the light emitting device 120. As illustrated in FIGS. 2 and 3, the first resin 130 may be provided in a closed loop shape along a shape of the recess R. The recess R may be provided as a closed loop having a rectangular shape or may be provided as a closed loop having a circular or elliptic shape.

The depth of the first opening TH1 may be provided corresponding to a thickness of the first package body 113. The depth of the first opening TH1 may be provided to a thickness that is enough to maintain the stable strength of the first package body 113.

For example, the depth of the first opening TH1 may be provided to several hundred micrometers. The depth of the first opening TH1 may be provided in a range from 180 micrometers to 220 micrometers. For example, the depth of the first opening TH1 may be provided to 200 micrometers.

For example, a thickness obtained by subtracting the depth of the recess R from the depth of the first opening TH1 may be selected to be at least 100 micrometers or more. This is in consideration of a thickness of the first package body 113, which is capable of providing crack free, in an injection process.

According to an embodiment, the depth of the first opening TH1 may be provided 2 times to 10 times the depth of the recess R. For example, when the depth of the first opening TH1 is provided to 200 micrometers, the depth of the recess R may be provided in a range from 20 micrometers to 100 micrometers.

Also, as illustrated in FIG. 1, the light emitting device package 100 according to an embodiment may comprise a second resin 140.

The second resin 140 may be provided on the light emitting device 120. The second resin 140 may be disposed on the first package body 113. The second resin 140 may be disposed in the cavity C provided by the second package body 117.

The second resin 140 may comprise an insulation material. Also, the second resin 140 may comprise a wavelength conversion material that receives light emitted from the light emitting device 120 to provide light of which a wavelength is converted. For example, the second resin 140 may comprise a phosphor, a quantum dot, and the like.

Also, according to an embodiment, the light emitting structure 123 may be provided as a compound semiconductor. The light emitting structure 123 may be provided as, for example, Group II-VI or Group III-V compound semiconductors. For example, the light emitting structure 123 may comprise at least two elements selected from aluminum (Al), gallium (Ga), indium (In), phosphorus (P), arsenic (As), and nitrogen (N).

The light emitting structure 123 may comprise a first conductivity type semiconductor layer 110, an active layer 120, and a second conductivity type semiconductor layer 130.

The first and second conductivity type semiconductor layers may be implemented as at least one of Group III-V or Group II-VI compound semiconductors. For example, each of the first and second conductivity type semiconductor layers may comprise a semiconductor material having a compositional formula of $In_xAl_yGa_{1-x-y}N$ ($0 \leq x \leq 1$, $0 \leq y \leq 1$, $0 \leq x+y \leq 1$). For example, each of the first and second conductivity type semiconductor layers may comprise at least one selected from a group including GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer that is doped with an N-type dopant such as Si, Ge, Sn, Se, Te, and the like. The second conductivity type semiconductor layer may be a p-type semiconductor layer that is doped with a p-type dopant such as Mg, Zn, Ca, Sr, Ba, and the like.

The active layer may be formed of a compound semiconductor. For example, the active layer may be formed of at least one of Group III-V or Groups II-VI compound semiconductors. When the active layer has a multi-well structure, the active layer may comprise a plurality of well layers and a plurality of barrier layers, which are alternately arranged and may be formed of a material having a compositional formula of $In_xAl_yGa_{1-x-y}N$ ($0 \leq x \leq 1$, $0 \leq y \leq 1$). For example, the active layer may comprise at least one selected from a group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs, and the like.

Also, as illustrated in FIG. 1, the light emitting device package 100 according to an embodiment may comprise a first conductive layer 321 and a second conductive layer 322. The first conductive layer 321 may be spaced apart from the second conductive layer 322.

The first conductive layer 321 may be provided in the first opening TH1. The first conductive layer 321 may be disposed under the first bonding part 121. A width of the first conductive layer 321 may be less than the width of the first bonding part 121.

The first bonding part 121 may have a width in a second direction perpendicular to the first direction in which the first opening TH1 is formed. The width of the first bonding part 121 may be provided to be greater than a width of the first opening TH1 in the second direction.

The first conductive layer 321 may be disposed to directly contact the lower surface of the first bonding part 121. The first conductive layer 321 may be electrically connected to the first bonding part 121. The first conductive layer 321 may be disposed to be surrounded by the first package body 113.

The second conductive layer 322 may be provided in the second opening TH2. The second conductive layer 322 may be disposed under the second bonding part 122. A width of the second conductive layer 322 may be provided to be less than the width of the second bonding part 122.

The second bonding part 122 may have a width in the second direction perpendicular to the first direction in which the second opening TH2 is formed. The width of the second bonding part 122 may be provided to be greater than the width of the second opening TH2 in the second direction.

The second conductive layer 322 may be disposed to directly contact the lower surface of the second bonding part 122. The second conductive layer 322 may be electrically connected to the second bonding part 122. The second conductive layer 322 may be disposed to be surrounded by the first package body 113.

The first conductive layer 321 and the second conductive layer 322 may comprise at least one material selected from a group including Ag, Au, Pt, Sn, and Cu, or an alloy thereof. However, the present invention is not limited thereto, and a material capable of securing a conductive function may be used as each of the first conductive layer 321 and the second conductive layer 322.

For example, each of the first conductive layer 321 and the second conductive layer 322 may be formed using a conductive paste. The conductive paste may comprise a solder paste, a silver paste, and the like and may be provided as a multilayer that is formed of different materials or a multilayer or single layer formed of an alloy. For example, each of the first conductive layer 321 and the second conductive layer 322 may comprise a Sn—Ag—Cu (SAC) material.

According to an embodiment, the first conductive layer 321 may be electrically connected to the first bonding part 121, and the second conductive layer 322 may be electrically connected to the second bonding part 122. For example, external power may be supplied to the first conductive layer 321 and the second conductive layer 322, and thus, the light emitting device 120 may be driven.

According to the light emitting device package 100 according to the embodiment, as illustrated in FIGS. 1 to 3, the first resin 130 provided in the recess R may be provided between the lower surface of the light emitting device 120 and the upper surface of the package body 110. When viewed from the upper side of the light emitting device 120, the first resin 130 may be provided in a closed loop shape around the first and second bonding parts 121 and 122. Also, when viewed from the upper side of the light emitting device 120, the first resin 130 may be provided in a closed loop shape around the first and second openings TH1 and TH2.

The first resin 130 may perform a function of stably fixing the light emitting device 120 to the package body 110. Also, the first resin 130 may contact the side surfaces of the first and second bonding parts 121 and 122 and may be disposed around the first and second bonding parts 121 and 122. When viewed from the upper side of the light emitting device 120, the first resin 130 may be disposed so that the first and second openings TH1 and TH2 are isolated from an outer region in which the second resin 140 is provided.

The first resin 130 may prevent the first and second conductive layers 321 and 322 provided in the first and second openings TH1 and TH2 from being separated from the closed loop of the recess R to flow in the outward direction of the light emitting device 120.

When viewed from the upper side of the light emitting device 120, if the first and second conductive layers 321 and 322 move outward from the light emitting device 120, the first and second conductive layers 321 and 322 may be spread along the side surface of the light emitting device 120. As described above, when the first and second conductive layers 321 and 322 move to the side surfaces of the light emitting device 120, the first conductivity type semiconductor layer and the second conductivity type semiconductor layer of the light emitting device 120 may be electrically short-circuited. Also, when the first and second conductive layers 321 and 322 move to the side surface of the light emitting device 120, light extraction efficiency of the light emitting device 120 may be deteriorated.

However, according to an embodiment, since circumferential regions of the first and second bonding parts 121 and 122 may be sealed by the first resin 130, the first and second conductive layers 321 and 322 may be prevented from moving outward from the areas of the first and second openings TH1 and TH2.

Therefore, according to the light emitting device package 100 of an embodiment, the first and second conductive layers 321 and 322 may be prevented from moving to the side surface of the light emitting device 120 and also may be prevented from being electrically short-circuited to improve the light extraction efficiency.

Next, a method of manufacturing a light emitting device package according to an embodiment of the present invention will be described with reference to FIGS. 4 to 8.

In description of the semiconductor device according to an embodiment with reference to FIG. 8, the description overlapping with those described with reference to FIGS. 1 and 3 may be omitted.

Figure 4:
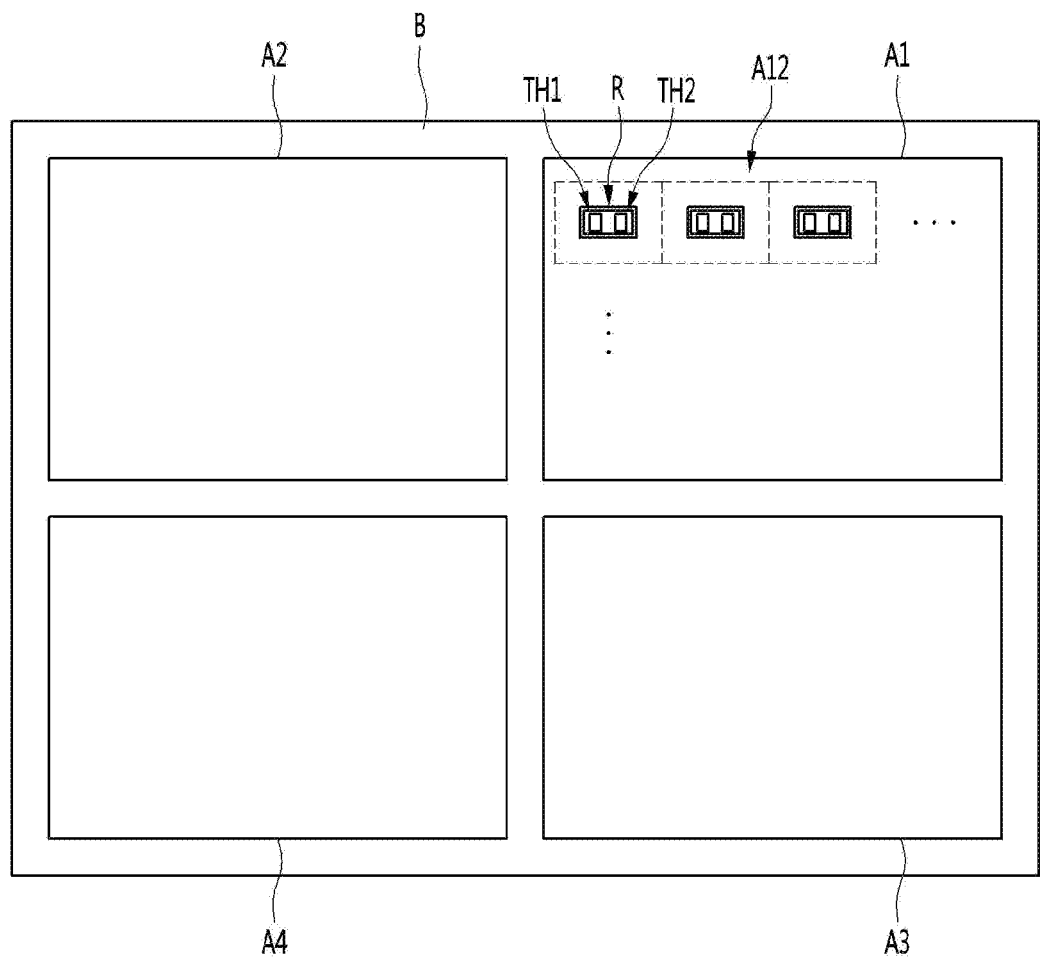
FIGS. 4 to 8 are views explaining a method of manufacturing a light emitting device package according to an embodiment of the present invention.

First, according to a method of manufacturing the light emitting device package according to an embodiment of the present invention, as illustrated in FIG. 4, a support frame B and a plurality of first body arrays A1, A2, A3, and A4 disposed in the support frame B may be provided.

The support frame B may stably support the plurality of first body arrays A1, A2, A3, and A4. The support frame B may be provided as an insulation frame or a conductive frame.

For example, the plurality of first body arrays A1, A2, A3, and A4 may be formed through an injection process or the like.

FIG. 4 illustrates a case in which four first body arrays A1, A2, A3, and A4 are disposed on the support frame B, but the plurality of first body arrays may be provided in three or less or provided in five or more. Also, the plurality of first body arrays may be arranged in a shape having a plurality of rows and a plurality of columns or may be arranged in a shape having one row and a plurality of columns.

Each of the plurality of first body arrays A1, A2, A3, and A4 may comprise a plurality of sub body arrays A11, A12, . . . .

Each of the sub body arrays A11, A12, . . . , may comprise the first package body 113, the first and second openings TH1 and TH2, and the recess R as described with reference to FIGS. 1 to 3. Also, each of the sub body arrays A11, A12, . . . may have a structure similar to each other.

The first opening TH1 may be provided in the first package body 113. The first opening TH1 may be provided to pass through the first package body 113. The first opening TH1 may be provided to pass through the top and lower surfaces of the first package body 113 in a first direction.

The second opening TH2 may be provided in the first package body 113. The second opening TH2 may be provided to pass through the first package body 113. The second opening TH2 may be provided to pass through the top and lower surfaces of the first package body 113 in the first direction.

The first opening TH1 and the second opening TH2 may be spaced apart from each other.

The recess R may be provided in the first package body 113. The recess R may be provided to be recessed from the upper surface to the lower surface of the first package body 113.

Figure 5:
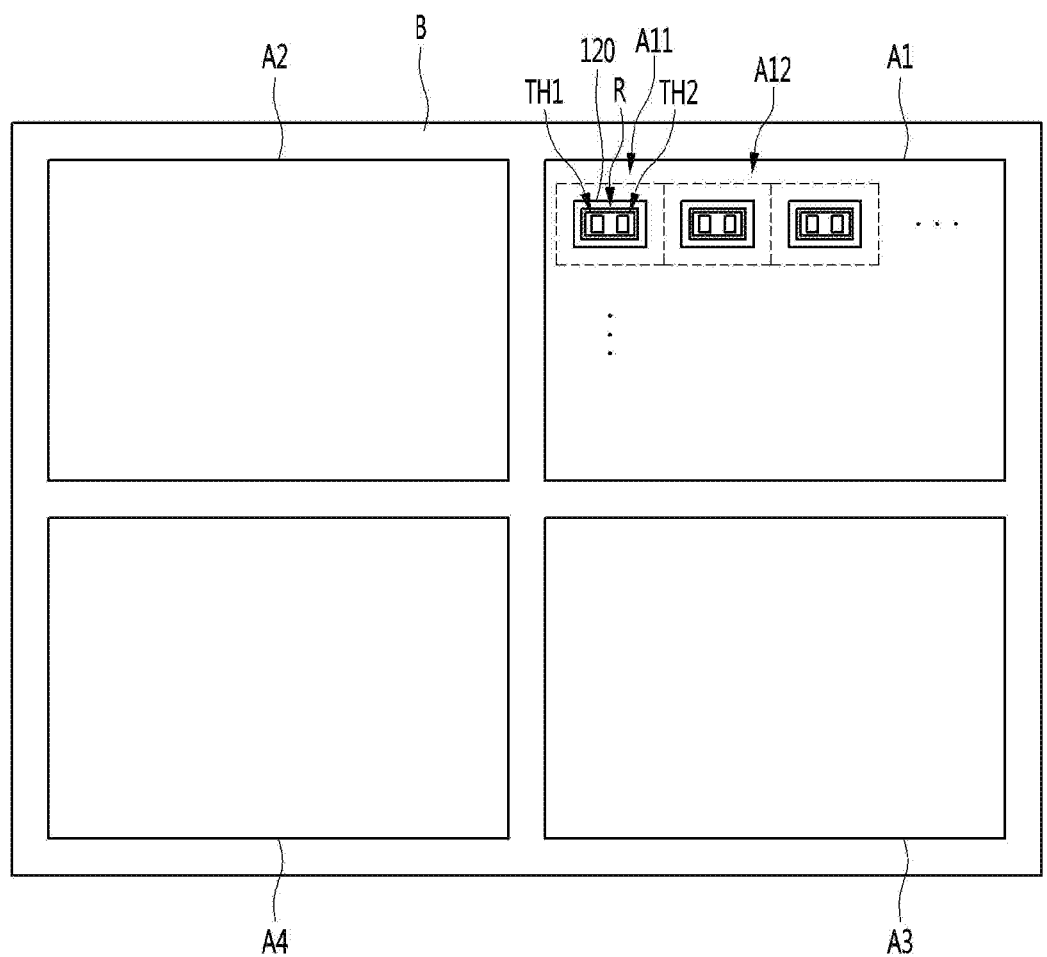

Next, according to the method of manufacturing the light emitting device package of the embodiment, as illustrated in FIG. 5, the light emitting device 120 may be disposed on each of the sub body arrays A11, A12, . . . .

As described with reference to FIGS. 1 to 3, a first resin 130 may be provided in the recess R, and the light emitting device 120 may be mounted on the first resin 130.

The first resin 130 may be provided in the recess R through a doting manner or the like. For example, the first resin 130 may be provided in a predetermined amount in a region, in which the recess R is formed, and may be provided to overflow the recess R.

Also, the light emitting device 120 may be provided on the first package body 113.

According to an embodiment, the recess R may be utilized to serve as a sort key while the light emitting device 120 is disposed on the first package body 113.

The light emitting device 120 may be fixed to the first package body 113 by the first resin 130. A portion of the first resin 130 provided in the recess R may move toward the first bonding part 121 and the second bonding part 122, and may be cured. Accordingly, the first resin 130 may be provided on a wide area between the lower surface of the light emitting device 120 and the upper surface of the first package body 113 to improve the fixing force between the first light emitting device 120 and the package body 113.

According to an embodiment, the first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The first resin 130 may perform a function of stably fixing the light emitting device 120 to the package body 110. Also, the first resin 130 may contact the side surfaces of the first and second bonding parts 121 and 122 and may be disposed around the first and second bonding parts 121 and 122.

Next, according to the method of manufacturing the light emitting device package according to an embodiment, as described with reference to FIGS. 1 to 3, the first and second conductive layers 321 and 322 may be formed in the first and second openings TH1 and TH2 of the sub body arrays A11, A12, . . . , respectively.

The first conductive layer 321 may be provided in the first opening TH1. The first conductive layer 321 may be disposed under the first bonding part 121. A width of the first conductive layer 321 may be less than the width of the first bonding part 121.

The first bonding part 121 may have a width in a second direction perpendicular to the first direction in which the first opening TH1 is formed. The width of the first bonding part 121 may be provided to be greater than a width of the first opening TH1 in the second direction.

The first conductive layer 321 may be disposed to directly contact the lower surface of the first bonding part 121. The first conductive layer 321 may be electrically connected to the first bonding part 121. The first conductive layer 321 may be disposed to be surrounded by the first package body 113.

The second conductive layer 322 may be provided in the second opening TH2. The second conductive layer 322 may be disposed under the second bonding part 122. A width of the second conductive layer 322 may be provided to be less than the width of the second bonding part 122.

The second bonding part 122 may have a width in the second direction perpendicular to the first direction in which the second opening TH2 is formed. The width of the second bonding part 122 may be provided to be greater than the width of the second opening TH2 in the second direction.

The second conductive layer 322 may be disposed to directly contact the lower surface of the second bonding part 122. The second conductive layer 322 may be electrically connected to the second bonding part 122. The second conductive layer 322 may be disposed to be surrounded by the first package body 113.

The first conductive layer 321 and the second conductive layer 322 may comprise one material selected from a group including Ag, Au, Pt, Sn, and Cu, or an alloy thereof. However, the present invention is not limited thereto, and a material capable of securing a conductive function may be used as each of the first conductive layer 321 and the second conductive layer 322.

For example, each of the first conductive layer 321 and the second conductive layer 322 may be formed using a conductive paste. The conductive paste may comprise a solder paste, a silver paste, and the like and may be provided as a multilayer that is formed of different materials or a multilayer or single layer formed of an alloy. For example, each of the first conductive layer 321 and the second conductive layer 322 may comprise a Sn—Ag—Cu (SAC) material.

Since the upper regions of the first and second openings TH1 and TH2 are sealed by the first resin 130, the first and second conductive layers 321 and 322 provided in the first and second openings TH1 and TH2 may be prevented from being spread to move downward from the lower surface of the light emitting device 120.

As described above, since the first and second openings TH1 and TH2 are sealed by the first resin 130, the first and second conductive layers 321 and 322 provided in the first and second openings TH1 and TH2 may be prevented to moving upward from the upper surface of the first package body 113.

Figure 6:
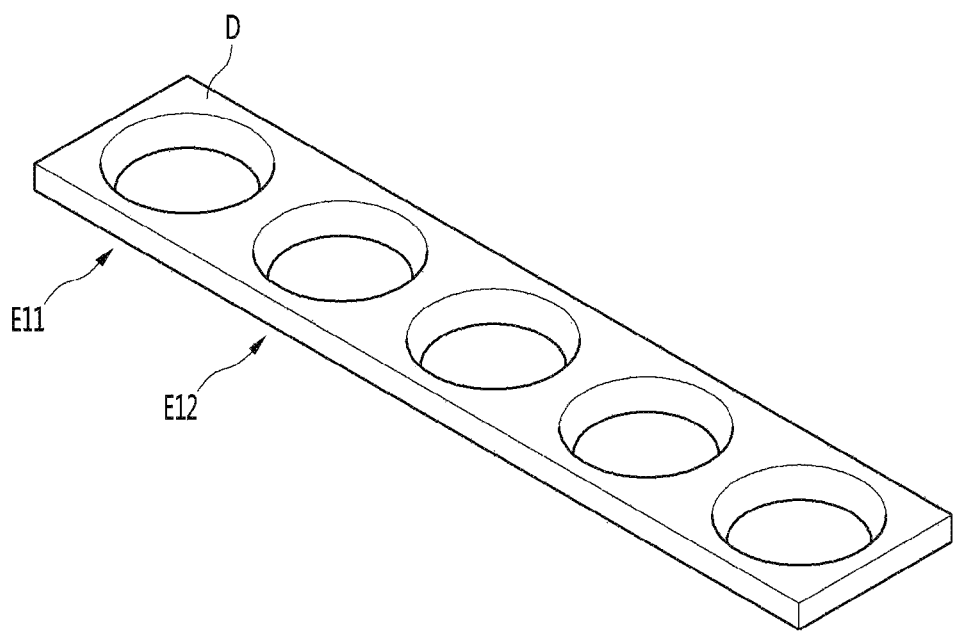

Meanwhile, according to the method of manufacturing the light emitting device package of the embodiment, as illustrated in FIG. 6, a second body array D may be provided.

The second body array D may comprise a plurality of sub body arrays E11, E12, . . . . For example, as illustrated in FIG. 6, the second body array D may comprise a plurality of sub body arrays E11, E12, . . . that are arranged in one direction. Also, the second body array D may comprise a plurality of sub body arrays E11, E12, . . . , having a matrix shape arranged in a plurality of rows and a plurality of columns.

As illustrated in FIG. 6, each of the plurality of sub body arrays E11, E12, . . . may comprise an opening passing through in a direction from an upper surface to a lower surface thereof.

Figure 7:
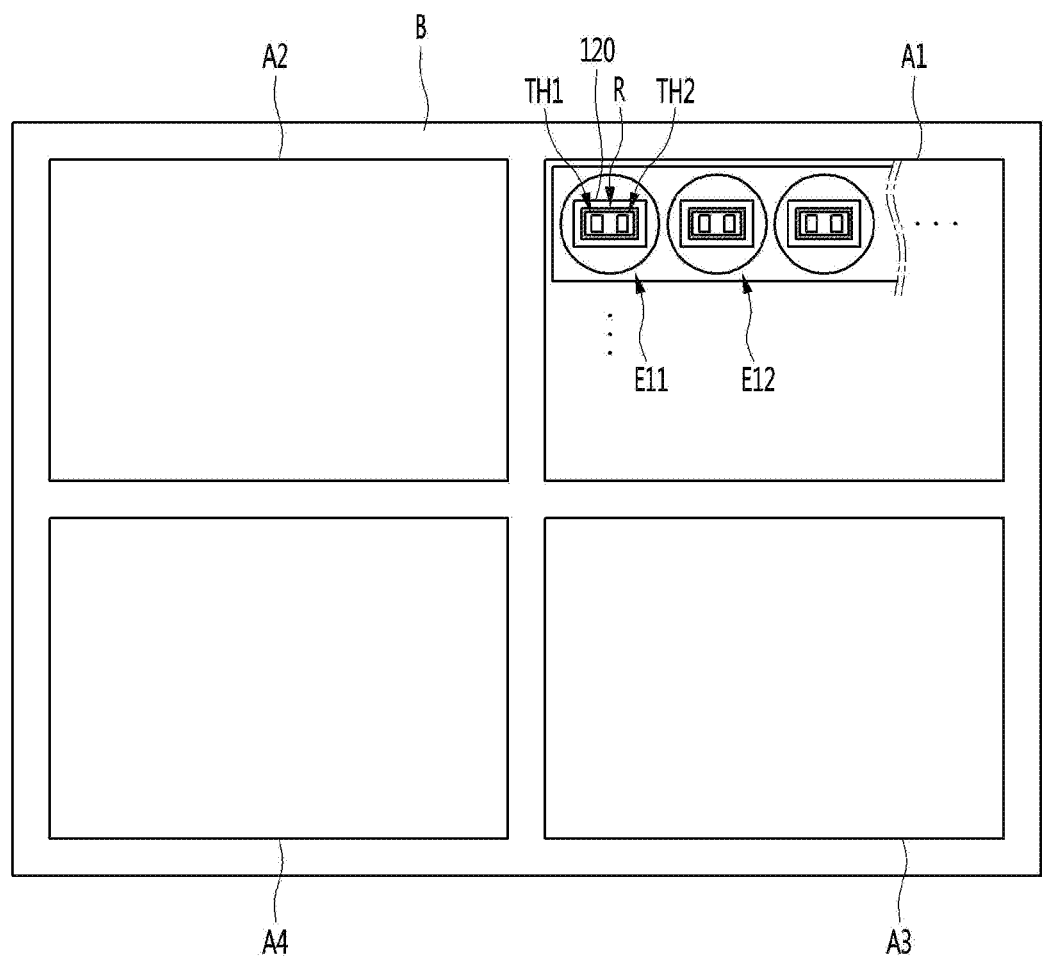

Next, according to the method of manufacturing the light emitting device package of the embodiment, as illustrated in FIG. 7, the second body array D may be provided on the first body array A1, A2, A3, and A4.

The first body arrays A1, A2, A3, and A4 and the second body array D may be bonded through the adhesion layer 160, as described with reference to FIGS. 1 to 3.

For example, the sub body array E11 may be disposed on the sub body array A11, and the sub body array E12 may be disposed on the sub body array A12.

Meanwhile, in an embodiment, the first body arrays A1, A2, A3, and A4 and the second body array D may comprise different materials. For example, the first body arrays A1, A2, A3, and A4 and the second body array D may be formed of different materials in different processes and then bonded to each other through the adhesion layer 160.

The adhesion layer 160 may be disposed between the first body arrays A1, A2, A3, and A4 and the second body array D. The adhesion layer 160 may be disposed on an upper surface of each of the first body arrays A1, A2, A3, and A4. The adhesion layer 160 may be disposed on a lower surface of the second body array D.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120. When the adhesion layer 160 has a reflective function, the adhesion layer 160 may comprise white silicone.

Meanwhile, each of the first body arrays A1, A2, A3, and A4 and the second body array D may comprise at least one selected from resin materials including polyphthalamide (PPA), polychloro triphenyl (PCT), a liquid crystal polymer (LCP), polyamide9T (PAST), and silicone, an epoxy molding compound (EMC), a silicone molding compound (SMC), polyimide (PI), and the like, as a base material.

Also, each of the first body arrays A1, A2, A3, and A4 and the second body array D may comprise at least one of a reflective material or a wavelength conversion material. Also, the first body arrays A1, A2, A3, and A4 and the second body array D may not comprise the reflective material and the wavelength conversion material.

The first body arrays A1, A2, A3, and A4 and the second body array D may comprise different base materials.

For example, the first body arrays A1, A2, A3, and A4 may comprise the reflective material, and the second body array D may comprise the wavelength conversion material. Also, the first body arrays A1, A2, A3, and A4 may comprise the wavelength conversion material, and the second body array D may comprise the reflective material.

According to an embodiment, the first body arrays A1, A2, A3, and A4 may comprise the reflective material, and the second body array D may comprise the reflective material and the wavelength conversion material. Also, the first body arrays A1, A2, A3, and A4 may comprise the reflective material and the wavelength conversion material, and the second body array D may comprise the wavelength conversion material.

In the light emitting device package according to an embodiment, the first body arrays A1, A2, A3, and A4 and the second body array D including different base materials are separately formed in different processes and then be manufactured in a modular manner through an optional combination that is capable of satisfying characteristics required for the application product.

Next, a second resin 140 may be formed in the cavity provided by the opening of the second body array D, as described with reference to FIGS. 1 to 3.

The second resin 140 may be provided on the light emitting device 120. The second resin 140 may be disposed on the first body arrays A1, A2, A3, and A4. The second resin 140 may be disposed in the cavity C provided by the second body array D.

The second resin 140 may comprise an insulation material. Also, the second resin 140 may comprise a wavelength conversion material that receives light emitted from the light emitting device 120 to provide light of which a wavelength is converted. For example, the second resin 140 may comprise a phosphor, a quantum dot, and the like.

Figure 8:
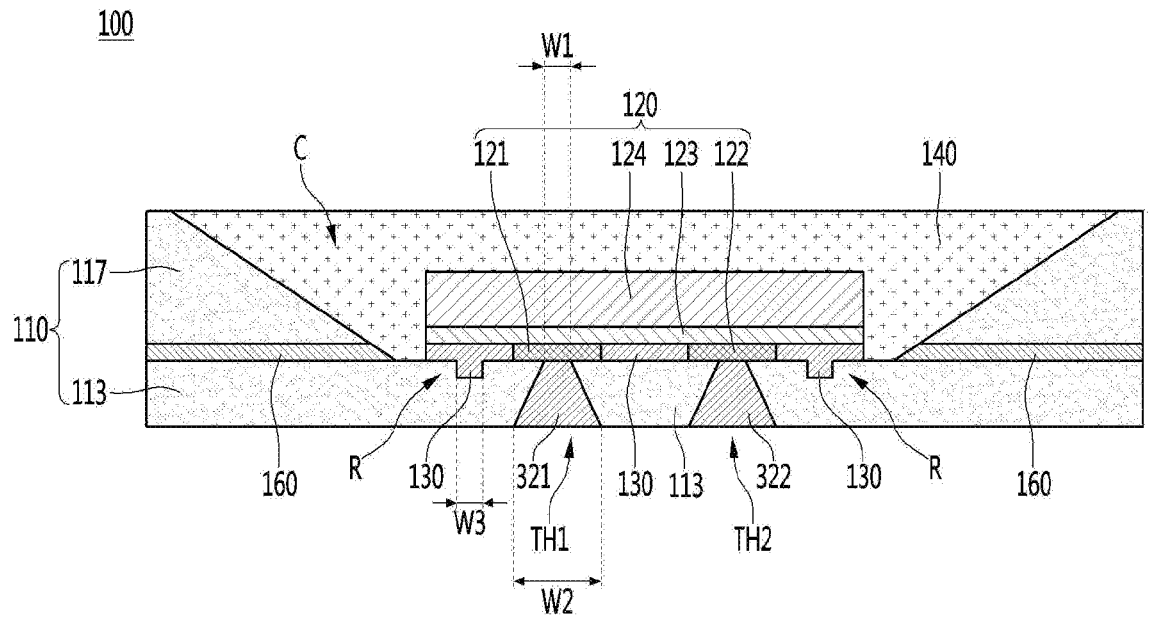

Next, according to the method of manufacturing the light emitting device package of the embodiment, in the state in which the first body arrays A1, A2, A3, and A4 and the second body array D are bonded to each other, an individual light emitting device package may be manufactured through a separation process such as dicing or scribing as illustrated in FIG. 8.

As illustrated in FIG. 8, the light emitting device package 100 according to an embodiment may comprise a package body in which a first package body 113 and a second package body 117 are manufactured to be bonded to each other in a modular manner.

In the light emitting device package 100 according to an embodiment, as described above with reference to FIGS. 1 to 8, while the package body 110 is formed, a lead frame according to the related art is not applied.

In the case of the light emitting device package to which the lead frame according to the related art is applied, a process of forming the lead frame is additionally required, but the method of manufacturing the light emitting device package according to an embodiment of the present invention does not require the process of forming the lead frame. As a result, the method of manufacturing the light emitting device package according to an embodiment of the present invention has an advantage in reducing a process time and material.

Also, in the case of the light emitting device package to which the lead frame according to the related art is applied, a plating process using silver plating or the like has to be added to prevent the lead frame from being deteriorated. However, according to the method of manufacturing the light emitting device package of an embodiment of the present invention, since the lead frame is not required, the addition process such as the silver plating is not required. As described above, the method of manufacturing the light emitting device package according to an embodiment of the present invention may have an advantage in reducing manufacturing costs and improving manufacturing yield.

Also, there is an advantage that may be miniaturized when compared to the light emitting device package to which the lead frame according to the related art is applied.

In the light emitting device package 100 according to an embodiment, a power may be connected to the first bonding part 121 through the first conductive layer 321 provided in the first opening TH1, and also, a power may be connected to the second bonding part 122 through the second conductive layer 322 provided in the second opening TH2.

Accordingly, the light emitting device 120 may be driven by driving power supplied through the first bonding part 121 and the second bonding part 122. Also, light emitted from the light emitting device 120 may be provided in an upper direction of the package body 110.

Meanwhile, the light emitting device package 100 according to an embodiment described above may be provided to be mounted on a submount or a circuit board.

However, when the light emitting device package is mounted on the submount or the circuit board, a high temperature process such as a reflow process or a heat treatment process may be applied. Here, in the reflow or heat treatment process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package of an embodiment, the first bonding part 121 and the second bonding part 122 of the light emitting device 120 according to an embodiment may receive the driving power through the first and second conductive layers 321 and 322. Also, a melting point of each of the first and second conductive layers 321 and 322 may be selected to have a higher value than a melting point of the general bonding material.

Accordingly, the light emitting device package 100 according to an embodiment does not cause the re-melting phenomenon even when bonded to a main substrate through the reflow process, and thus, the electrical connection and the physical bonding force may not be degraded.

Also, according to the light emitting device package 100 and the method of manufacturing the light emitting device package of an embodiment, since the light emitting device 120 is mounted on the first body arrays A1, A2, A3, and A4 by using the conductive paste, in the process of manufacturing the light emitting device package, the package body 110 does not need to be exposed to a high temperature. Therefore, according to an embodiment, the package body 110 may be prevented from being damaged or discolored due to the exposure at the high temperature.

For example, the package body 110 may comprise at least one material selected from a group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Figure 9:
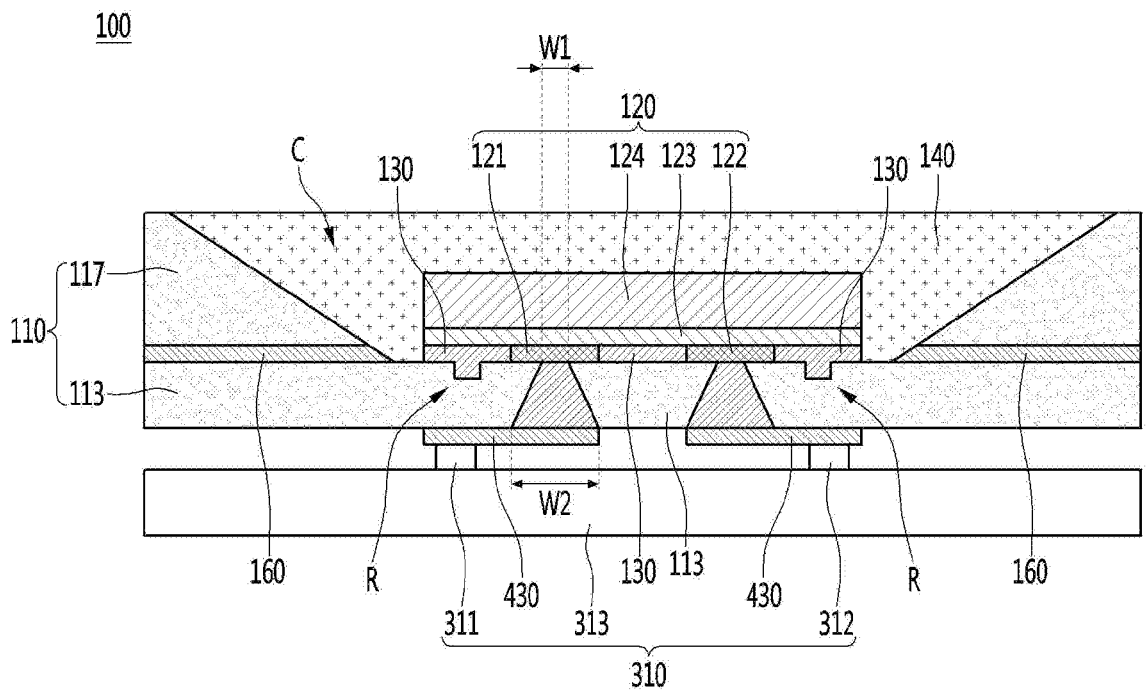
FIG. 9 is a view illustrating another example of the light emitting device package according to an embodiment of the present invention.

Next, another example of the light emitting device package according to an embodiment of the present invention will be described with reference to FIG. 9. FIG. 9 is a view illustrating another example of the light emitting device package according to an embodiment of the present invention.

In the light emitting device package of FIG. 9 according to an embodiment of the present invention, an example in which the light emitting device package 100 described with reference to FIGS. 1 to 8 is mounted on a circuit board 310 will be described.

In the description of the light emitting device package according to an embodiment of the present invention with reference to FIG. 9, descriptions overlapping with those described with reference to FIGS. 1 to 8 may be omitted.

As illustrated in FIG. 9, the light emitting device package according to an embodiment may comprise a circuit board 310, a package body 110, and a light emitting device 120.

The circuit board 310 may comprise a first pad 311, a second pad 312, and a support substrate 313. A power supply circuit controlling driving of the light emitting device 120 may be provided on the support substrate 313.

The package body 110 may be disposed on the circuit board 310. The first pad 311 and the first bonding part 121 may be electrically connected to each other. The second pad 312 and the second bonding part 122 may be electrically connected to each other.

Each of the first pad 311 and the second pad 312 may comprise a conductive material. For example, each of the first pad 311 and the second pad 312 may comprise at least one material selected from the group including Ti, Cu, Ni, Au, Cr, Ta, Pt, Sn, Ag, P, Fe, Sn, Zn, and Al, or an alloy thereof. Each of the first pad 311 and the second pad 312 may be provided in a single layer or multiple layer.

The package body 110 may comprise a first package body 113 and a second package body 117.

The package body 110 may comprise a first opening TH1 and a second opening TH2 passing through from an upper surface to a lower surface thereof in the first direction. The first opening TH1 and the second opening TH2 may pass through from the upper surface to the lower surface of the first package body 113 in the first direction.

Meanwhile, according to an embodiment, the first package body 113 and the second package body 117 may comprise different materials. For example, the first package body 113 and the second package body 117 may be bonded to each other through an adhesion layer 160 after being formed of different materials in different processes.

The adhesion layer 160 may be disposed between the first package body 113 and the second package body 117. The adhesion layer 160 may be disposed on the upper surface of the first package body 113. The adhesion layer 160 may be disposed on the lower surface of the second package body 117. The adhesion layer 160 may be disposed around the light emitting device 120 to provide the cavity.

The adhesion layer 160 may comprise at least one of an epoxy-based material, a silicone-based material, or a hybrid material including the epoxy-based material and the silicone-based material.

Also, the adhesion layer 160 may reflect light emitted from the light emitting device 120. When the adhesion layer 160 may have reflective function, the adhesive may comprise white silicone.

Each of the first package body 113 and the second package body 117 may comprise at least one selected from resin materials including polyphthalamide (PPA), polychloro triphenyl (PCT), a liquid crystal polymer (LCP), polyamide9T (PAST), a silicone, an epoxy molding compound (EMC), a silicone molding compound (SMC), polyimide (PI), and the like, as a base material.

Also, each of the first package body 113 and the second package body 117 may comprise at least one of the reflective material or the wavelength conversion material. Also, the first package body 113 and the second package body 117 may not comprise the reflective material and the wavelength conversion material.

The first package body 113 and the second package body 117 may comprise different base materials.

For example, the first package body 113 may comprise a reflective material and the second package body 117 may comprise a wavelength conversion material. Also, the first package body 113 may comprise the wavelength conversion material, and the second package body 117 may comprise the reflective material.

According to an embodiment, the first package body 113 may comprise the reflective material, and the second package body 117 may comprise the reflective material and the wavelength conversion material. Also, the first package body 113 may comprise the reflective material and the wavelength conversion material, and the second package body 117 may comprise the wavelength conversion material.

In the light emitting device package 100 according to the embodiment, the first package body 113 and the second package body 117 including different base materials may be formed separately in different processes and then be manufactured in a modular manner through an optional combination that is capable of satisfying characteristics required for the application product.

The light emitting device 120 may comprise a first bonding part 121, a second bonding part 122, a light emitting structure 123, and a substrate 124.

The light emitting device 120 may be disposed on the package body 110. The light emitting device 120 may be disposed on the first package body 113. The light emitting device 120 may be disposed in a cavity C provided by the second package body 117.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed between the light emitting structure 123 and the first package body 113. The second bonding part 122 may be disposed between the light emitting structure 123 and the first package body 113.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first package body 113.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the first package body 113.

The first opening TH1 and the second opening TH2 may be spaced apart from each other. The first opening TH1 and the second opening TH2 may be spaced apart from each other under the lower surface of the light emitting device 120.

As illustrated in FIG. 9, the light emitting device package according to an embodiment may comprise a first conductive layer 321 and a second conductive layer 322.

The first conductive layer 321 may be disposed in the first opening TH1. The first conductive layer 321 may be disposed to directly contact the lower surface of the first bonding part 121. The first conductive layer 321 may be provided to overlap the first bonding part 121 in a vertical direction.

An upper surface of the first conductive layer 321 may be disposed on the same plane as the upper surface of the first package body 113. A lower surface of the first conductive layer 321 may be provided on the same plane as the lower surface of the first package body 113.

The second conductive layer 322 may be disposed in the second opening TH2. The second conductive layer 322 may be disposed to directly contact the lower surface of the second bonding part 122. The second conductive layer 322 may be provided to overlap the second bonding part 122 in the vertical direction.

An upper surface of the second conductive layer 322 may be disposed on the same plane as the upper surface of the first package body 113. A lower surface of the second conductive layer 322 may be provided on the same plane as the lower surface of the first package body 113.

For example, each of the first conductive layer 321 and the second conductive layer 322 may comprise at least one material selected from the group including Ag, Au, Pt, Sn, and Cu, or an alloy thereof.

The light emitting device package according to an embodiment may comprise a metal layer 430, as illustrated in FIG. 9.

The metal layer 430 may be disposed under the first and second conductive layers 321 and 322. The metal layer 430 may be disposed on the lower surfaces of the first and second conductive layers 321 and 322. Also, according to an embodiment, the metal layer 430 may be provided on the lower surface of the first package body 113 adjacent to the first and second openings TH1 and TH2.

The metal layer 430 may be formed of at least one material selected from the group including titanium (Ti), copper (Cu), nickel (Ni), gold (Au), chromium (Cr), tantalum (Ta), platinum (Pt), tin (Sn), silver (Ag), and phosphorus (P), or an optional alloy thereof.

According to an embodiment, the first pad 311 and the first conductive layer 321 of the circuit board 310 may be electrically connected to each other by the metal layer 430. Also, the second pad 312 and the second conductive layer 322 of the circuit board 310 may be electrically connected to each other by the metal layer 430.

Also, the light emitting device package according to the embodiment may comprise a recess R, as illustrated in FIG. 9. The recess R may be provided to be recessed from the lower surface of the cavity C to the lower surface of the package body 110.

The recess R may be provided in the first package body 113. The recess R may be provided to be recessed from the upper surface to the lower surface of the first package body 113. The recess R may be disposed under the light emitting device 120.

The recess R may be provided under the light emitting device 120 and may be provided between the first bonding part 121 and the second bonding part 122. The recess R may be disposed under the light emitting device 120 around the first and second bonding parts 121 and 122.

The light emitting device package according to an embodiment may comprise a first resin 130, as illustrated in FIG. 9.

The first resin 130 may be disposed in the recess R. The first resin 130 may be disposed between the light emitting device 120 and the first package body 113. The first resin 130 may be disposed between the first bonding part 121 and the second bonding part 122. For example, the first resin 130 may be disposed to contact a side surface of the first bonding part 121 and a side surface of the second bonding part 122.

The first resin 130 may be disposed around the first bonding part 121 to seal the upper region of the first opening TH1. The first resin 130 may be disposed around the second bonding part 122 to seal the upper region of the second opening TH1.

The first resin 130 may provide stable fixing force between the light emitting device 120 and the first package body 113. For example, the first resin 130 may be disposed to directly contact the upper surface of the first package body 113. Also, the first resin 130 may be disposed to directly contact the lower surface of the light emitting device 120.

For example, the first resin 130 may comprise at least one of an epoxy-based material, a silicone-based material, or a hybrid material including the epoxy-based material and the silicone-based material. Also, the first resin 130 may reflect light emitted from the light emitting device 120. When the first resin 130 has a reflective function, the first resin 130 may comprise white silicone.

When the first resin 130 has the reflection function, the first resin 130 may be formed of a material including, for example, $TiO_2$, $SiO_2$, or the like. The first resin 130 may be referred to as an adhesive.

According to an embodiment, a depth of the recess R may be less than a depth of the first opening TH1 or a depth of the second opening TH2.

The depth of the recess R may be determined in consideration of adhesion force of the first resin 130. Also, the recess R may have a depth T1 in consideration of the stable strength of the first package body 113 and/or have a depth T1 determined to prevent the light emitting device package 100 from being cracked by heat emitted from the light emitting device 120.

The recess R may provide an appropriate space, in which an underfill process is performed, under the light emitting device 120. The recess R may be provided to be greater than or equal to a first depth so that the first resin 130 is sufficiently provided between the lower surface of the light emitting device 120 and the upper surface of the first package body 113. Also, the recess R may be provided to be less than or equal to a second depth so as to provide stable strength of the first package body 113.

A depth and width of the recess R may affect the formation position and the fixing force of the first resin 130. The depth and width of the recess R may be determined so that sufficient fixing force may be provided by the first resin 130 disposed between the first package body 113 and the light emitting device 120.

For example, the depth of the recess R may be provided to several tens of micrometers. The depth of the recess R may be provided in a range from 40 micrometers to 60 micrometers.

Also, the width W3 of the recess R may be provided to hundreds of micrometers. The width W3 of the recess R may be provided in a range from 140 micrometers to 160 micrometers. For example, the width W3 of the recess R may be provided to 150 micrometers.

The depth of the first opening TH1 may be provided corresponding to a thickness of the first package body 113. The depth of the first opening TH1 may be provided to a thickness that is enough to maintain the stable strength of the first package body 113.

For example, the depth of the first opening TH1 may be provided to several hundred micrometers. The depth of the first opening TH1 may be provided in a range from 180 micrometers to 220 micrometers. For example, the depth of the first opening TH1 may be provided to 200 micrometers.

For example, a thickness obtained by subtracting the depth of the recess R from the depth of the first opening TH1 may be selected to be at least 100 micrometers or more. This is in consideration of a thickness of the first package body 113, which is capable of providing crack free, in an injection process.

According to an embodiment, the depth of the first opening TH1 may be provided 2 times to 10 times the depth of the recess R. For example, when the depth of the first opening TH1 is provided to 200 micrometers, the depth of the recess R may be provided in a range from 20 micrometers to 100 micrometers.

Also, the light emitting device package according to an embodiment may comprise a second resin 140, as illustrated in FIG. 9.

The second resin 140 may be provided on the light emitting device 120. The second resin 140 may be disposed on the first package body 113. The second resin 140 may be disposed in the cavity C provided by the second package body 117.

In the light emitting device package according to an embodiment, as described with reference to FIG. 9, while the package body 110 is formed, a lead frame according to the related art is not applied.

In the case of the light emitting device package to which the lead frame according to the related art is applied, a process of forming the lead frame is additionally required, but the method of manufacturing the light emitting device package according to an embodiment of the present invention does not require the process of forming the lead frame. As a result, the method of manufacturing the light emitting device package according to an embodiment of the present invention has an advantage in reducing a process time and material.

Also, in the case of the light emitting device package to which the lead frame according to the related art is applied, a plating process using silver plating or the like has to be added to prevent the lead frame from being deteriorated. However, according to the light emitting device package according to an embodiment of the present invention, since the lead frame is not required, the addition process such as the silver plating is not required. Accordingly, embodiments of the light emitting device package may solve the problem of discoloration of the material such as silver plating and may reduce manufacturing costs due to the advantage in which the process is omitted. Therefore, the method of manufacturing the light emitting device package according to an embodiment of the present invention may have an advantage in reducing manufacturing costs and improving manufacturing yield and product reliability.

Also, there is an advantage that may be miniaturized when compared to the light emitting device package to which the lead frame according to the related art is applied.

In the light emitting device package 100 according to an embodiment, a power may be connected to the first bonding part 121 through the first conductive layer 321 provided in the first opening TH1, and also, a power may be connected to the second bonding part 122 through the second conductive layer 322 provided in the second opening TH2.

Accordingly, the light emitting device 120 may be driven by driving power supplied through the first bonding part 121 and the second bonding part 122. Also, light emitted from the light emitting device 120 may be provided in an upper direction of the package body 110.

Meanwhile, the light emitting device package 100 according to an embodiment described above may be provided to be mounted on a submount or a circuit board.

However, when the light emitting device package according to the related art is mounted on the submount or the circuit board, a high temperature process such as a reflow process may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package according to an embodiment, the first bonding part 121 and the second bonding part 122 of the light emitting device 120 according to an embodiment may receive the driving power through the first and second conductive layers 321 and 322. Also, a melting point of each of the first and second conductive layers 321 and 322 may be selected to have a higher value than a melting point of the general bonding material.

Accordingly, the light emitting device package 100 according to an embodiment does not cause the re-melting phenomenon even when bonded to a main substrate through the reflow process, and thus, the electrical connection and the physical bonding force may not be degraded.

Also, according to the light emitting device package 100 and the method of manufacturing the light emitting device package according to an embodiment, since the light emitting device 120 is mounted on the first body arrays A1, A2, A3, and A4 by using the conductive paste, in the process of manufacturing the light emitting device package, the package body 110 does not need to be exposed to a high temperature. Therefore, according to an embodiment, the package body 110 may be prevented from being damaged or discolored due to the exposure at the high temperature.

For example, the package body 110 may comprise at least one material selected from the group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Next, another example of the light emitting device package according to an embodiment will be described with reference to FIG. 10.

Figure 10:
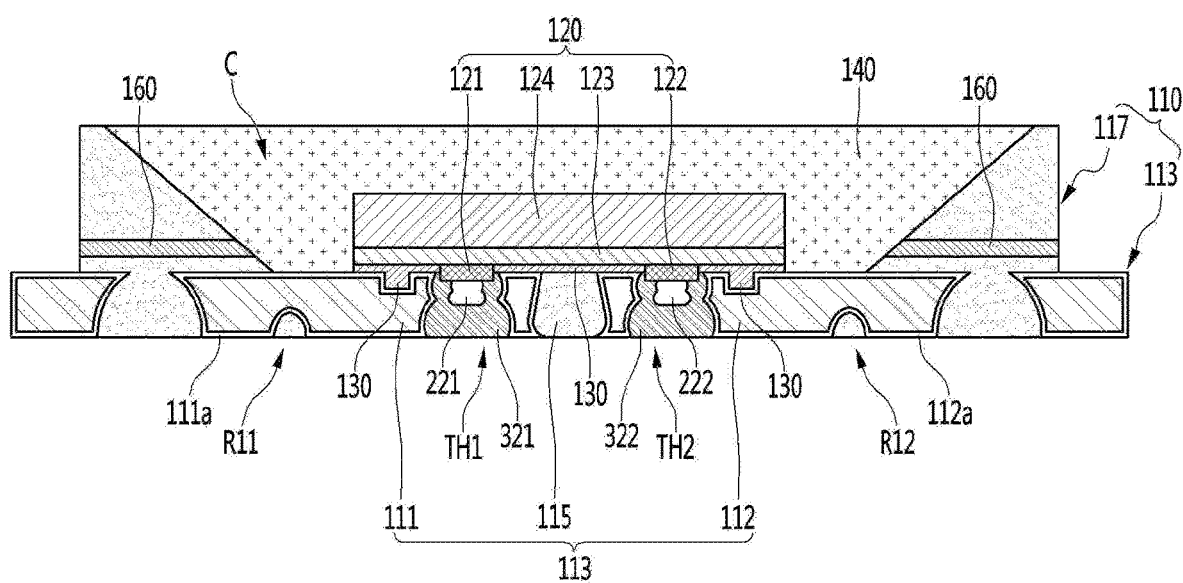
FIG. 10 is a view illustrating further another example of the light emitting device package according to an embodiment of the present invention.

FIG. 10 is a view illustrating further another example of the light emitting device package according to an embodiment of the present invention. In the description of the light emitting device package according to an embodiment with reference to FIG. 10, descriptions overlapping with those described with reference to FIGS. 1 to 9 may be omitted.

The light emitting device package according to an embodiment may comprise a package body 110 and a light emitting device 120, as illustrated in FIG. 10.

The package body 110 may comprise a first package body 113 and a second package body 117. The second package body 117 may be disposed on the first package body 113. The second package body 117 may be disposed around an upper surface of the first package body 113. The second package body 117 may provide a cavity C in the upper surface of the first package body 113. The second package body 117 may comprise an opening passing through the upper and lower surfaces thereof.

In other words, the first package body 113 may be referred to as a lower body, and the second package body 117 may be referred to as an upper body. Also, according to an embodiment, the package body 110 may not include the second package body 117 that provides the cavity but may comprise only the first package body 113 that provides a flat upper surface.

The second package body 117 may reflect light emitted from the light emitting device 120 in an upward direction. The second package body 117 may be disposed to be inclined with respect to the upper surface of the first package body 113.

The package body 110 may comprise the cavity C. The cavity may comprise a lower surface and a side surface inclined from the lower surface to the upper surface of the package body 110.

According to an embodiment, the package body 110 may have a structure having the cavity C or may have a structure having a flat upper surface without the cavity C.

The first package body 113 may comprise a first frame 111 and a second frame 112. The first frame 111 and the second frame 112 may be spaced apart from each other.

The first package body 113 may comprise a first body 115. The first body 115 may be disposed between the first frame 111 and the second frame 112. The first body 115 may perform a function of a kind of electrode separation line. The first body 115 may also be referred to as an insulation member.

The first body 115 may be disposed on the first frame 111. Also, the first body 115 may be disposed on the second frame 112.

Each of the first frame 111 and the second frame 112 may be provided as an insulation frame. The first frame 111 and the second frame 112 may stably provide structural strength of the package body 110.

Also, each of the first frame 111 and the second frame 112 may be provided as a conductive frame. The first frame 111 and the second frame 112 may stably provide structural strength of the package body 110 and may be electrically connected to the light emitting device 120.

For example, the package body 110 may be formed of at least one selected from the group including polyphthalamide (PPA), polychloro triphenyl (PCT), a liquid crystal polymer (LCP), polyamide9T (PA9T), silicone, an epoxy molding compound (EMC), a silicone molding compound (SMC), ceramic, polyimide (PI), photo sensitive glass (PSG), sapphire ($Al_2O_3$), and the like. Also, the package body 110 may comprise a reflective material of a high refractive filler, such as $TiO_2$ and $SiO_2$. The package body 110 may comprise a wavelength conversion material such as a quantum dot and a phosphor.

According to an embodiment, the first package body 113 and the second package body 117 may comprise different materials. For example, the first package body 113 and the second package body 117 may be bonded to each other after being formed of different materials in different processes. For example, the first package body 113 and the second package body 117 may be bonded to each other through an adhesion layer 160.

The adhesion layer 160 may be disposed between the first package body 113 and the second package body 117. The adhesion layer 160 may be disposed on the upper surface of the first package body 113. The adhesion layer 160 may be disposed on the lower surface of the second package body 117. The adhesion layer 160 may be disposed around the light emitting device 120 to provide the cavity.

The adhesion layer 160 may comprise at least one of an epoxy-based material, a silicone-based material, or a hybrid material including the epoxy-based material and the silicone-based material. Also, the adhesion layer 160 may reflect light emitted from the light emitting device 120. When the adhesion layer 160 has a reflective function, the adhesion layer 160 may comprise white silicone.

Meanwhile, each of the first package body 115 and the second package body 117 may comprise at least one selected from resin materials including polyphthalamide (PPA), polychloro triphenyl (PCT), a liquid crystal polymer (LCP), polyamide9T (PA9T), a silicone, an epoxy molding compound (EMC), a silicone molding compound (SMC), polyimide (PI), and the like, as a base material.

Also, each of the first body 115 and the second package body 117 may comprise at least one of the reflective material or the wavelength conversion material. Also, the first body 115 and the second package body 117 may not include the reflective material and the wavelength conversion material. Each of the first body 115 and the second package body 117 may be formed of a transparent resin.

The first body 115 and the second package body 117 may comprise different base materials. The first body 115 and the second package body 117 may comprise different resins.

For example, the first body 115 may comprise a reflective material and the second package body 117 may comprise a wavelength conversion material. Also, the first body 115 may comprise the wavelength conversion material, and the second package body 117 may comprise the reflective material.

According to an embodiment, the first body 115 may comprise the reflective material, and the second package body 117 may comprise the reflective material and the wavelength conversion material. Also, the first body 115 may comprise the reflective material and the wavelength conversion material, and the second package body 117 may comprise the wavelength conversion material.

In the light emitting device package according to the embodiment, the first package body 113 and the second package body 117 including different base materials may be formed separately in different processes and then be manufactured in a modular manner through an optional combination that is capable of satisfying characteristics required for the application product.

According to an embodiments, the light emitting device 120 may comprise a first bonding part 121, a second bonding part 122, a light emitting structure 123, and a substrate 124.

The light emitting device 120 may be disposed on the package body 110. The light emitting device 120 may be disposed on the first frame 111 and the second frame 112. The light emitting device 120 may be disposed in the cavity C provided by the package body 110.

The first bonding part 121 may be disposed on the lower surface of the light emitting device 120. The second bonding part 122 may be disposed on the lower surface of the light emitting device 120. The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first bonding part 121 may be disposed between the light emitting structure 123 and the first frame 111. The second bonding part 122 may be disposed between the light emitting structure 123 and the second frame 112.

Meanwhile, the light emitting device package according to an embodiment may comprise the first opening TH1 and the second opening TH2 as illustrated in FIG. 10. The first frame 111 may comprise the first opening TH1. The second frame 112 may comprise the second opening TH2.

For example, the first package body 113 may have a flat lower surface and may comprise an upper surface parallel to the lower surface. The first and second openings TH1 and TH2 may pass through the top and lower surfaces of the first package body 113.

The first opening TH1 may be provided in the first frame 111. The first opening TH1 may be provided to pass through the first frame 111. The first opening TH1 may be provided to pass through the upper and lower surfaces of the first frame 111 in the first direction.

The first opening TH1 may be disposed under the first bonding part 121 of the light emitting device 120. The first opening TH1 may be provided to overlap the first bonding part 121 of the light emitting device 120. The first opening TH1 may be provided to overlap the first bonding part 121 of the light emitting device 120 in the first direction from the upper surface to the lower surface of the first frame 111.

The second opening TH2 may be provided in the second frame 112. The second opening TH2 may be provided to pass through the second frame 112. The second opening TH2 may be provided to pass through the top and lower surfaces of the second frame 112 in the first direction.

The second opening TH2 may be disposed under the second bonding part 122 of the light emitting device 120. The second opening TH2 may be provided to overlap the second bonding part 122 of the light emitting device 120. The second opening TH2 may be provided to overlap the second bonding part 122 of the light emitting device 120 in the first direction from the upper surface to the lower surface of the second frame 112.

The first opening TH1 and the second opening TH2 may be spaced apart from each other. The first opening TH1 and the second opening TH2 may be spaced apart from each other below the lower surface of the light emitting device 120.

According to an embodiment, a width of an upper region of the first opening TH1 may be greater than a width of the first bonding part 121. Also, a width of an upper region of the second opening TH2 may be greater than a width of the second bonding part 122.

The light emitting device package according to an embodiment may comprise a first conductor 221 and a second conductor 222, as illustrated in FIG. 10. Also, the light emitting device package according to an embodiment may comprise a first conductive layer 321 and a second conductive layer 322. The first conductive layer 321 may be spaced apart from the second conductive layer 322.

The first conductor 221 may be disposed under the first bonding part 121. The first conductor 221 may be electrically connected to the first bonding part 121. The first conductor 221 may be disposed to overlap the first bonding part 121 in the first direction.

The first conductor 221 may be provided in the first opening TH1. The first conductor 221 may be disposed between the first bonding part 121 and the first conductive layer 321. The first conductor 221 may be electrically connected to the first bonding part 121 and the first conductive layer 321.

The lower surface of the first conductor 221 may be disposed lower than the upper surface of the first opening TH1. The lower surface of the first conductor 221 may be lower than the upper surface of the first conductive layer 321.

The first conductor 221 may be disposed on the first opening TH1. Also, the first conductor 221 may extend from the first bonding part 121 to the inside of the first opening TH1.

Also, the second conductor 222 may be disposed under the second bonding part 122. The second conductor 222 may be electrically connected to the second bonding part 122. The second conductor 222 may be disposed to overlap the second bonding part 122 in the first direction.

The second conductor 222 may be provided in the second opening TH2. The second conductor 222 may be disposed between the second bonding part 122 and the second conductive layer 322. The second conductor 222 may be electrically connected to the second bonding part 122 and the second conductive layer 322.

The lower surface of the second conductor 222 may be disposed lower than the upper surface of the second opening TH2. The lower surface of the second conductor 222 may be lower than the upper surface of the second conductive layer 322.

The second conductor 222 may be disposed on the second opening TH2. Also, the second conductor 222 may extend from the second bonding part 122 to the inside of the second opening TH2.

In an embodiment, the first conductive layer 321 may be disposed on each of the bottom and side surfaces of the first conductor 221. The first conductive layer 321 may be disposed to directly contact the lower surface and side surfaces of the first conductor 221.

The first conductive layer 321 may be provided in the first opening TH1. The first conductive layer 321 may be disposed under the first bonding part 121. A width of the first conductive layer 321 may be greater than the width of the first bonding part 121.

As described above, according to the light emitting device package, electrical coupling between the first conductive layer 321 and the first bonding part 121 may be more stably provided by the first conductor 221.

Also, according to an embodiment, the second conductive layer 322 may be disposed on the lower and side surfaces of the second conductor 222. The second conductive layer 322 may be disposed to directly contact the lower surface and side surfaces of the second conductor 222.

The second conductive layer 322 may be provided in the second opening TH2. The second conductive layer 322 may be disposed under the second bonding part 122. The width of the second conductive layer 322 may be provided to be greater than the width of the second bonding part 122.

As described above, according to the light emitting device package 200, the electrical coupling between the second conductive layer 322 and the second bonding part 122 may be more stably provided by the second conductor 222.

For example, the first and second conductors 221 and 222 may be stably bonded to the first and second bonding parts 121 and 122 through separate bonding materials, respectively. Also, the side and lower surfaces of the first and second conductors 221 and 222 may contact the first and second conductive layers 321 and 322, respectively. Accordingly, when compared to the case in which the first and second conductive layers 321 and 321 directly contact the lower surfaces of the first and second bonding parts 121 and 122, respectively, each of contact areas when the first and second conductive layers 321 and 322 contact the first and second conductors 221 and 222, respectively, may be larger. Accordingly, the power may be stably supplied from the first and second conductive layers 321 and 322 to the first and second bonding parts 121 and 122 through the first and second conductors 221 and 222, respectively.

The first conductive layer 321 and the second conductive layer 322 may comprise at least one material selected from the group including Ag, Au, Pt, Sn, and Cu, or an alloy thereof. However, the present invention is not limited thereto, and a material capable of securing a conductive function may be used as each of the first conductive layer 321 and the second conductive layer 322.

For example, each of the first conductive layer 321 and the second conductive layer 322 may be formed using a conductive paste. The conductive paste may comprise a solder paste, a silver paste, and the like and may be provided as a multilayer that is formed of different materials or a multilayer or single layer made of an alloy. For example, each of the first conductive layer 321 and the second conductive layer 322 may comprise a Sn—Ag—Cu (SAC) material.

The light emitting device package according to an embodiment may comprise the first resin 130.

The first resin 130 may be disposed between the first package body 113 and the light emitting device 120. The first resin 130 may be disposed between the upper surface of the first package body 113 and the lower surface of the light emitting device 120.

Also, the light emitting device package according to the embodiment may comprise a recess R, as illustrated in FIG. 10. The recess R may be provided to be recessed from the lower surface of the cavity C to the lower surface of the package body 110.

The recess R may be provided in the first package body 113. The recess R may be provided to be recessed from the upper surface to the lower surface of the first package body 113. The recess R may be disposed under the light emitting device 120.

The recess R may be provided between the first opening TH1 and the second package body 117. Also, the recess R may be provided between the second opening TH2 and the second package body 117. For example, the recess R may be provided in a closed loop shape under the light emitting device 120.

When viewed from an upper side of the light emitting device 120, the recess R be disposed between the first bonding part 121 and the second package body 117 disposed adjacent to the first opening TH1. Also, when viewed from the upper side of the light emitting device 120, the recess R may be disposed between the second bonding part 122 and the second package body 117 disposed adjacent to the second opening TH2.

The recess R may be provided in a closed loop shape around the first and second openings TH1 and TH2.

When viewed from the upper side of the light emitting device 120, a size of the light emitting device 120 may be greater than a closed loop area provided by the recess R.

When viewed from the upper side of the light emitting device 120, a closed loop defined by the recess R may be provided in an outline connecting four side surfaces of the light emitting device 120 to each other.

The first resin 130 may be disposed in the recess R. The first resin 130 may be disposed between the light emitting device 120 and the first package body 113. The first resin 130 may be disposed between the first bonding part 121 and the second package body 117. The first resin 130 may be disposed between the second bonding part 122 and the second package body 117. For example, the first resin 130 may be disposed to contact a side surface of the first bonding part 121 and a side surface of the second bonding part 122.

The first resin 130 may provide stable fixing force between the light emitting device 120 and the first package body 113. For example, the first resin 130 may be disposed to directly contact the upper surface of the first package body 113. Also, the first resin 130 may be disposed to directly contact the lower surface of the light emitting device 120.

For example, the first resin 130 may comprise at least one of an epoxy-based material, a silicone-based material, or a hybrid material including the epoxy-based material and the silicone-based material. Also, the first resin 130 may reflect light emitted from the light emitting device 120. When the first resin 130 has a reflective function, the first resin 130 may comprise white silicone. When the first resin 130 has the reflection function, the first resin 130 may be formed of a material including, for example, $TiO_2$ and the like. The first resin 130 may be referred to as an adhesive.

The first and second bonding parts 121 and 122 of the light emitting device 120 may be sealed from the outside by the first resin 130 provided in the recess R. The first resin 130 may be provided in a closed loop shape under the light emitting device 120. The first resin 130 may be provided in a closed loop shape along the shape of the recess R. The recess R may be provided as a closed loop having a rectangular shape or may be provided as a closed loop having a circular or elliptic shape.

Also, the light emitting device package according to an embodiment may comprise a second resin 140, as illustrated in FIG. 10.

The second resin 140 may be provided on the light emitting device 120. The second resin 140 may be disposed on the first package body 113. The second resin 140 may be disposed in the cavity C provided by the second package body 117.

The second resin 140 may comprise an insulation material. Also, the second resin 140 may comprise a wavelength conversion means that receives light emitted from the light emitting device 120 to provide light of which a wavelength is converted. For example, the second resin 140 may comprise a phosphor, a quantum dot, and the like.

In addition, the light emitting device package according to an embodiment may comprise a first lower recess R11 and a second lower recess R12, as illustrated in FIG. 10. The first lower recess R11 and the second lower recess R12 may be spaced apart from each other.

The first lower recess R11 may be provided in a lower surface of the first frame 111. The first lower recess R11 may be recessed upward from the lower surface of the first frame 111. The first lower recess R11 may be spaced apart from the first opening TH1.

The first lower recess R11 may be provided to a width of several micrometers to several tens of micrometers. A resin part may be provided in the first lower recess R11. For example, the resin part filled in the first lower recess R11 may be formed of the same material as the first package body 113.

However, the present invention is not limited thereto, and the resin part may be selected from materials having poor adhesion and wettability with respect to the first and second conductive layers 321 and 322. Alternatively, the resin part may be selected from a material having a low surface tension with respect to the first and second conductive layers 321 and 322.

For example, the resin part filled in the first lower recess R11 may be provided while the first frame 111, the second frame 112, and the first body 115 are formed through an injection process.

The resin part filled in the first lower recess R11 may be disposed around an area of a lower surface of the first frame 111 providing the first opening TH1. The area of the lower surface of the first frame 111 providing the first opening TH1 may be disposed separately from a lower surface in the vicinity of the first frame 111 in a kind of island shape.

Therefore, when the resin part is formed of the material having the poor adhesion or wettability with respect to the first and second conductive layers 321 and 322 or the material having the low surface tension between the resin part and the first and second conductive layers 321 and 322, the first conductive layer 321 provided in the first opening TH1 may be prevented from being spread over the resin part filled in the first lower recess R11 or the first body 115 by moving away from the first opening TH1.

This is because of using the feature in which the adhesion relationship between the first conductive layer 321, the resin part, and the first body 115 or between the resin part and the first and second conductive layers 321 and 322 is poor. That is, the material forming the first conductive layer 321 may be selected to have good adhesive properties with respect to the first frame 111. Also, the material forming the first conductive layer 321 may be selected to have poor adhesive properties with respect to the resin part and the first body 115.

Accordingly, the first conductive layer 321 may be prevented from being spread to flow over the region provided by the resin part or the first body 115 by overflowing from the first opening TH1 to the region provided by the outside of the first resin part or the first body 115, and thus, the first conductive layer 321 may be stably disposed on the region in which the first opening TH1 is provided. Therefore, when the first conductive layer 321 disposed in the first opening TH1 overflows, the first conductive layer 321 may be prevented from being expanded out of the region of the first lower recess R11, in which the resin part or the first body 115 is provided. Also, the first conductive layer 321 may be stably connected to the lower surface of the first bonding part 121 in the first opening TH1.

Therefore, when the light emitting device package is mounted on the circuit board, a problem in which the first conductive layer 321 and the second conductive layer 322 contact each other to cause electrical short circuit may be prevented, and in a process of locating the first and second conductive layers 321 and 322, an amount of each of the first and second conductive layers 321 and 322 may be easily controlled.

Also, the second lower recess R12 may be provided in a lower surface of the second frame 112. The second lower recess R12 may be recessed upward from the lower surface of the second frame 112. The second lower recess R12 may be spaced apart from the second opening TH2.

The second lower recess R12 may be provided to a width of several micrometers to several tens of micrometers. The resin part may be provided in the second lower recess R12. The resin part filled in the second lower recess R12 may be, for example, formed of the same material as the first body 115.

However, the present invention is not limited thereto, and the resin part may be selected from materials having poor adhesion and wettability with respect to the first and second conductive layers 321 and 322. Alternatively, the resin part may be selected from a material having a low surface tension with respect to the first and second conductive layers 321 and 322.

For example, the resin part filled in the second lower recess R12 may be provided while the first frame 111, the second frame 112, and the first body 115 are formed through an injection process.

The resin part filled in the second lower recess R12 may be disposed around an area of a lower surface of the second frame 112 providing the second opening TH2. The area of the lower surface of the second frame 112 providing the second opening TH2 may be disposed separately from a lower surface in the vicinity of the second frame 112 in a kind of island shape.

Therefore, when the resin part is formed of the material having the poor adhesion or wettability with respect to the first and second conductive layers 321 and 322 or the material having the low surface tension between the resin part and the first and second conductive layers 321 and 322, the second conductive layer 322 provided in the second opening TH2 may be prevented from being spread over the resin part filled in the second lower recess R12 or the first body 115 by moving away from the second opening TH2.

This is because of using the feature in which the adhesion relationship between the second conductive layer 322, the resin part, and the first body 115 or between the resin part and the first and second conductive layers 321 and 322 is poor. That is, the material forming the second conductive layer 322 may be selected to have good adhesive properties with respect to the second frame 112. Also, the material forming the second conductive layer 322 may be selected to have poor adhesive properties with respect to the resin part and the first body 115.

Accordingly, the second conductive layer 322 may be prevented from being spread to flow over the region provided by the resin part or the first body 115 by overflowing from the second opening TH2 to the region provided by the outside of the first resin part or the first body 115, and thus, the second conductive layer 322 may be stably disposed on the region in which the second opening TH2 is provided. Therefore, when the second conductive layer 322 disposed in the second opening TH2 overflows, the second conductive layer 322 may be prevented from being expanded out of the region of the second lower recess R12, in which the resin part or the first body 115 is provided. Also, the second conductive layer 322 may be stably connected to the lower surface of the second bonding part 122 in the second opening TH2.

Therefore, when the light emitting device package is mounted on the circuit board, a problem in which the first conductive layer 321 and the second conductive layer 322 contact each other to cause electrical short circuit may be prevented, and in a process of locating the first and second conductive layers 321 and 322, an amount of each of the first and second conductive layers 321 and 322 may be easily controlled.

In the light emitting device package illustrated in FIG. 10, in the process of forming the first and second openings TH1 and TH2, a case in which etching is performed in each of directions of upper and lower surfaces of the first and second lead frames 111 and 112 will be described.

As the etching is performed in each of the directions of the upper and lower surfaces of the first and second lead frames 111 and 112, respectively, each of the first and second openings TH1 and TH2 may have a spherical shape having different widths between upper and lower portions, respectively.

Each of the first and second openings TH1 and TH2 may have a first point between an upper portion and a lower portion thereof and may gradually increase in width from the lower region toward the first point and then decrease in width again. Also, the width may gradually increase from an intermediate region in which the width decrease toward the upper region and then decrease again.

The above described first point of each of the first and second openings TH1 and TH2 may refer to a boundary area at which a size of the opening decreases from the lower region to the upper region and then increases again. Also, the first point may be a point having the smallest width in the first direction between the upper and lower surfaces of each of the first and second openings TH1 and TH2.

Each of the first and second openings TH1 and TH2 may comprise a first area disposed on an upper surface of each of the first and second frames 111 and 112 and a second area disposed on a lower surface of each of the first and second frames 111 and 112 on the basis of the first point. A width of the upper surface of the first area may be provided to be less than that of the lower surface of the second area.

Since each of the first and second openings TH1 and TH2 may comprise the first area including a first point between the upper surface and the lower surface and having a curvature between the upper surface of the first point and the second area having a curvature between the first point and the lower surface, adhesion force between first and second conductors 221, which will be described later, and 222 and the first and second conductors 321 may be improved. Also, the process problem in which the first and second frames are damaged during the process of forming the first and second openings TH1 and TH2 may be improved.

According to an embodiment, after the etching process for forming the first and second openings TH1 and TH2 is completed, a plating process may be performed on the first and second frames 111 and 112. Accordingly, first and second plating layers 111a and 112a may be formed on surfaces of the first and second frames 111 and 112.

The first and second plating layers 111a and 112a may be provided on upper and lower surfaces of the first and second frames 111 and 112. Also, the first and second plating layers 111a and 112a may be provided on boundary areas that contact the first and second openings TH1 and TH2, respectively.

For example, the first and second frames 111 and 112 may be provided as Cu layers as basic support members. Also, each of the first and second plating layers 111a and 112a may comprise at least one of a Ni layer and a Ag layer.

When each of the first and second plating layers 111a and 112a includes the Ni layer, since the Ni layer has a small change in thermal expansion, even when the size or arrangement position of the package body is changed by the thermal expansion, the position of the light emitting device disposed on the upper portion thereof by the Ni layer may be stably fixed. When each of the first and second plating layers 111a and 112a include the Ag layer, the Ag layer may efficiently reflect light emitted from the upper light emitting device to improve luminous intensity.

The first and second metal layers 111a and 112a provided in the boundary areas contacting the first and second openings TH1 and TH2 may be bonded to the first and second conductive layers 321 and 322 provided in the first and second openings TH1 and TH2 to form first and second alloy layers, respectively.

According to an embodiments, in the process of forming the first and second conductive layers 321 and 322, or the thermal treatment process after providing the first and second conductive layers 321 and 322, intermetallic compounds may be formed between the first and second conductive layers 321 and 322, and the first and second frames 111 and 112, respectively.

For example, materials forming the first and second conductive layers 321 and 322 and the first and second metal layers 111a and 112a of the first and second frames 111 and 112 may be bonded to each other to form the first and second alloy layer, respectively.

Thus, the first conductive layer 321 and the first frame 111 may be physically or electrically bonded stably to each other. The first conductive layer 321, the first alloy layer, and the first frame 111 may be physically or electrically bonded stably to each other.

Also, the second conductive layer 322 and the second frame 112 may be physically or electrically bonded stably to each other. The second conductive layer 322, the second alloy layer, and the second frame 112 may be physically or electrically bonded stably to each other.

For example, each of the first and second alloy layers may comprise at least one intermetallic compound layer formed of a material selected from the group including AgSn, CuSn, AuSn, and the like. The intermetallic compound layer may be formed through coupling between a first material and a second material. The first material may be provided from the first and second conductive layers 321 and 322, and the second material may be provided from the first and second metal layers 111a and 112a or the support members of the first and second frames 111 and 112.

According to an embodiment, the intermetallic compound layer may be provided to a thickness of several micrometers. For example, the intermetallic compound layer may be provided to a thickness of 1 micrometer to 3 micrometers.

When each of the first and second conductive layers 321 and 322 includes the Sn material, and each of the first and second metal layers 111a and 112a includes the Ag material, in the process of forming the first and second conductive layers 321 and 322, or the thermal treatment process after providing the first and second conductive layers 321 and 322, the Sn material and the Ag material may be bonded to each other to form AgSn intermetallic compound layers.

Also, when each of the first and second conductive layers 321 and 322 includes the Sn material, and each of the first and second metal layers 111a and 112a includes the Au material, in the process of forming the first and second conductive layers 321 and 322, or the thermal treatment process after providing the first and second conductive layers 321 and 322, the Sn material and the Au material may be bonded to each other to form AuSn intermetallic compound layers.

Also, when each of the first and second conductive layers 321 and 322 includes the Sn material, and each of the first and second frames 111 and 112 includes the Cu material, in the process of forming the first and second conductive layers 321 and 322, or the thermal treatment process after providing the first and second conductive layers 321 and 322, the Sn material and the Cu material may be bonded to each other to form CuSn intermetallic compound layers.

Also, when each of the first and second conductive layers 321 and 322 includes the Ag material, and each of the first and second metal layers 111a and 112a or the support members of the first and second frames 111 and 112 includes the Sn material, in the process of forming the first and second conductive layers 321 and 322, or the thermal treatment process after providing the first and second conductive layers 321 and 322, the Ag material and the Sn material may be bonded to each other to form AgSn intermetallic compound layers.

The intermetallic compound layer described above may have a higher melting point than the general bonding material. Also, the heat treatment process in which the intermetallic compound layer is formed may be performed at a lower temperature than the melting point of the general bonding material.

Accordingly, the light emitting device package 100 according to an embodiment does not cause the re-melting phenomenon between the light emitting device 120 and the light emitting device package even when bonded to the substrate through the reflow process, and thus, the electrical connection and the physical bonding force may not be degraded.

Also, according to the light emitting device package and the method of manufacturing the light emitting device package according to the embodiment, the package body 110 does not need to be exposed to a high temperature in the process of manufacturing the light emitting device package. Therefore, according to an embodiment, the package body 110 may be prevented from being damaged or discolored due to the exposure at the high temperature.

Accordingly, the selection range for the material forming the first body 115 may be widened. According to an embodiment, the first body 115 may be provided using a relatively inexpensive resin material as well as an expensive material such as a ceramic.

For example, the first body 115 may comprise at least one material selected from the group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

In an embodiment, the intermetallic compound layer may be formed between the first and second conductors 221 and 222 and the first and second conductive layers 321 and 322.

Similarly, as described above, according to an embodiments, in the process of forming the first and second conductive layers 321 and 322, or the thermal treatment process after providing the first and second conductive layers 321 and 322, intermetallic compounds may be formed between the first and second conductive layers 321 and 322 and the first and second conductors 221 and 222, respectively.

For example, an alloy layer may be formed by coupling the materials forming the first and second conductive layers 321 and 322 to the first and second conductors 221 and 222.

Accordingly, the first conductive layer 321 and the first conductor 221 may be more physically or electrically bonded more stably to each other. The first conductive layer 321, the alloy layer, and the first conductor 221 may be physically or electrically bonded stably to each other.

Also, the second conductive layer 322 and the second conductor 222 may be more physically or electrically bonded more stably to each other. The second conductive layer 322, the alloy layer, and the second conductor 222 may be physically or electrically bonded stably to each other.

For example, the alloy layer may comprise at least one intermetallic compound layer selected from the group including AgSn, CuSn, AuSn, and the like. The intermetallic compound layer may be formed through coupling between a first material and a second material. The first material may be provided from the first and second conductive layers 321 and 322, and the second material may be provided from the first and second conductors 221 and 222.

According to an embodiment, the intermetallic compound layer may be provided to a thickness of several micrometers. For example, the intermetallic compound layer may be provided to a thickness of 1 micrometer to 3 micrometers.

In the light emitting device package according to an embodiment, when each of the first and second bonding parts 121 and 122 of the light emitting device 120 has a small size to improve the light extraction efficiency, a width of the upper region of the first opening TH1 may be greater than or equal to the width of the first bonding part 121. Also, a width of an upper region of the second opening TH2 may be greater than or equal to a width of the second bonding part 122.

Also, the width of the upper region of the first opening TH1 may be less than or equal to a width of a lower region of the first opening TH1. Also, the width of the upper region of the second opening TH2 may be less than or equal to a width of a lower region of the second opening TH2.

For example, the width of the upper region of the first opening TH1 may be provided to several tens of micrometers to several hundred micrometers. Also, the width of the lower region of the first opening TH1 may be provided to be greater several tens of micrometers to several hundred micrometers than the width of the upper region of the first opening TH1.

Also, the width of the upper region of the second opening TH2 may be provided to several tens of micrometers to several hundred micrometers. Also, the width of the lower region of the second opening TH2 may be provided to be greater several tens of micrometers to several hundred micrometers than the width of the upper region of the second opening TH2.

Also, the width of the lower region of the first opening TH1 may be greater than the width of the upper region of the first opening TH1. The first opening TH1 may be provided to a constant width by a predetermined depth in the upper region and may be provided in an inclined shape toward the lower region.

Also, the width of the lower region of the second opening TH2 may be greater than the width of the upper region of the second opening TH2. The second opening TH2 may be provided in a constant width by a predetermined depth in the upper region and may be provided in an inclined shape toward the lower region.

For example, the first opening TH1 may be provided in an inclined shape of which a width gradually decreases from the lower region to the upper region. Also, the second opening TH2 may be provided in an inclined shape of which a width gradually decreases from the lower region to the upper region.

However, the present invention is not limited thereto, and an inclined surfaces between the upper and lower regions of the first and second openings TH1 and TH2 may have a plurality of inclined surfaces having different inclinations, and each of the inclined surfaces may be disposed at a curvature.

In the light emitting device package according to an embodiment, as illustrated in FIG. 10, when the areas of the first and second bonding parts 121 and 122 are small, the first and second bonding parts 121 and 122 may be disposed inside the first and second openings TH1 and TH2.

Here, since the areas of the first and second bonding parts 121 and 122 are small, it may be difficult to secure adhesion force between the first and second conductive layers 321 and 322 and the first and second bonding parts 121 and 122. Thus, the light emitting device package according to an embodiment may further include a first conductor 221 and a second conductor 222 so as to further secure a contact area between the first and second conductive layers 321 and 322 and the first and second bonding parts 121 and 122.

According to an embodiment, the first conductive layer 321 may be electrically connected to the first bonding part 121, and the second conductive layer 322 may be electrically connected to the second bonding part 122. For example, external power may be supplied to the first conductive layer 321 and the second conductive layer 322, and thus, the light emitting device 120 may be driven.

According to the light emitting device package according to the embodiment, the first resin 130 provided in the recess R may be provided between the lower surface of the light emitting device 120 and the upper surface of the package body 110. When viewed from the upper side of the light emitting device 120, the first resin 130 may be provided in a closed loop shape around the first and second bonding parts 121 and 122. Also, when viewed from the upper side of the light emitting device 120, the first resin 130 may be provided in a closed loop shape around the first and second openings TH1 and TH2.

The first resin 130 may perform a function of stably fixing the light emitting device 120 to the package body 110. Also, the first resin 130 may contact the side surfaces of the first and second bonding parts 121 and 122 and may be disposed around the first and second bonding parts 121 and 122. When viewed from the upper side of the light emitting device 120, the first resin 130 may be disposed so that the first and second openings TH1 and TH2 are isolated from an outer region in which the second resin 140 is provided.

The first resin 130 may prevent the first and second conductive layers 321 and 322 provided in the first and second openings TH1 and TH2 from being separated from the closed loop of the recess R to flow in the outward direction of the light emitting device 120.

When viewed from the upper side of the light emitting device 120, if the first and second conductive layers 321 and 322 move outward from the light emitting device 120, the first and second conductive layers 321 and 322 may be spread along the side surface of the light emitting device 120. As described above, when the first and second conductive layers 321 and 322 move to the side surfaces of the light emitting device 120, the first conductivity type semiconductor layer and the second conductivity type semiconductor layer of the light emitting device 120 may be electrically short-circuited. Also, when the first and second conductive layers 321 and 322 move to the side surface of the light emitting device 120, light extraction efficiency of the light emitting device 120 may be deteriorated.

However, according to an embodiment, since the inside and the outside are isolated based on the region provided with the recess R by the first resin 130, the first and second conductive layers 321 and 322 may be prevented from moving outward from the area provided with the recess R.

Therefore, according to the light emitting device package according to an embodiment, the first and second conductive layers 321 and 322 may be prevented from moving to the side surface of the light emitting device 120 and also may be prevented from being electrically short-circuited to improve the light extraction efficiency.

Also, according to an embodiment, the first resin 130 provided in the recess R may be provided to move a first area A1 disposed under the light emitting device 120 along the lower surface of the light emitting device 120 and may be disposed to contact four side surfaces of the first and second bonding parts 121 and 122. Thus, the first and second bonding parts 121 and 122 may be disposed to be surrounded by the first resin 130, and the first and second openings TH1 and TH2 may be sealed by the first resin 130.

As described above, since the first and second openings TH1 and TH2 are sealed by the first resin 130, the first and second conductive layers 321 and 322 provided in the first and second openings TH1 and TH2 may be prevented to moving upward from the upper surface of the first package body 113.

Also, according to an embodiment, the sum of the areas of the first and second bonding parts 121 and 122 may be provided to 10% or less based on the area of the upper surface of the substrate 124. According to the light emitting device package according to an embodiment, in order to secure the light emitting area through which light is emitted from the light emitting device to improve the light extraction efficiency, the sum of the areas of the first and second bonding parts 121 and 122 may be set to 10% or less based on the area of the upper surface of the substrate 124.

Also, according to an embodiment, the sum of the areas of the first and second bonding parts 121 and 122 may be provided to 0.7% or more with reference to the area of the upper surface of the substrate 124. According to the light emitting device package according to an embodiment, in order to provide stable bonding force to the mounted light emitting device, the sum of the areas of the first and second bonding parts 121 and 122 may be set to 0.7% or more with reference to the area of the upper surface of the substrate 124.

Also, according to the light emitting device package according to an embodiment, in order to stably locate the first conductor 221 and the second conductor 222, the sum of the areas of the first and second bonding parts 121 and 122 may be set to 0.7% or more with reference to the area of the upper surface of the substrate 124.

As described above, as the areas of the first and second bonding parts 121 and 122 are small, an amount of light transmitted to the lower surface of the light emitting device 120 may increase. Also, the first resin 130 having good reflective characteristics may be provided under the light emitting device 120. Therefore, light emitted in the downward direction of the light emitting device 120 may be reflected by the first resin 130 and be effectively emitted in the upward direction of the light emitting device package to improve the light extraction efficiency.

The light emitting device package according to an embodiment described above may be provided to be mounted on a submount or a circuit board.

However, when the light emitting device package of the related art is mounted on the submount or the circuit board, a high temperature process such as a reflow process may be applied. Here, in the reflow process, a re-melting phenomenon occurs in a bonding area between the lead frame and the light emitting device provided in the light emitting device package to deteriorate the stability of the electrical connection and the physical coupling.

However, according to the light emitting device package and the method of manufacturing the light emitting device package according to an embodiment, the bonding part of the light emitting device according to an embodiment may receive driving power through the conductive layer disposed in the opening. Also, a melting point of the conductive layer disposed in the opening may be selected to have a higher value than that of the general bonding material.

Accordingly, the light emitting device package according to an embodiment does not cause the re-melting phenomenon even when bonded to a main substrate through the reflow process, and thus, the electrical connection and the physical bonding force may not be degraded.

Also, according to the light emitting device package and the method of manufacturing the light emitting device package according to the embodiment, the package body 110 does not need to be exposed to a high temperature in the process of manufacturing the light emitting device package. Therefore, according to an embodiment, the package body 110 may be prevented from being damaged or discolored due to the exposure at the high temperature.

Accordingly, the selection range for the material forming the first body 115 may be widened. According to an embodiment, the first body 115 may be provided using a relatively inexpensive resin material as well as an expensive material such as a ceramic.

For example, the first body 115 may comprise at least one material selected from the group including a polyphthalamide (PPA) resin, a polycyclohexylenedimethylene terephthalate (PCT) resin, an epoxy molding compound (EMC) resin, a silicone molding compound (SMC) resin, and a polyimide (PI) resin.

Figure 11:
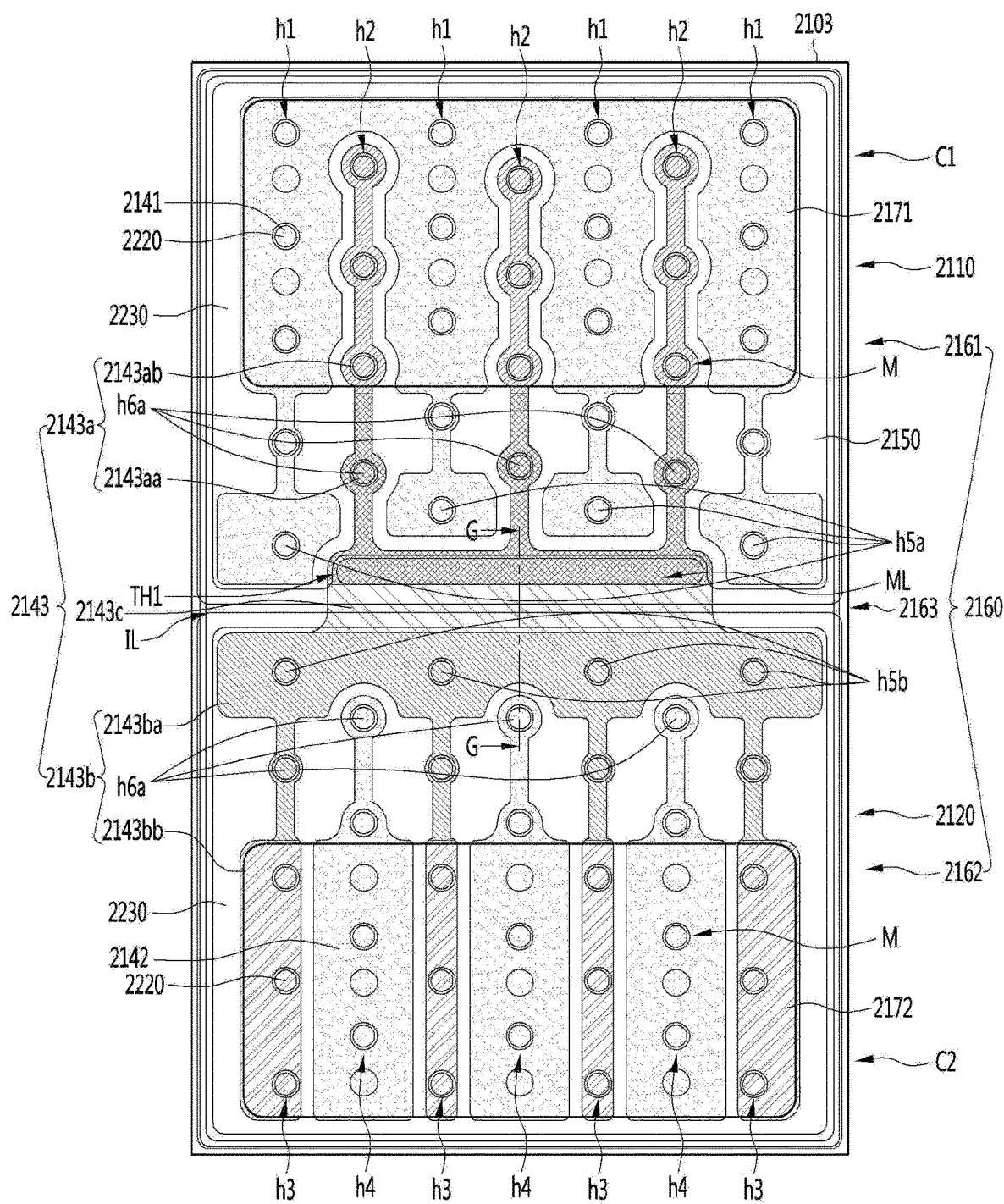
FIG. 11 is a plan view explaining an example of a light emitting device that is applied to the light emitting device package according to an embodiment of the present invention.

Next, an example of the light emitting device applied to the light emitting device package according to an embodiment of the present invention will be described with reference to FIGS. 11 and 12. FIG. 11 is a plan view explaining an example of the light emitting device that is applied to the light emitting device package according to an embodiment of the present invention, and FIG. 12 is a cross-sectional view taken along line G-G of a light emitting device illustrated in FIG. 11.

In the description of the light emitting device according to an embodiment with reference to FIGS. 11 and 12, descriptions overlapping with those described with reference to FIGS. 1 to 10 may be omitted.

For clarity, although first and second electrodes are disposed under a first bonding part 2171 and a second bonding part 2172 in FIG. 1, a first electrode 2141 electrically connected to the first bonding part 2171 and a second electrode 2142 electrically connected to the second bonding part 2172 may be shown.

Figure 12:
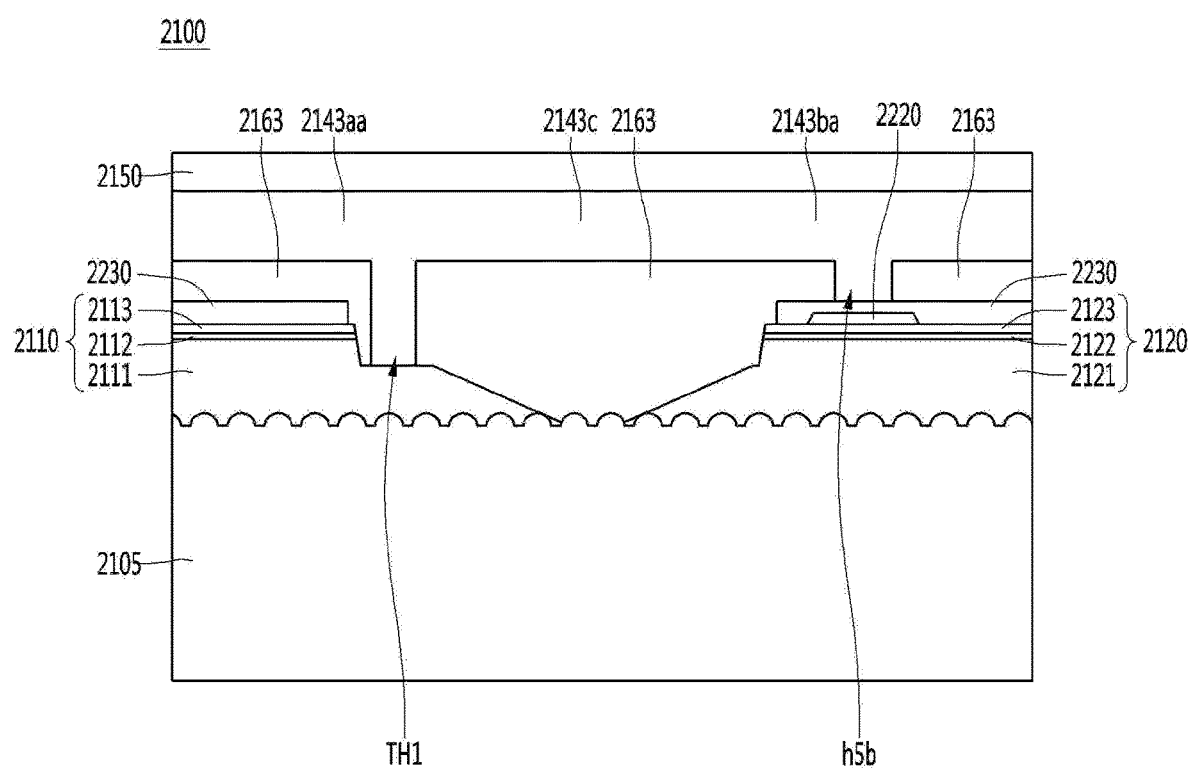
FIG. 12 is a cross-sectional view taken along line G-G of a light emitting device shown in FIG. 11.

As illustrated in FIGS. 11 and 12, a light emitting device 2100 may comprise a first light emitting structure 2110 and a second light emitting structure 2120, which are disposed on a substrate 2105.

The substrate 2105 may be formed of a material selected from the group including sapphire substrate ($Al_2O_3$), SiC, GaAs, GaN, ZnO, Si, GaP, InP, and Ge. For example, the substrate 2105 may be provided as a patterned sapphire substrate (PSS) having an uneven pattern formed on an upper surface thereof.

The first light emitting structure 2110 may comprise a first conductivity type first semiconductor layer 2111, a first active layer 2112, and a second conductivity type second semiconductor layer 2113. The first active layer 2112 may be disposed between the first semiconductor layer 2111 and the second semiconductor layer 2113. For example, the first active layer 2112 may be disposed on the first semiconductor layer 2111, and the second semiconductor layer 2113 may be disposed on the first active layer 2112.

In addition, the second light emitting structure 2120 may comprise a first conductivity type third semiconductor layer 2121, a second active layer 2122, and a second conductivity type fourth semiconductor layer 2123. The second active layer 2122 may be disposed between the third semiconductor layer 2121 and the fourth semiconductor layer 2123. For example, the second active layer 2122 may be disposed on the third semiconductor layer 2121, and the fourth semiconductor layer 2123 may be disposed on the second active layer 2122.

According to an embodiment, each of the first semiconductor layer 2111 and the third semiconductor layer 2121 may be provided as an n-type semiconductor layer, and each of the second semiconductor layer 2113 and the fourth semiconductor layer 2123 may be a p-type semiconductor layer. Of course, according to another embodiment, each of the first semiconductor layer 2111 and the third semiconductor layer 2121 may be provided as a p-type semiconductor layer, and each of the second semiconductor layer 2113 and the fourth semiconductor layer 2123 may be provided as an n-type semiconductor layer.

Hereinafter, for convenience of description, the structure in which each of the first semiconductor layer 2111 and the third semiconductor layer 2121 is provided as the n-type semiconductor layer, and each of the second semiconductor layer 2113 and the fourth semiconductor layer 2123 is provided as the p-type semiconductor layer will be described as a reference.

Also, in the above description, the first semiconductor layer 2111 and the third semiconductor layer 2121 are disposed on the substrate 2105 to contact each other. However, a buffer layer may be further disposed between the first semiconductor layer 2111 and the substrate 2105 and/or between the third semiconductor layer 2121 and the substrate 2105. For example, the buffer layer may provide a function of reducing a lattice constant difference between the substrate 2105 and the first and second light emitting structures 2110 and 2120 to improve crystallinity.

Each of the first and second light emitting structures 2110 and 2120 may be provided as a compound semiconductor. The first and second light emitting structures 2110 and 2120 may be provided as, for example, Group II-V or III-V compound semiconductors. For example, each of the first and second light emitting structures 2110 and 2120 may be formed of at least two or more elements selected from aluminum (Al), gallium (Ga), indium (In), phosphorus (P), arsenic (As), and nitrogen (N).

The first and third semiconductor layers 2111 and 2121 may be provided as, for example, Group II-VI compound semiconductors or Group III-V compound semiconductors. For example, each of the first and third semiconductor layers 2111 and 2121 may be a semiconductor material having a composition formula of $In_xAl_yGa_{1-x-y}N$ ($0 \leq x \leq 1$, $0 \leq y \leq 1$, $0 \leq x+y \leq 1$) or a semiconductor material having a composition formula of $(Al_xGa_{1-x})_yIn_{1-y}P$ ($0 \leq x \leq 1$, $0 \leq y \leq 1$). For example, each of the first and third semiconductor layers 2111 and 2121 may be formed of a material selected from GaN, AlN, AlGaN, InGaN, InN, InAlGaN, AlInN, AlGaAs, GaP, GaAs, GaAsP, AlGaInP, AlInP, GaInP, and the like and may be doped with an n-type dopant selected from the group including Si, Ge, Sn, Se, Te, and the like.

The first and second active layers 2112 and 2122 may be provided as, for example, Group II-VI compound semiconductors or Group III-V compound semiconductors. For example, each of the first and third active layers 2112 and 2122 may be a semiconductor material having a composition formula of $In_xAl_yGa_{1-x-y}N$ ($0 \leq x \leq 1$, $0 \leq y \leq 1$, $0 \leq x+y \leq 1$) or a semiconductor material having a composition formula of $(Al_xGa_{1-x})_yIn_{1-y}P$ ($0 \leq x \leq 1$, $0 \leq y \leq 1$). For example, each of the first and second active layers 2112 and 2122 may be formed of a material selected from a group including GaN, AlN, AlGaN, InGaN, InN, InAlGaN, AlInN, AlGaAs, GaP, GaAs, GaAsP, AlGaInP, AlInP, GaInP, and the like. For example, each of the first and second active layers 2112 and 2122 may be provided in a multi-well structure and may comprise a plurality of barrier layers and a plurality of well layers.

The second and fourth semiconductor layers 2113 and 2123 may be provided as, for example, Group II-VI compound semiconductors or Group III-V compound semiconductors. For example, each of the second and fourth semiconductor layers 2113 and 2123 may be a semiconductor material having a composition formula of $In_xAl_yGa_{1-x-y}N$ ($0 \leq x \leq 1$, $0 \leq y \leq 1$, $0 \leq x+y \leq 1$) or a semiconductor material having a composition formula of $(Al_xGa_{1-x})_yIn_{1-y}P$ ($0 \leq x \leq 1$, $0 \leq y \leq 1$). For example, each of the second and fourth semiconductor layers 2113 and 2123 may be formed of a material selected from GaN, AlN, AlGaN, InGaN, InN, InAlGaN, AlInN, AlGaAs, GaP, GaAs, GaAsP, AlGaInP, AlInP, GaInP, and the like and may be doped with a p-type dopant selected from the group including Mg, Zn, Ca, Sr, Ba, and the like.

The light emitting device 2100 according to an embodiment may comprise a light transmissive electrode layer 2230, as illustrated in FIG. 12. The light transmissive electrode layer 2230 may improve current injection efficiency between the second and fourth semiconductor layers 2113 and 2123 and the light transmissive electrode layer 2230, thus the light output of the light emitting device 2100 can be increased. Also, the light transmissive electrode layer 2230 may transmit light emitted from the active layer 2122. The above-described effect will be described later, and the position and shape of the light transmissive electrode layer 2230 will be further described with reference to the method of manufacturing the light emitting device according to an embodiment.

For example, the light transmissive electrode layer 2230 may comprise at least one selected from the group including metal, metal oxide, and metal nitride.

The light transmissive electrode layer 2230 may be formed of, for example, at least one selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x/ITO$, $Ni/IrO_x/Au$, $Ni/IrO_x/Au/ITO$, Pt, Ni, Au, Rh, and Pd.

The light emitting device 2100 according to an embodiment may comprise a reflective layer 2160, as illustrated in FIGS. 11 and 12. The reflective layer 2160 may comprise a first reflective layer 2161, a second reflective layer 2162, and a third reflective layer 2163. The reflective layer 2160 may be disposed on the light transmissive electrode layer 2230.

Since the reflective layer 2160 is disposed on the light transmissive electrode layer 2230, light emitted from the active layer 2123 may be reflected by the reflective layer 2160. Thus, light emitted from the active layer 2123 may be prevented from being absorbed and lost by a first electrode 2141, a second electrode 2142, and a connection electrode 2143, which will be described later, and thus, the light extraction efficiency of the light emitting device 2100 may be improved.

That is, in this embodiment, the light transmissive electrode layer 2230 and the reflective layer 2160 are provided to secure electrical characteristics. However, this embodiment is not limited thereto, and according to another embodiment, only the reflective layer 2160 may be provided without arranging the light transmissive electrode layer 2230 to secure all the electrical and optical characteristics.

The first reflective layer 2161 may be disposed on the first light emitting structure 2110. The second reflective layer 2162 may be disposed on the second light emitting structure 2120. The third reflective layer 2163 may be disposed between the first reflective layer 2161 and the second reflective layer 2162. The third reflective layer 2163 may be disposed on the first light emitting structure 2110 and the second light emitting structure 2120.

For example, the third reflecting layer 2163 may be connected to the first reflecting layer 2161. Also, the third reflective layer 2163 may be connected to the second reflective layer 2162. The third reflective layer 2163 may be disposed to be in direct physical contact with the first reflective layer 2161 and the second reflective layer 2162. The first to third reflective layers 2161, 2162 and 2163 may be formed as one reflective layer connected to each other.

The first reflective layer 2161 may comprise a plurality of openings. The first reflective layer 2161 may comprise a plurality of first openings h1 provided to pass through in a first direction, which is a direction perpendicular to the upper surface of the substrate 2105. Also, the first reflective layer 2161 may comprise a plurality of second openings h2 provided to pass through in the first direction.

The second reflective layer 2162 may comprise a plurality of openings. The second reflective layer 2162 may comprise a plurality of third openings h3 provided to pass through in the first direction perpendicular to the upper surface of the substrate 2105. Also, the second reflective layer 2162 may comprise a plurality of fourth openings h4 provided to pass through in the first direction.

The third reflective layer 2163 may comprise a plurality of openings. The third reflective layer 2163 may comprise a plurality of fifth-a and fifth-b openings h5a and h5b provided to pass through in the first direction perpendicular to the upper surface of the substrate 2105.

Also, the third reflective layer 2163 may comprise a plurality of sixth-a and sixth-b openings h6a and h6b provided to pass through in the first direction. Also, the third reflective layer 2163 may comprise a line opening TH1 provided to pass through in the first direction.

The line opening TH1 may extend in a second direction perpendicular to the first direction. The line opening TH1 is disposed between the first light emitting structure 2110 and the second light emitting structure 2120 to connect the first electrode of the first light emitting structure 2110 to the second electrode of the second light emitting structure 2120 so that the first and second light emitting structures 2110 and 2120 are connected to each other in series.

Here, a structure in which an area of the first electrode is greater than that of the second electrode may be advantageous in terms of current spreading and current injection characteristics in the structure connected in series. Thus, the line opening TH1 may be connected to the first electrode of the first light emitting structure 2110, be disposed at a position adjacent to the second light emitting structure 2120, and be disposed wider than the area of the fifth-b opening h5b facing the line opening TH1.

For example, as illustrated in FIG. 12, the third reflective layer 2163 may comprise the line opening TH1 and the fifth-b opening h5b. The line opening TH1 may expose an upper surface of the first semiconductor layer 2111. The fifth-b opening h5b may expose an upper surface of the light transmissive electrode layer 2230 disposed on the fourth semiconductor layer 2123.

According to an embodiment, a current spreading layer 2220 may be further disposed under the fifth-b opening h5b. The current spreading layer 2220 may be disposed between the fourth semiconductor layer 2123 and the light transmissive electrode layer 2230.

The arranged positions and shapes of the reflective layer 2160, the light transmissive electrode layer 2230, and the current spreading layer 2220 will be further described with reference to the method of manufacturing the light emitting device according to an embodiment.

The reflective layer 2160 may be provided as an insulating reflective layer. For example, the reflective layer 2160 may be provided as a Distributed Bragg Reflector (DBR) layer. Also, the reflective layer 2160 may be provided as an Omni Directional Reflector (ODR) layer. Also, the reflective layer 2160 may be provided by laminating the DBR layer and the ODR layer.

As illustrated in FIGS. 11 and 12, the light emitting device 2100 according to an embodiment may comprise a first electrode 2141, a second electrode 2142, and a connection electrode 2143.

According to an embodiment, the first electrode 2141 and the second electrode 2142 may be spaced apart from each other. The connection electrode 2143 may be disposed between the first electrode 2141 and the second electrode 2142.

The first electrode 2141 may be disposed on the first reflective layer 2161. A partial portion of the first electrode 2141 may be disposed on the third reflective layer 2163.

The first electrode 2141 may be electrically connected to the second semiconductor layer 2113. The first electrode 2141 may be electrically connected to the second semiconductor layer 2113 through the plurality of first openings h1.

The first electrode 2141 may be disposed to directly contact the light transmissive electrode layer 2230 disposed under the plurality of first openings h1 in a region in which the first light emitting structure 2110 is provided. The first electrode 2141 may be disposed to directly contact an upper surface of the light transmissive electrode layer 2230 exposed by the plurality of first openings h1 in the region in which the first light emitting structure 2110 is provided.

The second electrode 2142 may be disposed on the second reflective layer 2162. A partial portion of the second electrode 2142 may be disposed on the third reflective layer 2163.

The second electrode 2142 may be electrically connected to the third semiconductor layer 2121. The second electrode 2142 may be electrically connected to the third semiconductor layer 2121 through the plurality of fourth openings h4. The second electrode 2142 may be in direct contact with the third semiconductor layer 2121 disposed under the plurality of fourth openings h4 in a region in which the second light emitting structure 2120 is provided. The second electrode 2142 may be disposed in direct contact with an upper surface of the third semiconductor layer 2121 exposed by the plurality of fourth openings h4 in the region where the second light emitting structure 2120 is provided.

The connection electrode 2143 may be disposed on the third reflective layer 2163. A partial portion of the connection electrode 2143 may be disposed on the first reflective layer 2161. A partial portion of the connection electrode 2143 may be disposed on the second reflective layer 2162.

The connection electrode 2143 may be electrically connected to the first semiconductor layer 2111 and the fourth semiconductor layer 2123.

The connection electrode 2143 may comprise a first portion 2143a disposed on the first semiconductor layer 2111, a second portion 2143b disposed on the fourth semiconductor layer 2123, and a third portion 2143c connecting the first portion 2143a to the second portion 2143a.

The connection electrode 2143 may comprise the first portion 2143a disposed on the region in which the first light emitting structure 2110 is provided. The connection electrode 2143 may comprise a second portion 2143b disposed on the region in which the second light emitting structure 2120 is provided. The connection electrode 2143 may comprise the third portion 2143c disposed on a boundary area between the first light emitting structure 2110 and the second light emitting structure 2120.

According to an embodiment, the first portion 2143a may comprise a first electrode part 2143aa and a second electrode part 2143ab.

The first portion 2143a may be electrically connected to the first semiconductor layer 2111 through the plurality of second openings h2, the plurality of sixth-a openings h6a, and the line opening TH1.

The second electrode part 2143ab of the first portion 2143a may be provided in direct contact with the upper surface of the first semiconductor layer 2111 through the plurality of second openings h2 in the region in which the first light emitting structure 2110 is provided.

The first electrode part 2143aa of the first portion 2143a may be provided in direct contact with the upper surface of the first semiconductor layer 2111 through the plurality of sixth-a openings h6a in the region in which the first light emitting structure 2110 is provided.

The first electrode part 2143aa of the first portion 2143a may be provided in direct contact with the upper surface of the first semiconductor layer 2111 through the line opening TH1 in the region in which the first light emitting structure 2110 is provided.

According to an embodiment, the second portion 2143b may comprise a third electrode part 2143ba and a fourth electrode part 2143bb.

The second portion 2143b may be electrically connected to the fourth semiconductor layer 2123 through the plurality of third openings h3 and the plurality of fifth-b openings h5b.

The fourth electrode part 2143bb of the second portion 2143b may be provided to contact the upper surface of the fourth semiconductor layer 2123 through the plurality of third openings h3 in the region in which the second light emitting structure 2120 is provided.

The fourth electrode part 2143bb of the second portion 2143b may be provided to directly contact the light transmissive electrode layer 2230 disposed under the plurality of third openings h3 in the region in which the second light emitting structure 2120 is provided. The fourth electrode part 2143bb of the second portion 2143b may be disposed to directly contact the upper surface of the light transmissive electrode layer 2230 exposed by the plurality of third openings h3 in the region in which the second light emitting structure 2120 is provided.

The third electrode part 2143ba of the second portion 2143b may be provided to directly contact the upper surface of the fourth semiconductor layer 2123 through the plurality of fifth-b openings h5b in the region in which the second light emitting structure 2120 is provided.

The third electrode part 2143ba of the second portion 2143b may be disposed to directly contact the light transmissive electrode layer 2230 disposed under the plurality of fifth-b openings h5b in the region in which the second light emitting structure 2120 is provided. The third electrode part 2143ba of the second portion 2143b may be disposed to directly contact the upper surface of the light transmissive electrode layer 2230 exposed by the plurality of fifth-b openings h5b in the region in which the second light emitting structure 2120 is provided.

According to an embodiment, the third portion 2143c of the connection electrode 2143 may be disposed on the boundary area between the first light emitting structure 2110 and the second light emitting structure 2120. The third portion 2143c of the connection electrode 2143 may be electrically connected to the first portion 2143a and the second portion 2143b.

According to the light emitting device of an embodiment, the first electrode 2141 may be electrically connected to the second semiconductor layer 2113. The second electrode 2142 may be electrically connected to the third semiconductor layer 2121. Also, the connection electrode 2143 may be electrically connected to the first semiconductor layer 2111 and the fourth semiconductor layer 2123.

Thus, according to an embodiment, as power is supplied to the first electrode 2141 and the second electrode 2142, it is possible that the first electrode 2141, the second semiconductor layer 2113, the first semiconductor layer 2111, the connection electrode 2143, the fourth semiconductor layer 2123, the third semiconductor layer 2121, and the second electrode 2142 may be electrically connected to each other in series.

According to an embodiment, an area on which the first electrode part 2143ab contacts the first semiconductor layer 2111 may be provided to be greater than that on which the third electrode part 2143ba contacts the fourth semiconductor layer 2123.

The area on which the first electrode part 2143*ab* contacts the first semiconductor layer 2111 may correspond to the sum of the area on which the first electrode part 2143*ab* directly contacts the upper surface of the first semiconductor layer 2111 through the plurality of sixth-a openings h6*a* and the area on which the first electrode part 2143*ab* directly contacts the upper surface of the first semiconductor layer 2111 through the line opening TH1 in the region in which the first light emitting structure 2110 is provided.

Also, the area on which the third electrode part 2143*ba* contacts the fourth semiconductor layer 2123 may correspond to the area on which the third electrode part 2143*ba* directly contacts the light transmissive electrode layer 2230 disposed under the plurality of fifth-b openings h5*b* in the region in which the first light emitting structure 2110 is provided. The area on which the third electrode part 2143*ba* contacts the fourth semiconductor layer 2123 may correspond to the area on which the third electrode part 2143*a* directly contacts the upper surface of the light transmissive electrode layer 2230 exposed by the plurality of fifth-b openings h5*b* in the region in which the first light emitting structure 2110 is provided.

For example, the area on which the first electrode part 2143*ab* contacts the first semiconductor layer 2111 may be provided to a size equal to or greater than 1.4% and equal to or smaller than 3.3% of a size of the lower surface of the substrate 2105. Also, the area on which the third electrode part 2143*ab* contacts the fourth semiconductor layer 2123 may be provided to a size equal to or greater than 0.7% and equal to or smaller than 3.0% of a size of the lower surface of the substrate 2105.

According to an embodiment, the area on which the first electrode part 2143*ab* contacts the first semiconductor layer 2111 may be provided to be greater 1.1 times to 2 times than that on which the third electrode part 2143*ba* contacts the fourth semiconductor layer 2123.

As described above, the area on which the first electrode part 2143*ab* contacts the first semiconductor layer 2111 may be provided to be greater than that on which the third electrode part 2143*ba* contacts the fourth semiconductor layer 2123, and thus, carriers may be smoothly spread, and an operation voltage may be prevented from increasing.

The first electrode 2141, the second electrode 2142, and the connection electrode 2143 may be provided in a single layer or a multilayer structure. For example, each of the first electrode 2141, the second electrode 2142, and the connection electrode 2143 may be an ohmic electrode. For example, each of the first electrode 2141, the second electrode 2142, and the connection electrode 2143 may be formed of at least one of ZnO, IrO$_x$, RuO$_x$, NiO, RuO$_x$/ITO, Ni/IrO$_x$/Au, Ni/IrO$_x$/Au/ITO, Ag, Ni, Cr, Ti, Al, Rh, Pd, Ir, Ru, Mg, Zn, Pt, Au, or Hf or an alloy of two or more materials thereof.

The light emitting device 2100 according to an embodiment may comprise a protective layer 2150, as illustrated in FIG. 12.

For clarity, in FIG. 11, the protective layer 2150 is not shown so that the arrangement relationship between the first electrode 2141, the second electrode 2142, the connection electrode 2143, and the reflective layer, which are disposed under the protective layer 2150 is well represented.

The protective layer 2150 may be disposed on the first electrode 2141, the second electrode 2142, and the connection electrode 2143.

The protective layer 2150 may be disposed on the reflective layer 2160. The protective layer 2150 may be disposed on the first reflective layer 2161, the second reflective layer 2162, and the third reflective layer 2163.

An arrangement position and shape of the protective layer 2150 will be further described with reference to the method of manufacturing the light emitting device according to an embodiment.

For example, the protective layer 2150 may be formed of an insulation material. For example, the protective layer 2150 may be formed of at least one material selected from the group including SixOy, SiO$_x$Ny, SixNy, and AlxOy.

As illustrated in FIG. 11, the light emitting device 2100 may comprise a first bonding part 2171 and a second bonding part 2172, which are disposed on the protective layer 2150.

The first bonding part 2171 may be disposed on the first reflective layer 2161. Also, the second bonding part 2172 may be disposed on the second reflective layer 2162. The second bonding part 2172 may be spaced apart from the first bonding part 2171.

The first bonding part 2171 may be disposed on the first electrode 2141. The first bonding part 2171 may be electrically connected to the first electrode 2141.

The first bonding part 2171 may be disposed on the first light emitting structure 2110. The first bonding part 2171 may be disposed on the second semiconductor layer 2113.

The first bonding part 2171 may be disposed on the connection electrode 2143. The first bonding part 2171 may be disposed on the first portion 2143*a* of the connection electrode 2143. The first bonding part 2171 may be disposed on the second electrode part 2143*ab* of the connection electrode 2143.

The second bonding part 2172 may be disposed on the second electrode 2142. The second bonding part 2172 may be electrically connected to the second electrode 2142.

The second bonding part 2172 may be disposed on the second light emitting structure 2120. The second bonding part 2172 may be disposed on the fourth semiconductor layer 2123.

The second bonding part 2172 may be disposed on the connection electrode 2143. The second bonding part 2172 may be disposed on the second portion 2143*b* of the connection electrode 2143. The second bonding part 2172 may be disposed on the fourth electrode part 2143*bb* of the connection electrode 2143.

According to an embodiment, as illustrated in FIG. 11, the connection electrode 2143 may comprise a first portion 2143*a* disposed on the first semiconductor layer 2111, a second portion 2143*b* disposed on the fourth semiconductor layer 2123, and a third portion 2143*c* connecting the first portion 2143*a* to the second portion 2143*a*.

The first portion 2143*a* of the connection electrode 2143 may comprise a first electrode part 2143*aa* that does not overlap the first bonding part 2171 and a second electrode part 2143*ab* that overlaps the first bonding part 2171 in the first direction perpendicular to the upper surface of the substrate 2105.

The second portion 2143*b* of the connection electrode 2143 may comprise a third electrode part 2143*ba* that does not overlap the second bonding part 2172 and a fourth electrode part 2143*bb* that overlaps the second bonding part 2172 in the first direction.

According to an embodiment, an area on which the first electrode part 2143*ab* contacts the first semiconductor layer 2111 may be provided to be greater than that on which the third electrode part 2143*ba* contacts the fourth semiconductor layer 2123.

For example, the area on which the first electrode part 2143*ab* contacts the first semiconductor layer 2111 may be provided to a size equal to or greater than 1.4% and equal to or smaller than 3.3% of a size of the lower surface of the substrate 2105. Also, the area on which the third electrode part 2143*ab* contacts the fourth semiconductor layer 2123 may be provided to a size equal to or greater than 0.7% and equal to or smaller than 3.0% of a size of the lower surface of the substrate 2105.

According to an embodiment, the area on which the first electrode part 2143*ab* contacts the first semiconductor layer 2111 may be provided to be greater 1.1 times to 2 times than that on which the third electrode part 2143*ba* contacts the fourth semiconductor layer 2123.

Since an area on which the first electrode part 2143*ab* contacts the first semiconductor layer 2111 is greater than that on which the third electrode part 2143*ba* contacts the fourth semiconductor layer 2123, it may be advantageous in terms of current spreading and current injection characteristics in the structure in which the first semiconductor layer 2111 and the fourth semiconductor layer 2123 are connected to each other in series.

Also, an area on which the first electrode part 2143*ab* contacts the first semiconductor layer 2111 may be provided to a size equal to or greater than 1.4% of a size of a lower surface of the substrate 2105 to efficiently perform the current spreading in the first semiconductor layer 2111. The area on which the first electrode part 2143*ab* contacts the first semiconductor layer 2111 may be provided to a size equal to or smaller than 3.3% of a size of the lower surface of the substrate 2105 to adjust an area of the first active layer 2112 to be etched by the first electrode part 2143*ab*, thereby improving the light extraction efficiency of the first light emitting structure 2110.

Also, an area on which the third electrode part 2143*ba* contacts the fourth semiconductor layer 2111 may be provided to a size equal to or greater than 0.7% of a size of the lower surface of the substrate 2105 to efficiently perform the current spreading in the fourth semiconductor layer 2123. The area on which the third electrode part 2143*ba* contacts the fourth semiconductor layer 2123 may be provided to a size equal to or smaller than 3.0% of a size of the lower surface of the substrate 2105 to reduce an amount of light that is absorbed and lost by the third electrode part 2143*ba*, thereby improving the light extraction efficiency of the second light emitting structure 2120.

According to an embodiment, as power is applied to the first bonding part 2171 and the second bonding part 2172, the first and second light emitting structures 2110 and 2120 may emit light.

As the power is supplied to the first bonding part 2171 and second bonding part 2172, it is possible that the first bonding part 2171, the first electrode 2141, the second semiconductor layer 2113, the first semiconductor layer 2111, the connection electrode 2143, the fourth semiconductor layer 2123, the third semiconductor layer 2121, the second electrode 2142, and the second bonding part 2172 may be electrically connected to each other in series.

According to an embodiment, a high voltage may be applied between the first bonding part 2171 and the second bonding part 2172, and the applied high voltage may be dispersed and supplied to the first and second light emitting structures 2110 and 2120 through the first electrode 2141, the connection electrode 2143, and the second electrode 2142.

As described above, according to the light emitting device 2100 of an embodiment, the first bonding part 2171 and the first electrode 2141 may contact each other in a plurality of areas. Also, the second bonding part 2172 and the second electrode 2142 may contact each other on a plurality of areas. Thus, according to an embodiment, since the power is supplied through the plurality of areas, there is an advantage that the current dispersion effect is generated, and the operation voltage is reduced by the increase in contact area and the dispersion of the contact area.

Also, when the power is applied to the first bonding part 2171 and the second bonding part 2172, the area on which the first electrode part 2143*ab* contacts the first semiconductor layer 2111 may be provided to be greater than that on which the third electrode part 2143*ba* contacts the fourth semiconductor layer 2123, and thus, carriers may be smoothly spread, and an operation voltage may be prevented from increasing.

The light emitting device according to an embodiment may be connected to an external power in a flip chip bonding manner. For example, in the manufacturing of the light emitting device package, the upper surface of the first bonding part 2171 and the upper surface of the second bonding part 2172 may be disposed to be attached to a submount, a lead frame, a circuit board, or the like.

When the light emitting device according to an embodiment is mounted in the flip chip bonding manner to implement the light emitting device package, light provided from the first and second light emitting structures 2110 and 2120 may be emitted through the substrate 2105. The light emitted from the first and second light emitting structures 2110 and 2120 may be reflected by the first to third reflective layers 2161, 2162 and 2163 so as to be emitted toward the substrate 2105.

Also, according to the light emitting device and the light emitting device package of an embodiment, since the first bonding part 2171 and the second bonding part 2172, each of which has a large area, may be directly bonded to the circuit board providing the power to easily and stably perform a flip chip bonding process.

According to an embodiment, a size of the first reflective layer 2161 may be provided to several micrometers larger than that of the first bonding part 2171. For example, an area of the first reflective layer 2161 may be provided to a size that is sufficient to completely cover the area of the first bonding part 2171. In consideration of a process error, a length of one side of the first reflective layer 2161 may be greater, for example, about 4 micrometers to about 10 micrometers than that of one side of the first bonding part 2171.

Also, the size of the second reflective layer 2162 may be provided to be several micrometers greater than that of the second bonding part 2172. For example, an area of the second reflective layer 2162 may be provided to a size that is sufficient to completely cover the area of the second bonding part 2172. In consideration of a process error, a length of one side of the second reflective layer 2162 may be greater, for example, about 4 micrometers to about 10 micrometers than that of one side of the second bonding part 2172.

According to an embodiments, light emitted from the first and second light emitting structures 2110 and 2120 may not be incident into the first bonding part 2171 and the second bonding part 2172 but be reflected by the first bonding part 2171 and the second bonding part 2172. Accordingly, according to an embodiment, a loss of the light generated in and emitted from the first and second light emitting structures 2110 and 2120 because the light is incident into the first bonding part 2171 and the second bonding part 2172 may be minimized.

Also, according to the light emitting device 2100 according to an embodiment, since the third reflective layer 2163 is disposed between the first bonding part 2171 and the second bonding part 2172, emission of light between the first bonding part 2171 and the second bonding part 2172 may be minimized.

Also, a minimum distance between the first bonding part 2171 and the second bonding part 2172 may be provided to be equal to or greater than 125 micrometers. The minimum distance between the first bonding part 2171 and the second bonding part 2172 may be selected in consideration of an interval between a first electrode pad and a second electrode pad of the package body, on which the light emitting device 2100 is mounted.

For example, a minimum distance between the first electrode pad and the second electrode pad of the package body may be provided to minimum 125 micrometers and may be provided to maximum 200 micrometers. Here, when considering the process error, the distance between the first bonding part 2171 and the second bonding part 2172 may be, for example, 125 micrometers or more and 300 micrometers or less.

Also, the distance between the first bonding part 2171 and the second bonding part 2172 has to be greater than 125 micrometers so that a minimum space is secured to prevent the short circuit between the first bonding part 2171 and the second bonding part 2172 of the light emitting device from occurring, and the light emitting area for improving the light extraction efficiency is secured to increase in light intensity Po of the light emitting device 2100.

Also, the distance between the first bonding part 2171 and the second bonding part 2172 has to be equal to or smaller than 300 micrometers so that the first and second electrode pads of the light emitting device package and the first and second bonding parts 2171 and 2172 of the light emitting device are bonded to each other with sufficient bonding force, and the electrical characteristics of the light emitting device 2100 is secured.

The minimum distance between the first bonding part 2171 and the second bonding part 2172 may be greater than 125 micrometers to secure optical characteristics and also less than 300 micrometers to secure the electrical characteristics and reliability by the bonding force.

In an embodiment, for example, the distance between the first bonding part 2171 and the second bonding part 2172 is provided to 125 micrometers or more and 300 micrometers or less. However, this embodiment is not limited thereto, and the distance between the first bonding part 2171 and the second bonding part 2172 may be less than 125 micrometers to improve the electrical characteristics or the reliability of the light emitting device package and may be greater than 300 micrometers to improve the optical properties.

Also, according to the light emitting device 2100 according to an embodiment, the first reflective layer 2161 is disposed under the first electrode 2141, and the second reflective layer 2162 is disposed under the second electrode 2142. Thus, the first reflective layer 2161 and the second reflective layer 2162 reflect light emitted from the first and second active layers 2112 and 2122 of the first and second light emitting structures 2110 and 2120 to minimize the light absorption of the first electrode 2141 and the second electrode 2142, thereby improving the light intensity Po.

For example, each of the first reflective layer 2161 and the second reflective layer 2162 may be formed of an insulation material, and may be formed of a high reflectance material, for example, have a DBR structure to reflect the light emitted from the active layer.

Each of the first reflective layer 2161 and the second reflective layer 2162 may have the DBR structure in which materials having different refractive indexes are repeatedly arranged with each other. For example, each of the first reflective layer 2161 and the second reflective layer 2162 may be disposed in a single layer or laminated structure that is formed of at least one or more of $TiO_2$, $SiO_2$, $Ta_2O_5$, and $HfO_2$.

Also, according to another embodiment, the present invention is not limited thereto. For example, the first reflective layer 2161 and the second reflective layer 2162 may be freely selected so that the reflectivity with respect to the light emitted from the first and second active layers 2112 and 2122 is adjusted according to wavelengths of the light emitted from the first and second active layers 2112 and 2122.

Also, according to another embodiment, each of the first reflective layer 2161 and the second reflective layer 2162 may be provided as an ODR layer. According to another embodiment, the first reflective layer 2161 and the second reflective layer 2162 may be provided in a hybrid form in which the DBR layer and the ODR layer are laminated.

For example, each of the first bonding part 2171 and the second bonding part 2172 may be formed of Au, AuTi, or the like to stably drive the mounting process. Also, each of the first bonding part 2171 and the second bonding part 2172 may be provided as a single layer or a multilayer by using one or more materials selected from the group including Ti, Al, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, and Ni/$IrO_x$/Au/ITO, or an alloy thereof.

As described above, the light emitting device 2100 according to an embodiment may be mounted in the flip chip bonding manner and provided in the form of the light emitting device package. Here, when the package body on which the light emitting device 2100 is mounted is formed of a resin, the package body may be discolored or cracked by strong light having a short wavelength, which is emitted from the light emitting device 2100 in a region under the light emitting device 2100.

However, according to the light emitting device 2100 of an embodiment, the emission of the light between the regions in which the first bonding part 2171 and the second bonding part 2172 are disposed may be reduced to prevent the package body disposed in a region under the light emitting device 2100 from being discolored or cracked.

Next, a method of manufacturing a light emitting device according to an embodiment will be described with reference to the accompanying drawings. In the description of the method of manufacturing the light emitting device according to an embodiment, descriptions overlapping with those described with reference to FIGS. 11 and 12 may be omitted.

Figure 13A:
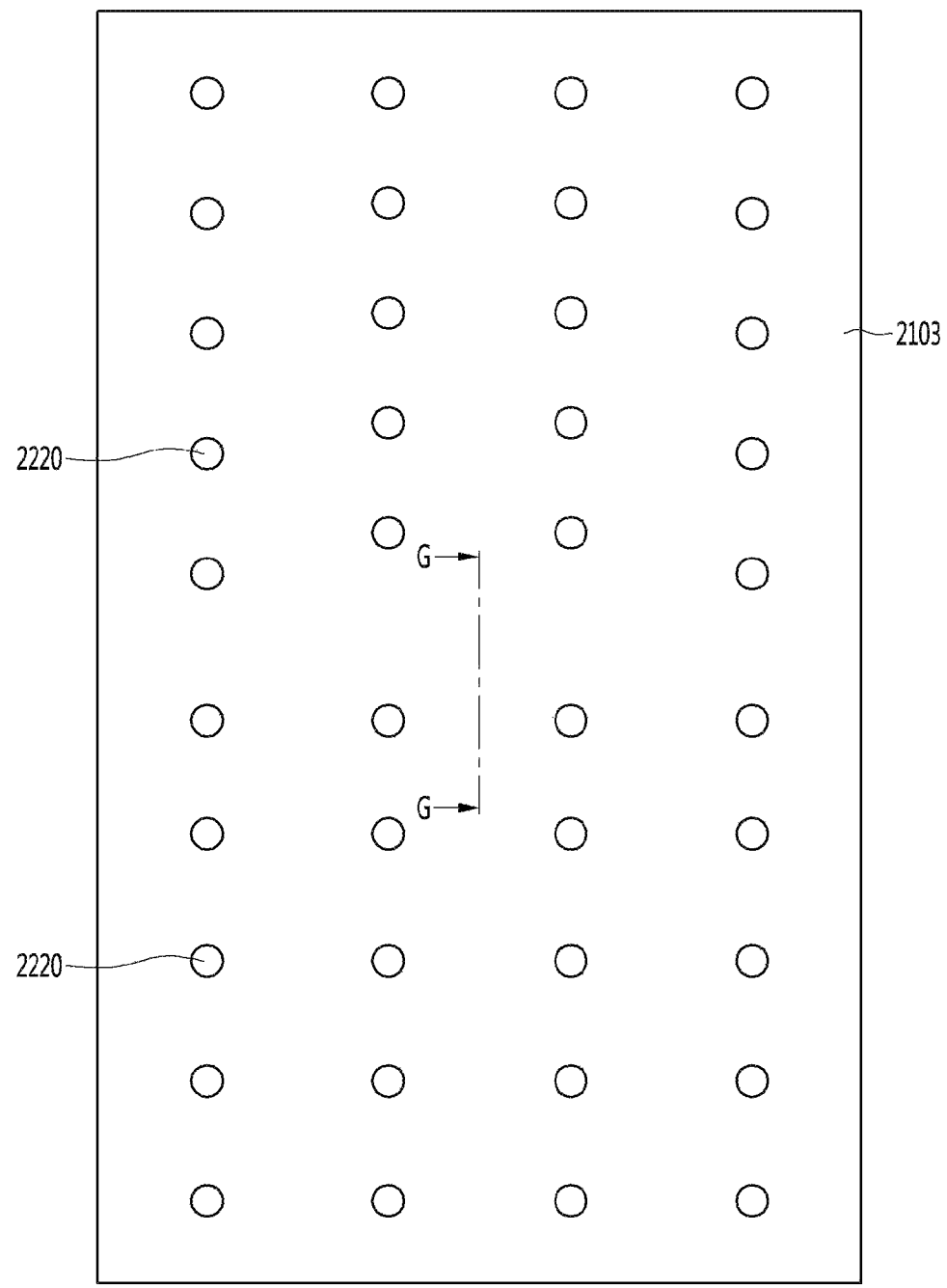
FIGS. 13a and 13b are views explaining a process of forming a semiconductor layer by a method of manufacturing a light emitting device according to an embodiment of the present invention.
Figure 13B:
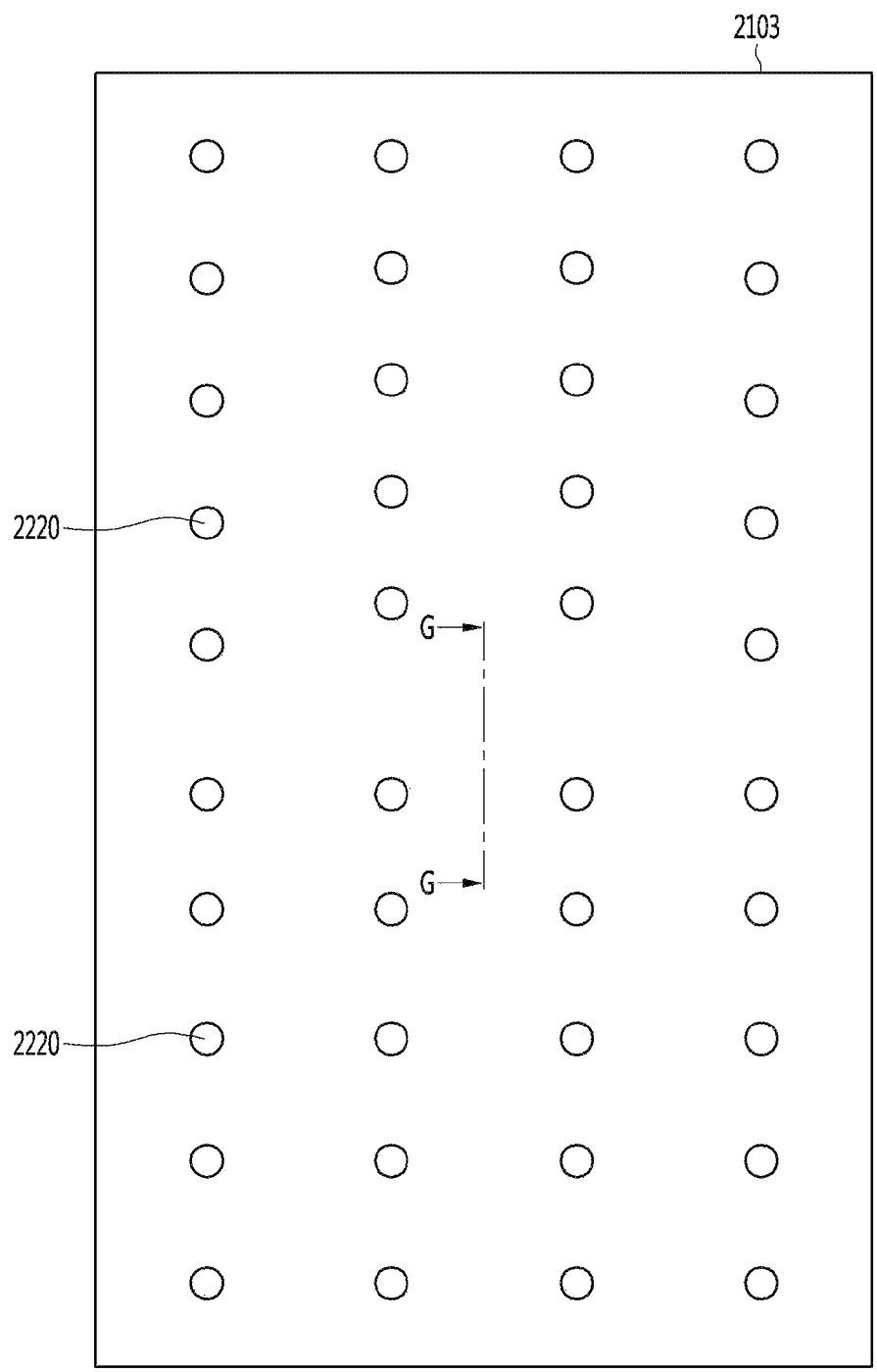

First, according to the method of manufacturing the light emitting device according to an embodiment, as illustrated in FIGS. 13a and 13b, a light emitting structure may be formed on a substrate 2105.

FIG. 13a is a plan view illustrating a configuration of the light emitting structure formed according to the method of manufacturing the light emitting device of an embodiment, and FIG. 13b is a plan view illustrating a result obtained by performing a unit process illustrated in FIG. 13a.

According to an embodiment, the light emitting structure may be formed on the substrate 2105. For example, a first conductivity type semiconductor layer, an active layer, and a second conductivity type semiconductor layer may be formed on the substrate 2105.

Also, according to an embodiment, a current spreading layer 2220 may be formed on the light emitting structure. The current spreading layer 2220 may be formed on the second conductivity type semiconductor layer. The current spreading layer 2220 may be provided in plurality that are spaced apart from each other.

For example, the current spreading layer 2220 may be formed of an oxide or nitride.

Figure 14A:
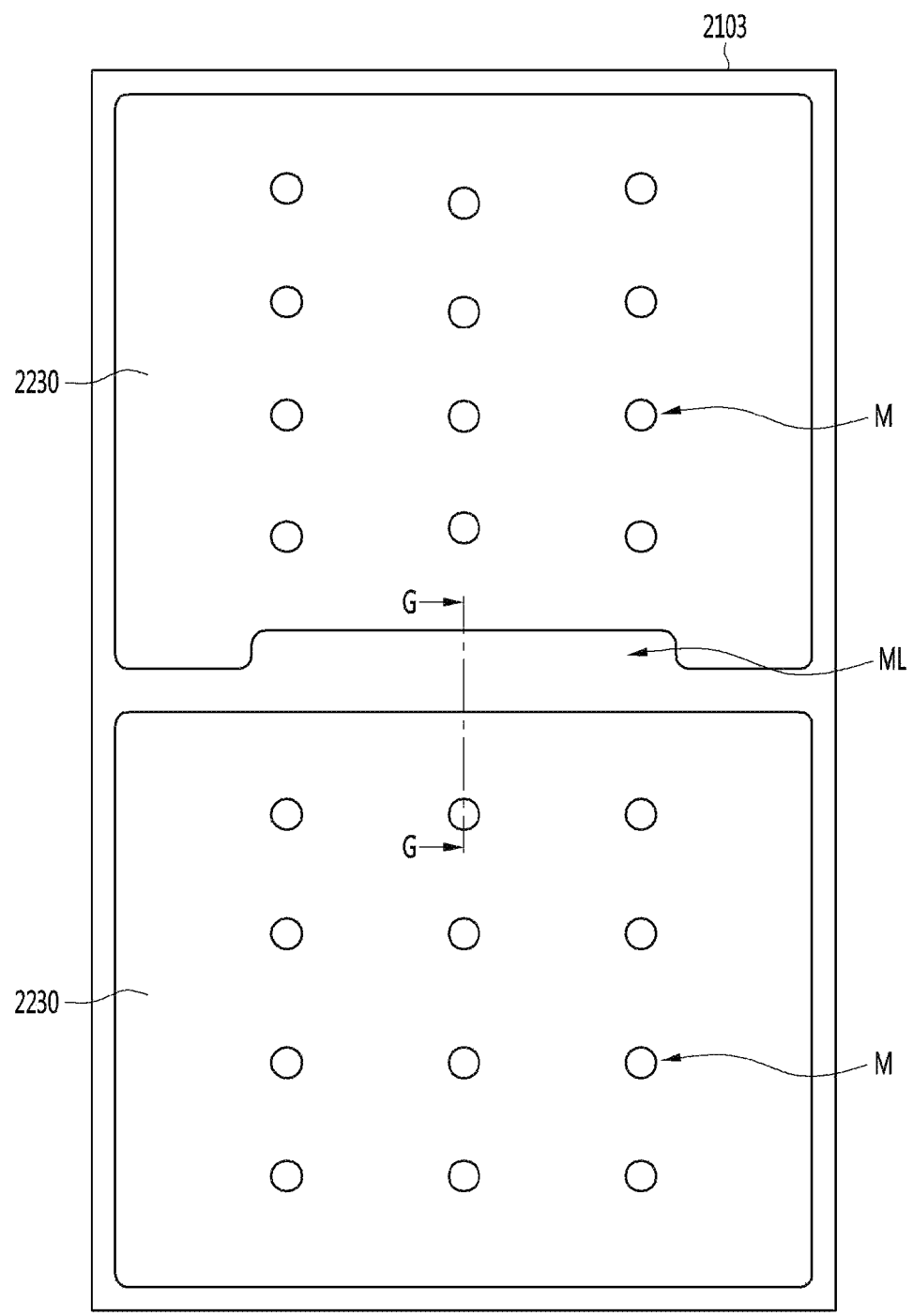
FIGS. 14a and 14b are views explaining a process of forming a light transmissive electrode layer by the method of manufacturing the light emitting device according to an embodiment of the present invention.
Figure 14B:
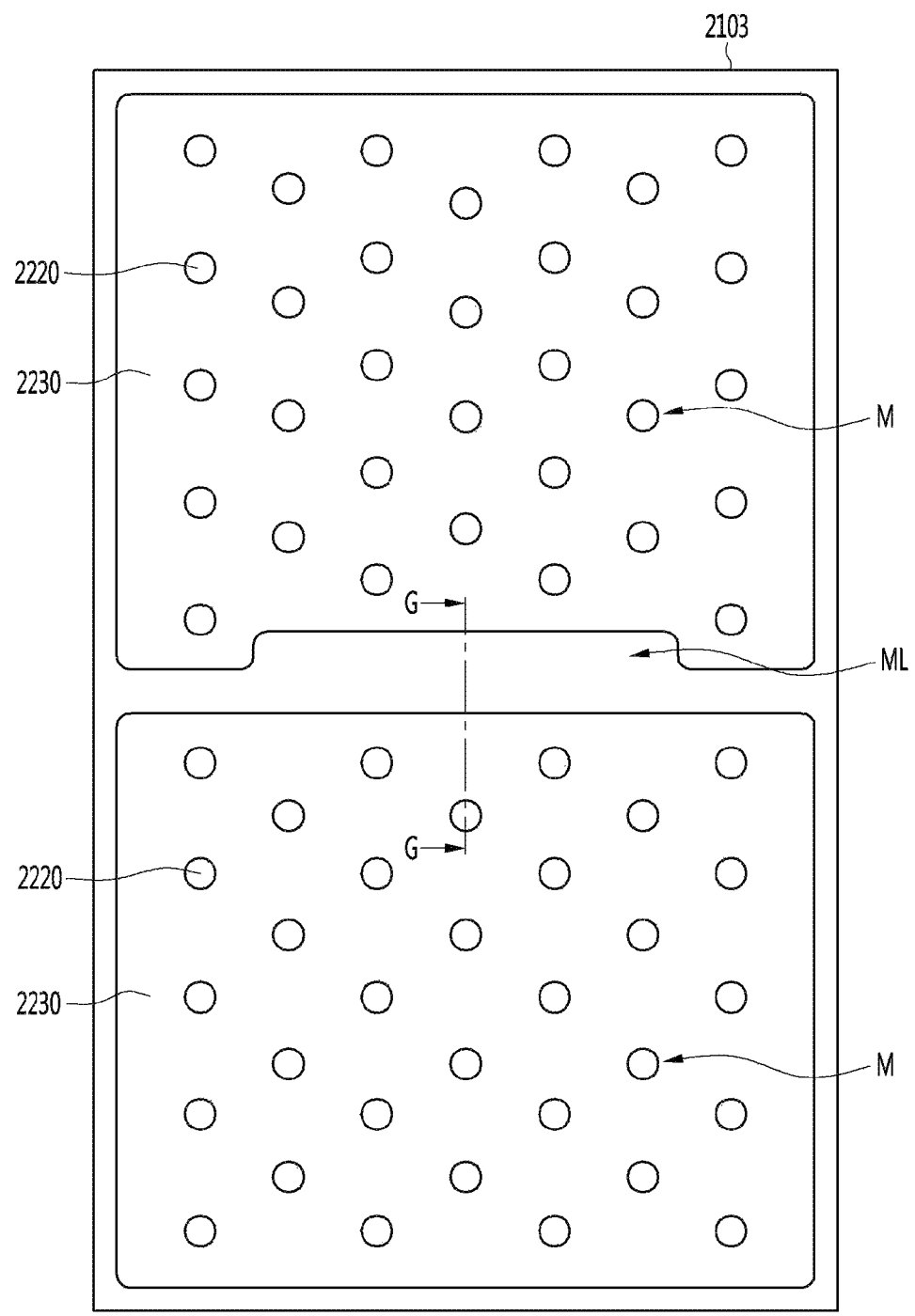

Next, as illustrated in FIGS. 14*a* and 14*b*, a light transmissive electrode layer 2230 may be formed.

FIG. 14*a* is a plan view illustrating a configuration of the light transmissive electrode layer formed according to the method of manufacturing the light emitting device of an embodiment, and FIG. 14*b* is a plan view illustrating a result obtained by performing a unit process illustrated in FIG. 14*a*.

According to an embodiment, the transmissive electrode layer 2230 may be formed on the light emitting structure, and then, mesa etching may be performed. The transmissive electrode layer 2230 may be formed on the second conductivity type semiconductor layer 103, and the mesa etching process exposing the first conductivity type semiconductor layer may be performed.

According to an embodiment, a portion of the first conductivity type semiconductor layer may be exposed through the mesa etching process. Thus, a plurality of mesa recesses M through which a portion of the first conductivity type semiconductor layer is exposed may be formed by the mesa etching process. Also, a mesa recess line ML may be formed by the mesa etching process to divide the light emitting structure into a first light emitting structure 2110 and a second light emitting structure 2120.

The first light emitting structure 2110 may comprise a first conductivity type first semiconductor layer 2111, a first active layer 2112, and a second conductivity type second semiconductor layer 2113. In addition, the second light emitting structure 2120 may comprise a first conductivity type third semiconductor layer 2121, a second active layer 2122, and a second conductivity type fourth semiconductor layer 2123.

According to an embodiment, an upper surface of the first semiconductor layer 2111 or an upper surface of the third semiconductor layer 2121 may be exposed in areas of the plurality of mesa recesses M. Also, a boundary area between the first semiconductor layer 2111 and the third semiconductor layer 2121 may be exposed in an area of the mesa recess line ML.

For example, the mesa recesses M may be provided in a plurality of circular shapes. Each of the mesa recesses M may be provided in various shapes such as an oval or a polygon as well as the circular shape.

Also, the mesa recess line ML may be formed in a line shape having a predetermined width. For example, the mesa recess line ML may be formed to have different widths according to areas.

According to an embodiment, the transmissive electrode layer 2230 may be formed on the second conductivity type semiconductor layer. The light transmissive electrode layer 2230 may comprise a plurality of openings provided in regions corresponding to the mesa recesses M.

Also, the light transmissive electrode layer 2230 may comprise a line-shaped opening provided in a region corresponding to the mesa recess line ML.

Figure 15B:
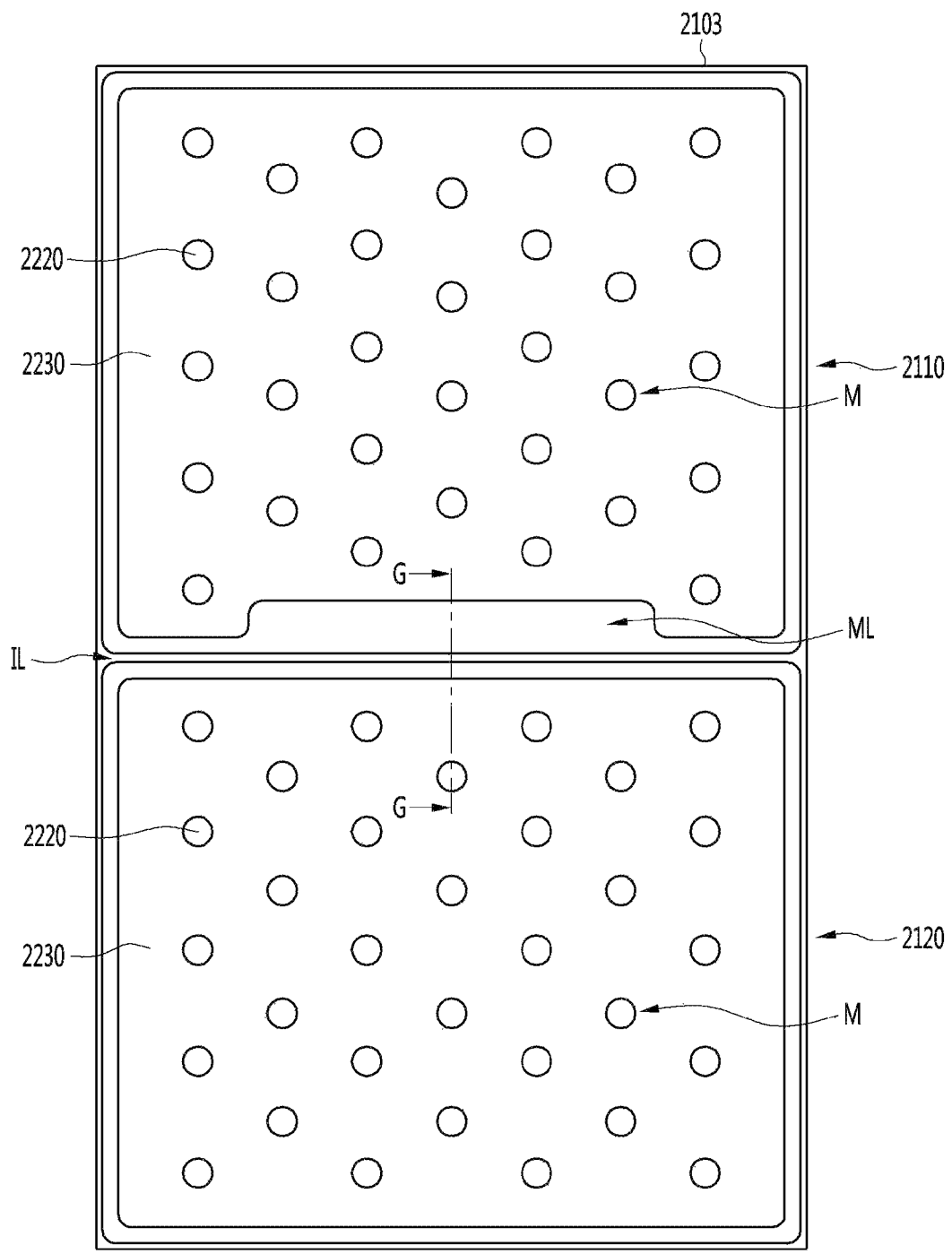

Next, as illustrated in FIGS. 15*a* and 15*b*, an isolation process may be performed.

FIG. 15*a* is a plan view illustrating a configuration of a mask for performing an isolation process according to the method of manufacturing the light emitting device of an embodiment, and FIG. 15*b* is a plan view illustrating a result obtained by performing a unit process illustrated in FIG. 15*a*.

According to an embodiment, the isolation process for separating the first light emitting structure 2110 and the second light emitting structure 2120 from each other may be performed.

An isolation line IL may be formed to separate the first light emitting structure 2110 and the second light emitting structure 2120 from each other by the isolation process. The upper surface of the substrate 2105 may be exposed in an area on which the isolation line IL is formed.

The first light emitting structure 2110 and the second light emitting structure 2120 may be electrically separated from each other. The first semiconductor layer 2111 and the third semiconductor layer 2121 may be provided to be separated from each other. The first semiconductor layer 2111 and the third semiconductor layer 2121 may be electrically separated from each other.

Figure 16A:
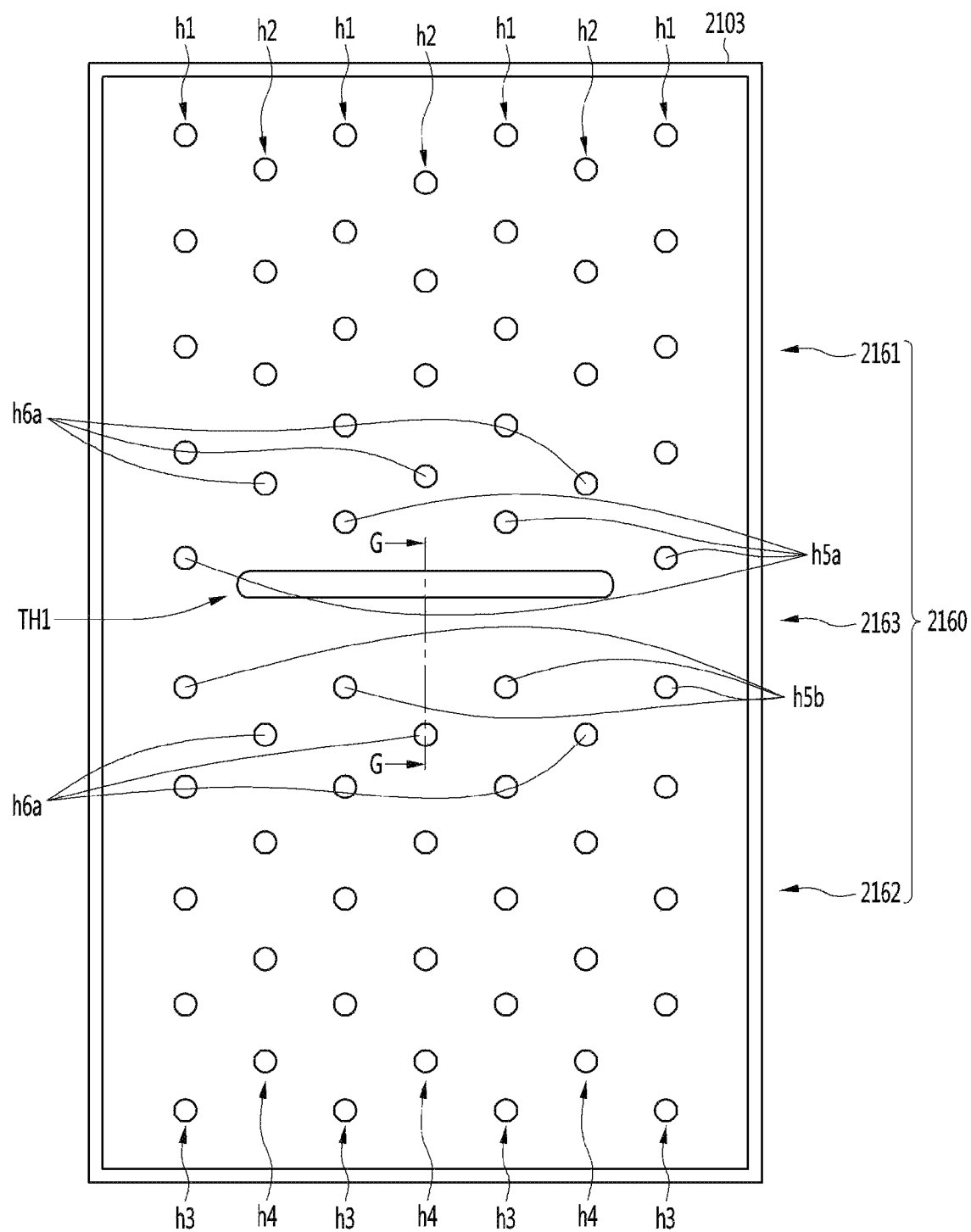
FIGS. 16a and 16b are views explaining a process of forming a reflective layer by the method of manufacturing the light emitting device according to an embodiment of the present invention.
Figure 16B:
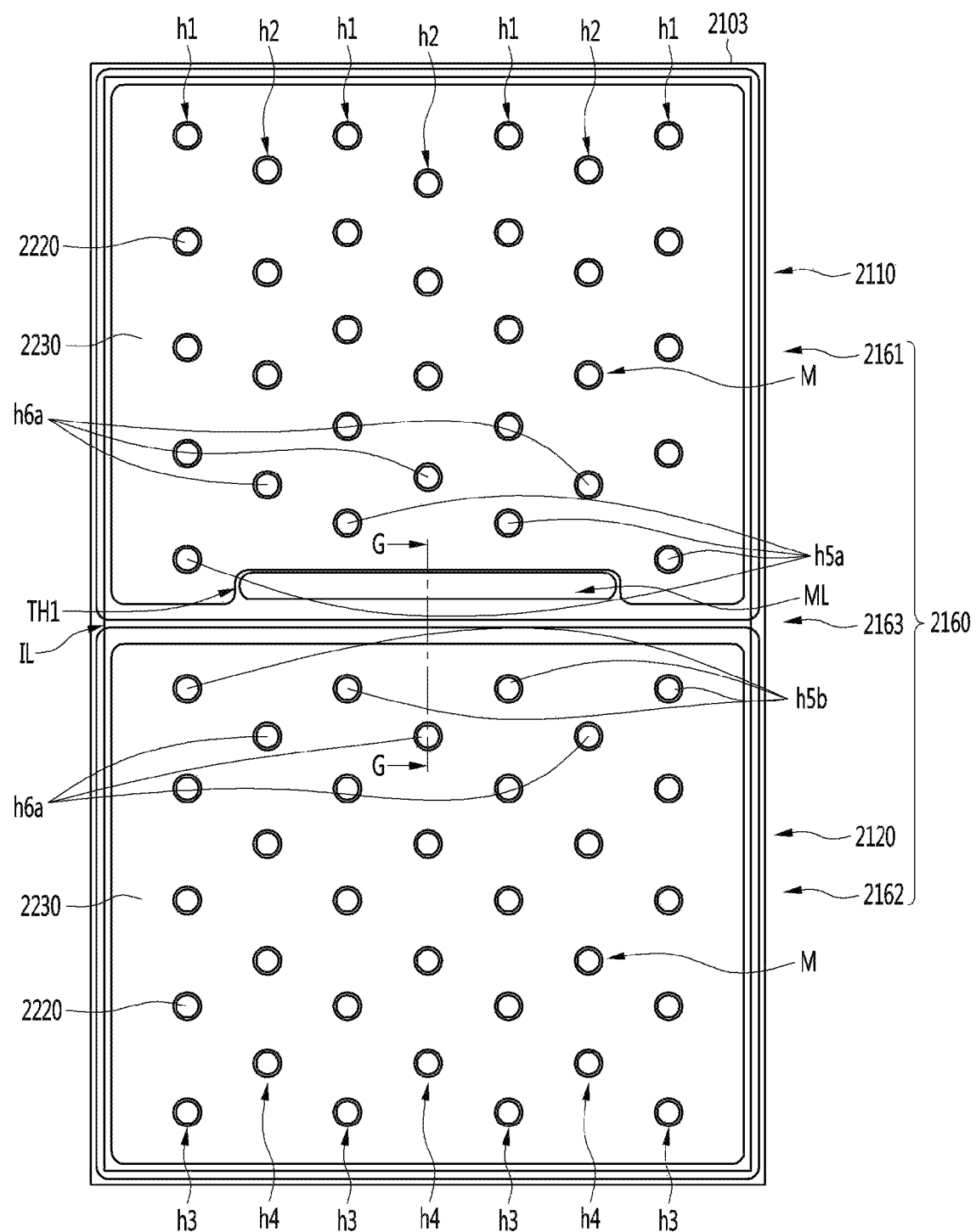

Next, as illustrated in FIGS. 16*a* and 16*b*, a reflective layer 2160 may be formed.

FIG. 16*a* is a plan view illustrating a configuration of the reflective layer formed according to the method of manufacturing the light emitting device of an embodiment, and FIG. 16*b* is a plan view illustrating a result obtained by performing a unit process illustrated in FIG. 16*a*.

The reflective layer 2160 may comprise a first reflective layer 2161, a second reflective layer 2162, and a third reflective layer 2163. The reflective layer 2160 may be disposed on the light transmissive electrode layer 2230. The reflective layer 2160 may be disposed on the first light emitting structure 2110 and the second light emitting structure 2120.

The first reflective layer 2161 and the second reflective layer 2162 may be spaced apart from each other. The third reflective layer 2163 may be disposed between the first reflective layer 2161 and the second reflective layer 2162. The first to third reflective layers 2161, 2162 and 2163 may be formed as one layer connected to each other.

The first reflective layer 2161 may comprise a plurality of openings. The first reflective layer 2161 may comprise a plurality of first openings h1 overlapping the current spreading layer 2220 in a first direction perpendicular to the upper surface of the substrate 2105. Also, the first reflective layer 2161 may comprise a plurality of second openings h2 overlapping the plurality of mesa recesses M in the first direction.

The light transmissive electrode layer 2230 disposed on the current spreading layer 2220 may be exposed through the plurality of first openings h1. An upper surface of the first semiconductor layer 2111 of the first light emitting structure 2110 may be exposed through the plurality of second openings h2.

For example, the plurality of first openings h1 may be arranged in a plurality of line shapes along a long axis direction of the substrate 2105. Also, the plurality of second openings h2 may be provided in a plurality of line shapes along the long axis direction of the substrate 2105. The plurality of first openings h1 and the plurality of second openings h2 may be alternatively arranged in a short axis direction of the substrate 2105.

The second reflective layer 2162 may comprise a plurality of openings. The second reflective layer 2162 may comprise a plurality of third openings h3 overlapping the current spreading layer 2220 in the first direction perpendicular to the upper surface of the substrate 2105. Also, the second reflective layer 2162 may comprise a plurality of fourth openings h4 overlapping the plurality of mesa recesses M in the first direction.

The light transmissive electrode layer 2230 disposed on the current spreading layer 2220 may be exposed through the plurality of third openings h3. An upper surface of the third semiconductor layer 2121 of the second light emitting structure 2120 may be exposed through the plurality of fourth openings h4.

For example, the plurality of third openings h3 may be provided in a plurality of line shapes along the long axis direction of the substrate 2105. Also, the plurality of fourth openings h4 may be arranged in a plurality of line shapes along the long axis direction of the substrate 2105. The plurality of third openings h3 and the plurality of fourth openings h4 may be alternatively arranged in the short axis direction of the substrate 2105.

The third reflective layer 2163 may comprise a plurality of openings. The third reflective layer 2163 may comprise a plurality of fifth openings h5 overlapping the current spreading layer 2220 in the first direction perpendicular to the upper surface of the substrate 2105.

The plurality of fifth openings h5 may comprise a plurality of fifth-a openings h5a exposing the transmissive electrode layer 2230 disposed on the current spreading layer 2220 in a region in which the first light emitting structure 2110 is provided. Also, the plurality of fifth openings h5 may expose a plurality of fifth-b openings h5b exposing the transmissive electrode layer 2230 disposed on the current spreading layer 2220 in a region in which the second light emitting structure 2120 is provided.

Also, the third reflective layer 2163 may comprise a plurality of sixth openings h6 overlapping the plurality of mesa recesses M in the first direction. Also, the third reflective layer 2163 may comprise a line opening TH1 overlapping the mesa recess line ML in the first direction.

The plurality of sixth openings h6 may comprise a plurality of sixth-a openings h6a exposing upper surfaces of the first semiconductor layer 2111 of the first light emitting structure 2110. Also, the sixth openings h6 may comprise a plurality of sixth-b openings h6b exposing upper surfaces of the third semiconductor layer 2121 of the second light emitting structure 2120. The line opening TH1 may expose a upper surface of the first semiconductor layer 2111 of the first light emitting structure 2110.

For example, the plurality of fifth openings h5 may be arranged in a plurality of line shapes along the short axis direction of the substrate 2105. Also, the plurality of sixth openings h6 may be provided in a plurality of line shapes along the short axis direction of the substrate 2105. The plurality of fifth openings h5 and the plurality of sixth openings h6 may be alternatively arranged in the long axis direction of the substrate 2105.

Also, the line opening TH1 may be provided in a line shape along the short axis direction of the substrate 2105. An area of the line opening TH1 may be larger than that of one opening constituting the plurality of fifth openings h5.

For example, an area of the line opening TH1 may be provided to be greater five times than that of one opening constituting the plurality of fifth openings h5. An area of the line opening TH1 may be provided to be greater 9 times than that of one opening constituting the plurality of fifth openings h5.

The effect of the size of the area of the line opening TH1 will be described later.

Figure 17A:
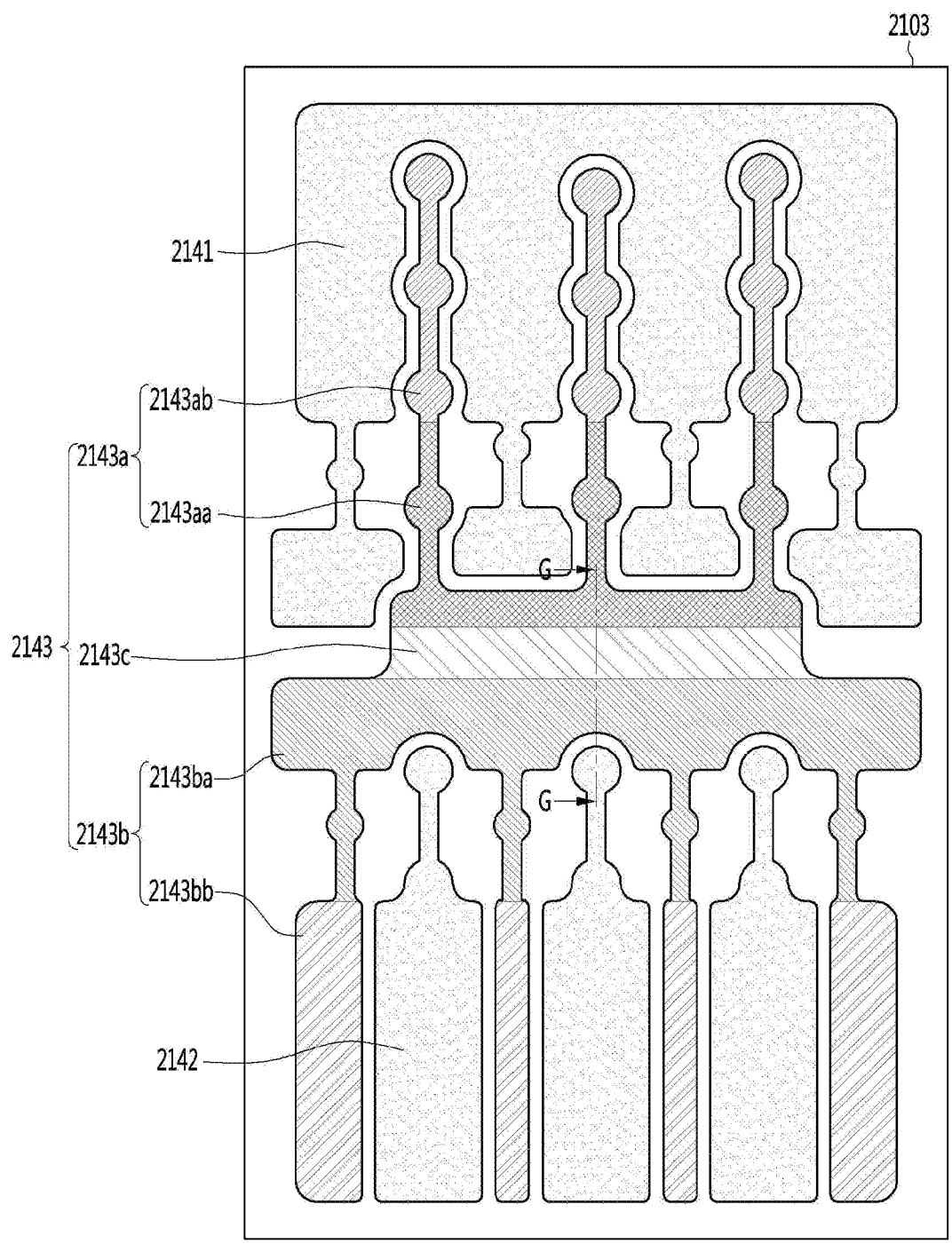
FIGS. 17a and 17b are views explaining a process of forming a first electrode, a second electrode, and a connection electrode by the method of manufacturing the light emitting device according to an embodiment of the present invention.
Figure 17B:
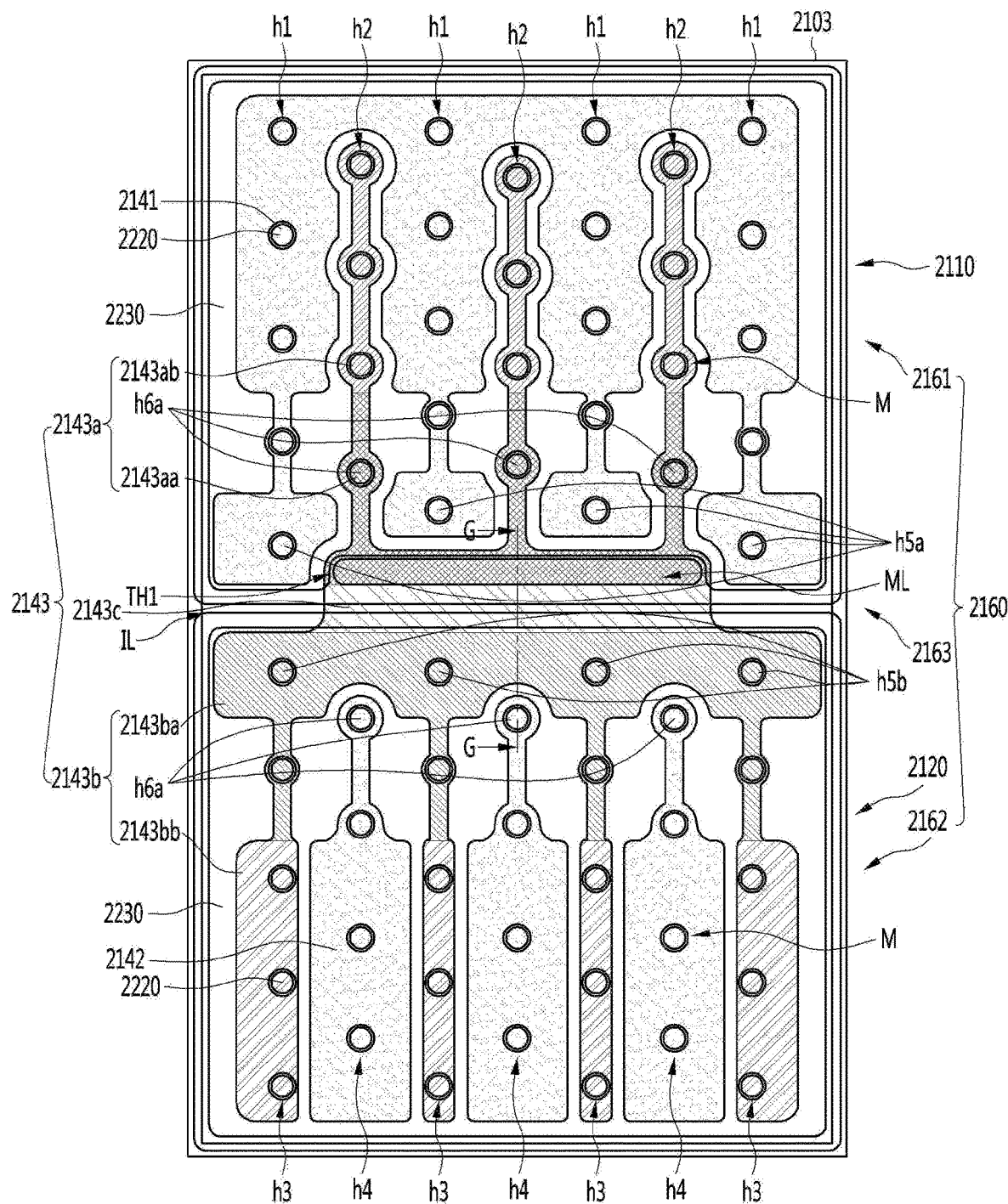

Subsequently, as illustrated in FIGS. 17a and 17b, a first electrode 2141, a second electrode 2142, and a connection electrode 2143 may be formed.

FIG. 17a is a plan view illustrating configurations of the first electrode, the second electrode, and the connection electrode, which are formed according to the method of manufacturing the light emitting device of an embodiment, and FIG. 17b is a plan view illustrating a result obtained by performing a unit process illustrated in FIG. 17a.

According to an embodiment, the first electrode 2141 and the second electrode 2142 may be spaced apart from each other. The connection electrode 2143 may be disposed between the first electrode 2141 and the second electrode 2142.

The first electrode 2141 may be disposed on the first reflective layer 2161. A partial portion of the first electrode 2141 may be disposed on the third reflective layer 2163.

The first electrode 2141 may be electrically connected to the second semiconductor layer 2113. The first electrode 2141 may be electrically connected to the second semiconductor layer 2113 through the plurality of first openings h1. The first electrode 2141 may be disposed to directly contact the light transmissive electrode layer 2230 disposed under the plurality of first openings h1 in a region in which the first light emitting structure 2110 is provided. The first electrode 2141 may be disposed to directly contact a upper surface of the light transmissive electrode layer 2230 exposed by the plurality of first openings h1 in the region in which the first light emitting structure 2110 is provided.

The second electrode 2142 may be disposed on the second reflective layer 2162. A partial portion of the second electrode 2142 may be disposed on the third reflective layer 2163.

The second electrode 2142 may be electrically connected to the third semiconductor layer 2121. The second electrode 2142 may be electrically connected to the third semiconductor layer 2121 through the plurality of fourth openings h4. The second electrode 2142 may be in direct contact with the third semiconductor layer 2121 disposed under the plurality of fourth openings h4 in a region in which the second light emitting structure 2120 is provided. The second electrode 2142 may be disposed in direct contact with an upper surface of the third semiconductor layer 2121 exposed by the plurality of fourth openings h4 in the region where the second light emitting structure 2120 is provided.

The connection electrode 2143 may be disposed on the third reflective layer 2163. A partial portion of the connection electrode 2143 may be disposed on the first reflective layer 2161. A partial portion of the connection electrode 2143 may be disposed on the second reflective layer 2162.

The connection electrode 2143 may be electrically connected to the first semiconductor layer 2111 and the fourth semiconductor layer 2123.

The connection electrode 2143 may comprise a first portion 2143a disposed on the first semiconductor layer 2111, a second portion 2143b disposed on the fourth semiconductor layer 2123, and a third portion 2143c connecting the first portion 2143a to the second portion 2143a.

The connection electrode 2143 may comprise the first portion 2143a disposed on the region in which the first light emitting structure 2110 is provided. The connection electrode 2143 may comprise a second portion 2143b disposed on the region in which the second light emitting structure 2120 is provided. The connection electrode 2143 may comprise the third portion 2143c having a portion disposed on an area on which the first light emitting structure 2110 is disposed and a portion disposed on an area on which the second light emitting structure 2120 is disposed. Also, a portion of the third portion 2143c may be disposed on a boundary area between the first light emitting structure 2110 and the second light emitting structure 2120.

According to an embodiment, the first portion 2143a may comprise a first electrode part 2143aa and a second electrode part 2143ab.

The first portion 2143a may be electrically connected to the first semiconductor layer 2111 through the plurality of second openings h2, the plurality of sixth-a openings h6a, and the line opening TH1.

The second electrode part 2143ab of the first portion 2143a may be provided in direct contact with the upper surface of the first semiconductor layer 2111 through the plurality of second openings h2 in the region in which the first light emitting structure 2110 is provided.

The first electrode part 2143aa of the first portion 2143a may be provided in direct contact with the upper surface of the first semiconductor layer 2111 through the plurality of sixth-a openings h6a in the region in which the first light emitting structure 2110 is provided.

The first electrode part 2143aa of the first portion 2143a may be provided in direct contact with the upper surface of the first semiconductor layer 2111 through the line opening TH1 in the region in which the first light emitting structure 2110 is provided.

According to an embodiment, the second portion 2143b may comprise a third electrode part 2143ba and a fourth electrode part 2143bb.

The second portion 2143b may be electrically connected to the fourth semiconductor layer 2123 through the plurality of third openings h3 and the plurality of fifth-b openings h5b.

The fourth electrode part 2143bb of the second portion 2143b may be provided to contact the upper surface of the fourth semiconductor layer 2123 through the plurality of third openings h3 in the region in which the second light emitting structure 2120 is provided.

The fourth electrode part 2143bb of the second portion 2143b may be provided to directly contact the light transmissive electrode layer 2230 disposed under the plurality of third openings h3 in the region in which the second light emitting structure 2120 is provided. The fourth electrode part 2143bb of the second portion 2143b may be disposed to directly contact the upper surface of the light transmissive electrode layer 2230 exposed by the plurality of third openings h3 in the region in which the second light emitting structure 2120 is provided.

The third electrode part 2143ba of the second portion 2143b may be provided to directly contact the upper surface of the fourth semiconductor layer 2123 through the plurality of fifth-b openings h5b in the region in which the second light emitting structure 2120 is provided.

The third electrode part 2143ba of the second portion 2143b may be disposed to directly contact the light transmissive electrode layer 2230 disposed under the plurality of fifth-b openings h5b in the region in which the second light emitting structure 2120 is provided. The third electrode part 2143ba of the second portion 2143b may be disposed to directly contact the upper surface of the light transmissive electrode layer 2230 exposed by the plurality of fifth-b openings h5b in the region in which the second light emitting structure 2120 is provided.

According to an embodiment, the third portion 2143c of the connection electrode 2143 may be disposed on the boundary area between the first light emitting structure 2110 and the second light emitting structure 2120. The third portion 2143c of the connection electrode 2143 may be electrically connected to the first portion 2143a and the second portion 2143b.

According to the light emitting device of an embodiment, the first electrode 2141 may be electrically connected to the second semiconductor layer 2113. The second electrode 2142 may be electrically connected to the third semiconductor layer 2121. Also, the connection electrode 2143 may be electrically connected to the first semiconductor layer 2111 and the fourth semiconductor layer 2123.

Thus, according to an embodiment, as power is supplied to the first electrode 2141 and the second electrode 2142, it is possible that the first electrode 2141, the second semiconductor layer 2113, the first semiconductor layer 2111, the connection electrode 2143, the fourth semiconductor layer 2123, the third semiconductor layer 2121, and the second electrode 2142 may be electrically connected to each other in series.

Figure 18A:
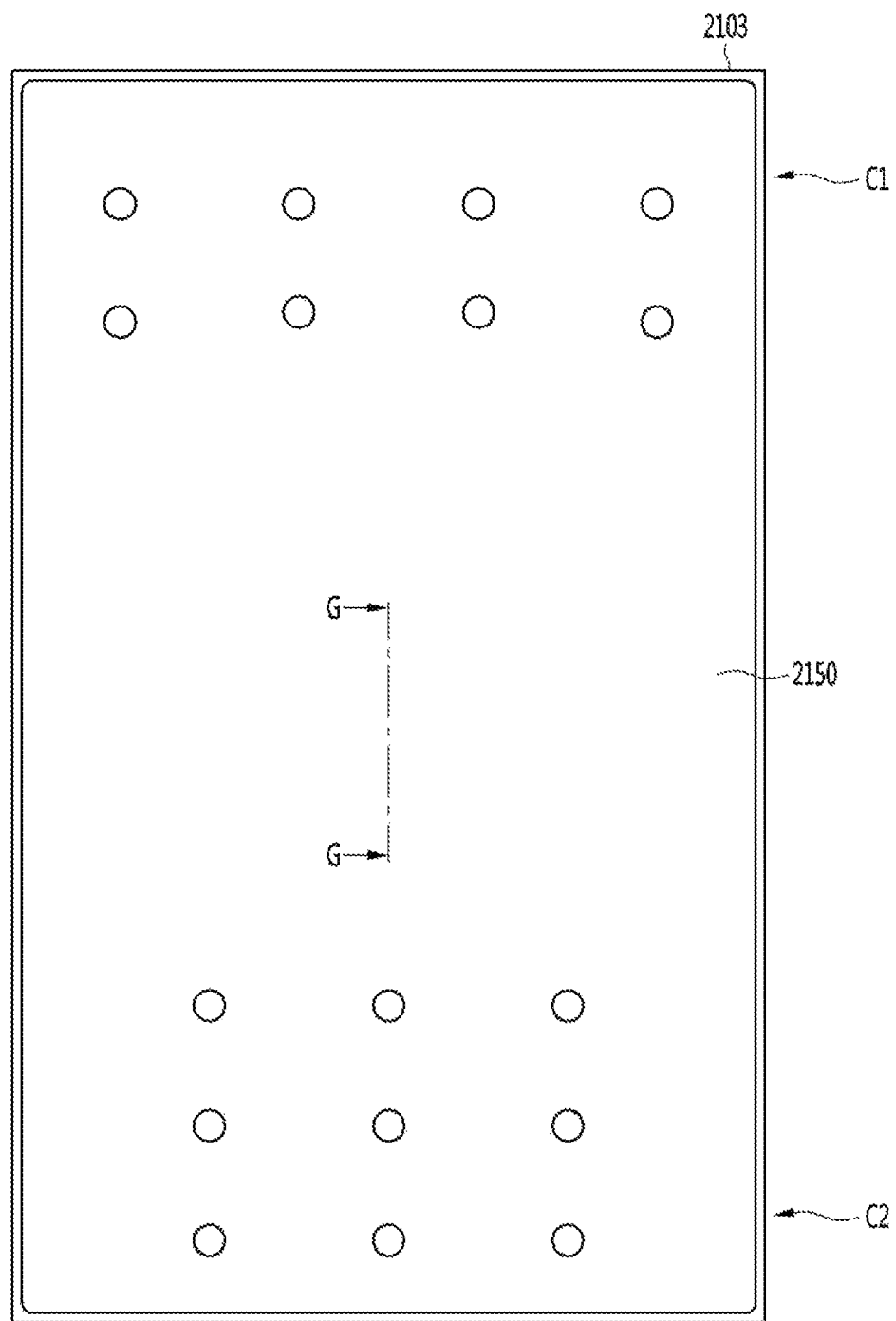
FIGS. 18a and 18b are views explaining a process of forming a protective layer by the method of manufacturing the light emitting device according to an embodiment of the present invention.
Figure 18B:
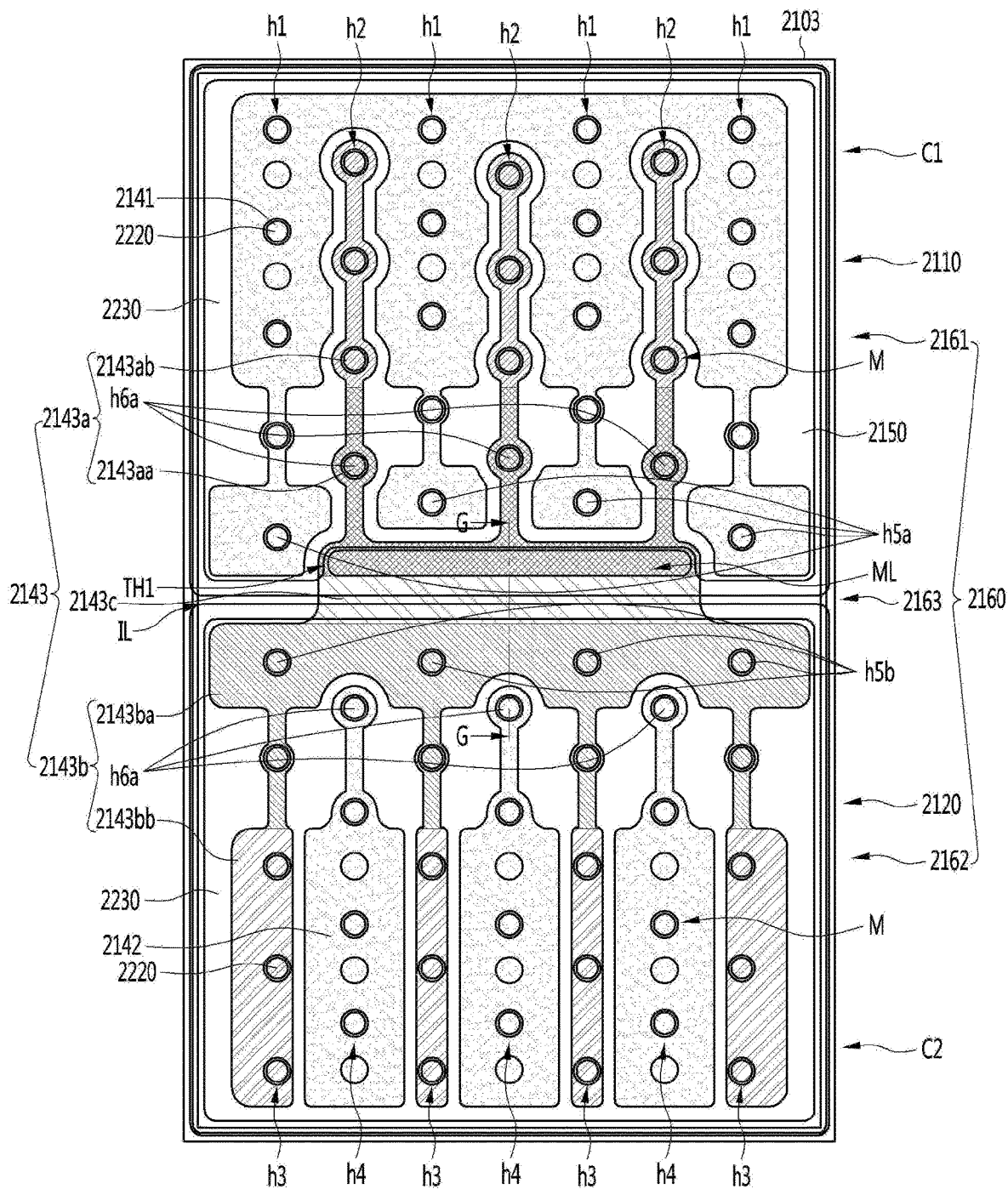

Next, as illustrated in FIGS. 18a and 18b, a protective layer 2150 may be formed.

FIG. 18a is a plan view illustrating a configuration of the protective layer formed according to the method of manufacturing the light emitting device of an embodiment, and FIG. 18b is a plan view illustrating a result obtained by performing a unit process illustrated in FIG. 18a.

The protective layer 2150 may be disposed on the first electrode 2141 and the second electrode 2142. The protective layer 2150 may be disposed on the connection electrode 2143. The protective layer 2150 may be disposed on the reflective layer 2160.

The protective layer 2150 may comprise a first contact portion c1 exposing an upper surface of the first electrode 2141. The protective layer 2150 may comprise a plurality of first contact portions c1 exposing the upper surface of the first electrode 2141. The plurality of first contact portions c1 may be provided on an area on which the first reflective layer 2161 is disposed.

The protective layer 2150 may comprise a second contact portion c2 exposing an upper surface of the second electrode 2142. The protective layer 2150 may comprise a plurality of second contact portions c2 exposing a plurality of upper surfaces of the second electrode 2142. The second contact portion c2 may be provided on an area on which the second reflective layer 2162 is disposed.

Figure 19A:
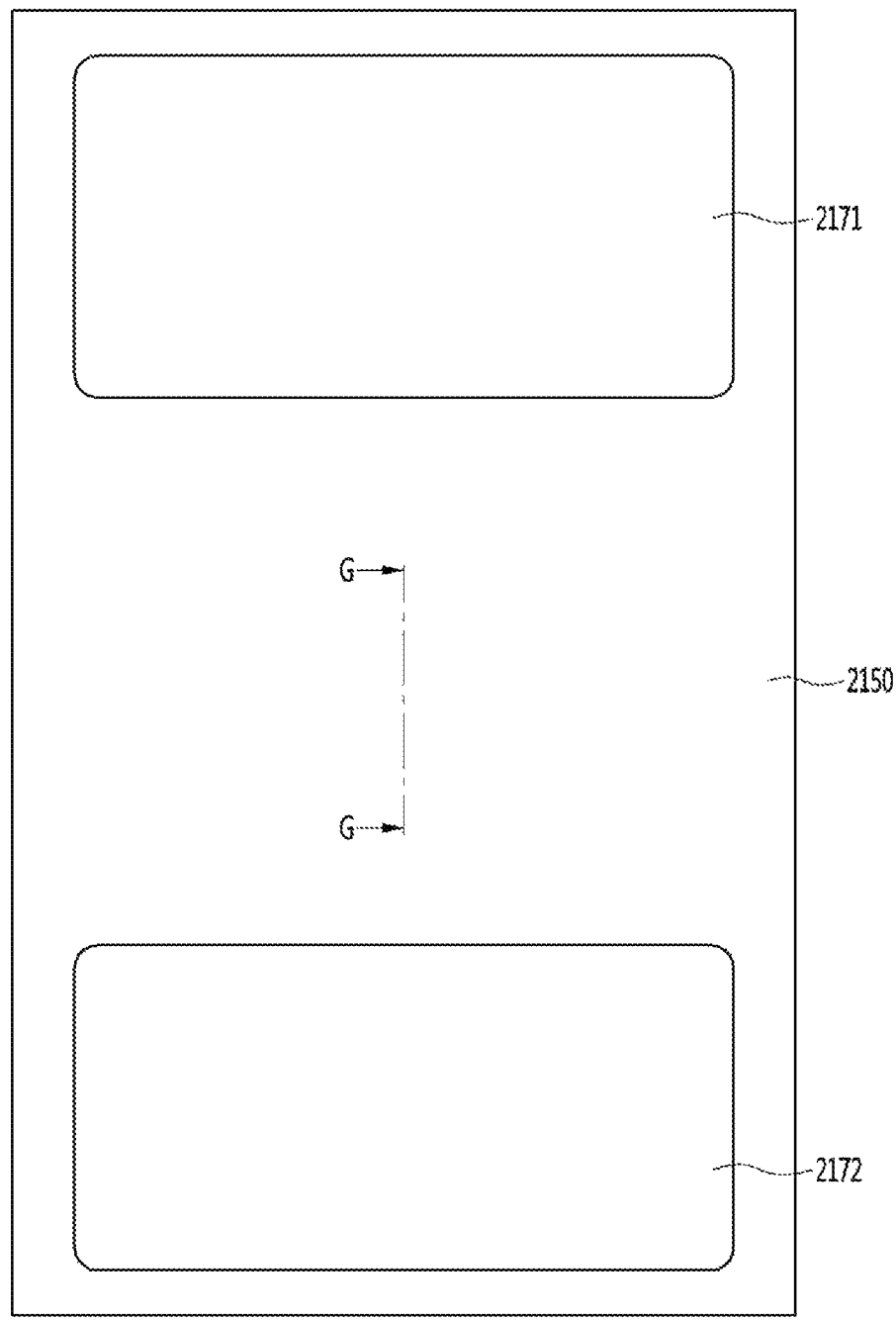
FIGS. 19a and 19b are views explaining a process of forming a first bonding pad and a second bonding pad by the method of manufacturing the light emitting device according to an embodiment of the present invention.
Figure 19B:
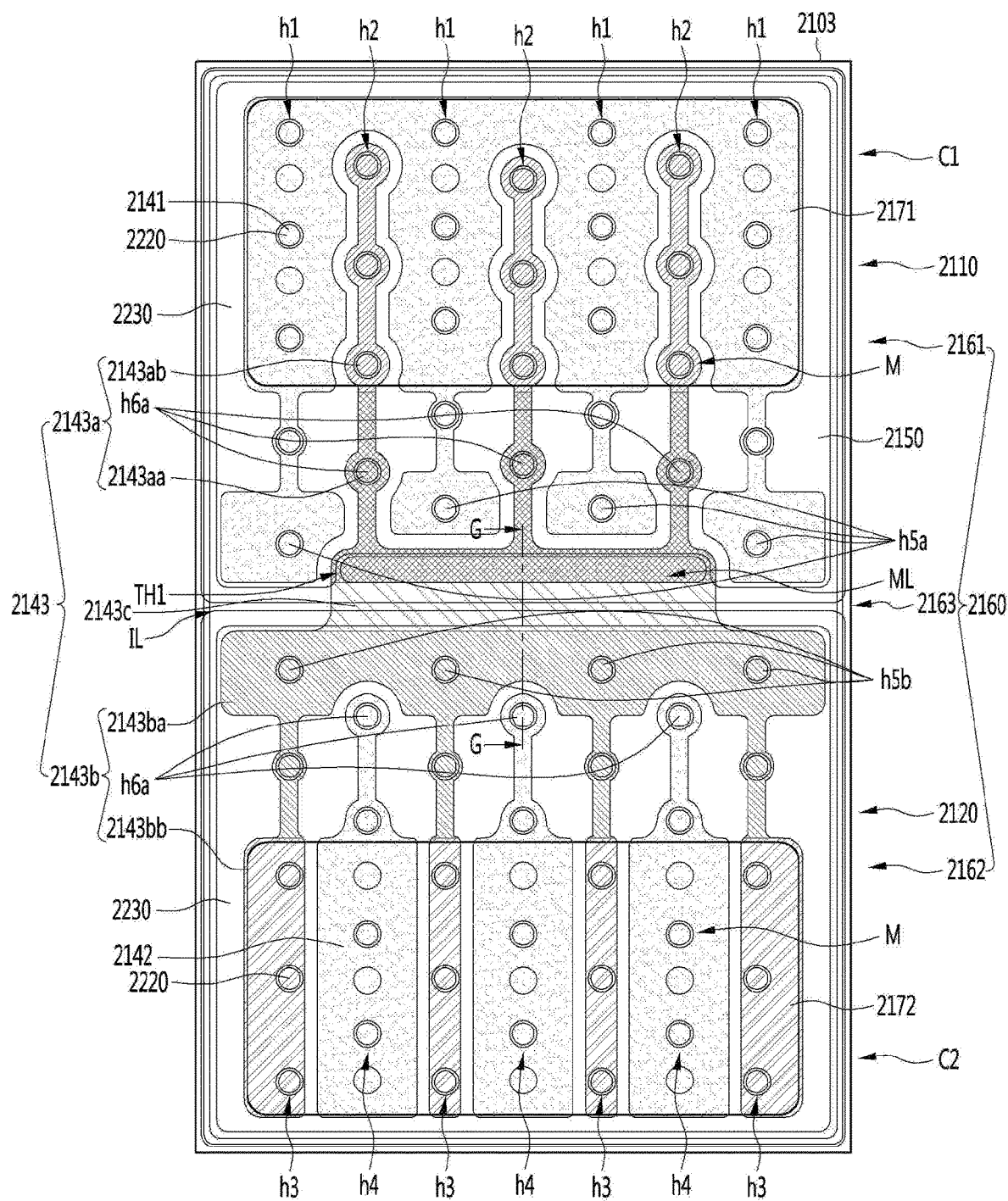

Subsequently, as illustrated in FIGS. 19a and 19b, a first bonding part 2171 and a second bonding part 2172 may be formed.

FIG. 19a is a plan view illustrating configurations of the first and second bonding parts formed according to the method of manufacturing the light emitting device of an embodiment, and FIG. 19b is a plan view illustrating a result obtained by performing a unit process illustrated in FIG. 19a.

According to an embodiment, each of the first bonding part 2171 and the second bonding part 2172 may be formed in the shape illustrated in FIG. 19a. The first bonding part 2171 and the second bonding part 2172 may be disposed on the protective layer 2150.

The first bonding part 2171 may be disposed on the first reflective layer 2161. The second bonding part 2172 may be disposed on the second reflective layer 2162. The second bonding part 2172 may be spaced apart from the first bonding part 2171.

The first bonding part 2171 may be disposed on the first electrode 2141. The first bonding part 2171 may be electrically connected to the first electrode 2141.

The first bonding part 2171 may be electrically connected to the first electrode 2141 through the first contact portion c1 provided in the protective layer 2150. The first bonding part 2171 may be disposed to directly contact an upper surface of the first electrode 2141 through the first contact portion c1 provided in the protective layer 2150.

The first bonding part 2171 may be disposed on the first light emitting structure 2110. The first bonding part 2171 may be disposed on the second semiconductor layer 2113.

The first bonding part 2171 may be disposed on the connection electrode 2143. The first bonding part 2171 may be disposed on the first portion 2143a of the connection electrode 2143. The first bonding part 2171 may be disposed on the second electrode part 2143ab of the connection electrode 2143.

The second bonding part 2172 may be disposed on the second electrode 2142. The second bonding part 2172 may be electrically connected to the second electrode 2142.

The second bonding part 2172 may be disposed on the second light emitting structure 2120. The second bonding part 2172 may be disposed on the fourth semiconductor layer 2123.

The second bonding part 2172 may be electrically connected to the second electrode 2142 through the second contact portion c2 provided in the protective layer 2150. The second bonding part 2172 may be disposed to directly contact an upper surface of the second electrode 2142 through the second contact portion c2 provided in the protective layer 2150.

The second bonding part 2172 may be disposed on the connection electrode 2143. The second bonding part 2172 may be disposed on the second portion 2143b of the connection electrode 2143. The second bonding part 2172 may be disposed on the fourth electrode part 2143bb of the connection electrode 2143.

According to an embodiment, the connection electrode 2143 may comprise a first portion 2143a disposed on the first semiconductor layer 2111, a second portion 2143b disposed on the fourth semiconductor layer 2123, and a third portion 2143c connecting the first portion 2143a to the second portion 2143a.

The first portion 2143a of the connection electrode 2143 may comprise a first electrode part 2143aa that does not overlap the first bonding part 2171 and a second electrode part 2143ab that overlaps the first bonding part 2171 in the first direction perpendicular to the upper surface of the substrate 2105.

The second portion 2143b of the connection electrode 2143 may comprise a third electrode part 2143ba that does not overlap the second bonding part 2172 and a fourth electrode part 2143bb that overlaps the second bonding part 2172 in the first direction.

According to an embodiment, an area on which the first electrode part 2143ab contacts the first semiconductor layer 2111 may be provided to be greater than that on which the third electrode part 2143ba contacts the fourth semiconductor layer 2123.

For example, the area on which the first electrode part 2143ab contacts the first semiconductor layer 2111 may be provided to a size equal to or greater than 1.4% and equal to or smaller than 3.3% of a size of the lower surface of the substrate 2105. Also, the area on which the third electrode part 2143ab contacts the fourth semiconductor layer 2123 may be provided to a size equal to or greater than 0.7% and equal to or smaller than 3.0% of a size of the lower surface of the substrate 2105.

According to an embodiment, the area on which the first electrode part 2143ab contacts the first semiconductor layer 2111 may be provided to be greater 1.1 times to 2 times than that on which the third electrode part 2143ba contacts the fourth semiconductor layer 2123.

As described above, the area on which the first electrode part 2143ab contacts the first semiconductor layer 2111 may be provided to be greater than that on which the third electrode part 2143ba contacts the fourth semiconductor layer 2123, and thus, carriers may be smoothly spread, and an operation voltage may be prevented from increasing.

According to an embodiment, as power is applied to the first bonding part 2171 and the second bonding part 2172, the first and second light emitting structures 2110 and 2120 may emit light.

As the power is supplied to the first bonding part 2171 and second bonding part 2172, it is possible that the first bonding part 2171, the first electrode 2141, the second semiconductor layer 2113, the first semiconductor layer 2111, the connection electrode 2143, the fourth semiconductor layer 2123, the third semiconductor layer 2121, the second electrode 2142, and the second bonding part 2172 may be electrically connected to each other in series.

According to an embodiment, a high voltage may be applied between the first bonding part 2171 and the second bonding part 2172, and the applied high voltage may be dispersed and supplied to the first and second light emitting structures 2110 and 2120 through the first electrode 2141, the connection electrode 2143, and the second electrode 2142.

As described above, according to the light emitting device 2100 of an embodiment, the first bonding part 2171 and the first electrode 2141 may contact each other in a plurality of areas. Also, the second bonding part 2172 and the second electrode 2142 may contact each other on a plurality of areas. Thus, according to an embodiment, since the power is supplied through the plurality of areas, there is an advantage that the current dispersion effect is generated, and the operation voltage is reduced by the increase in contact area and the dispersion of the contact area.

Also, when the power is applied to the first bonding part 2171 and the second bonding part 2172, the area on which the first electrode part 2143ab contacts the first semiconductor layer 2111 may be provided to be greater than that on which the third electrode part 2143ba contacts the fourth semiconductor layer 2123, and thus, carriers may be smoothly spread, and an operation voltage may be prevented from increasing.

The light emitting device according to an embodiment may be connected to an external power in a flip chip bonding manner. For example, in the manufacturing of the light emitting device package, the upper surface of the first bonding part 2171 and the upper surface of the second bonding part 2172 may be disposed to be attached to a submount, a lead frame, a circuit board, or the like.

When the light emitting device according to an embodiment is mounted in the flip chip bonding manner to implement the light emitting device package, light provided from the first and second light emitting structures 2110 and 2120 may be emitted through the substrate 2105. The light emitted from the first and second light emitting structures 2110 and 2120 may be reflected by the first to third reflective layers 2161, 2162 and 2163 so as to be emitted toward the substrate 2105.

Also, the light emitted from the first and second light emitting structures 2110 and 2120 may be emitted in a lateral direction of the first and second light emitting structures 2110 and 2120.

Also, according to the light emitting device and the light emitting device package of an embodiment, since the first bonding part 2171 and the second bonding part 2172, each of which has a large area, may be directly bonded to the circuit board providing the power to easily and stably perform a flip chip bonding process.

According to an embodiment, a size of the first reflective layer 2161 may be provided to several micrometers larger than that of the first bonding part 2171. For example, an area of the first reflective layer 2161 may be provided to a size that is sufficient to completely cover the area of the first bonding part 2171. In consideration of a process error, a length of one side of the first reflective layer 2161 may be greater, for example, about 4 micrometers to about 10 micrometers than that of one side of the first bonding part 2171.

Also, the size of the second reflective layer 2162 may be provided to be greater several micrometers than that of the second bonding part 2172. For example, an area of the second reflective layer 2162 may be provided to a size that is sufficient to completely cover the area of the second bonding part 2172. In consideration of a process error, a length of one side of the second reflective layer 2162 may be greater, for example, about 4 micrometers to about 10 micrometers than that of one side of the second bonding part 2172.

According to an embodiments, light emitted from the first and second light emitting structures 2110 and 2120 may not be incident into the first bonding part 2171 and the second bonding part 2172 but be reflected by the first bonding part 2171 and the second bonding part 2172. Accordingly, according to an embodiment, a loss of the light generated in and emitted from the first and second light emitting structures 2110 and 2120 because the light is incident into the first bonding part 2171 and the second bonding part 2172 may be minimized.

Also, according to the light emitting device 2100 of an embodiment, since the third reflective layer 2163 is disposed between the first bonding part 2171 and the second bonding part 2172, emission of light between the first bonding part 2171 and the second bonding part 2172 may be minimized.

Also, a minimum distance between the first bonding part 2171 and the second bonding part 2172 may be provided to be equal to or greater than 125 micrometers. The minimum distance between the first bonding part 2171 and the second bonding part 2172 may be selected in consideration of an interval between a first electrode pad and a second electrode pad of the package body, on which the light emitting device 2100 is mounted.

For example, a minimum distance between the first electrode pad and the second electrode pad of the package body may be provided to minimum 125 micrometers and may be provided to maximum 200 micrometers. Here, when considering the process error, the distance between the first bonding part 2171 and the second bonding part 2172 may be, for example, 125 micrometers or more and 300 micrometers or less.

Also, the distance between the first bonding part 2171 and the second bonding part 2172 has to be greater than 125 micrometers so that a minimum space is secured to prevent the short circuit between the first bonding part 2171 and the second bonding part 2172 of the light emitting device from occurring, and the light emitting area for improving the light extraction efficiency is secured to increase in light intensity Po of the light emitting device 2100.

Also, the distance between the first bonding part 2171 and the second bonding part 2172 has to be equal to or smaller than 300 micrometers so that the first and second electrode pads of the light emitting device package and the first and second bonding parts 2171 and 2172 of the light emitting device are bonded to each other with sufficient bonding force, and the electrical characteristics of the light emitting device 2100 is secured.

The minimum distance between the first bonding part 2171 and the second bonding part 2172 may be greater than 125 micrometers to secure optical characteristics and also less than 300 micrometers to secure the electrical characteristics and reliability by the bonding force.

In this embodiment, in order to secure the optical characteristics, the electrical characteristics, and the bonding force, the distance between the first bonding part 2171 and the second bonding part 2172 is provided to 125 micrometers or more and 300 micrometers or less. However, this embodiment is not limited thereto, and the distance between the first bonding part 2171 and the second bonding part 2172 may be less than 125 micrometers to further improve the electrical characteristics or the reliability of the light emitting device package when compared to this embodiment and may be greater than 300 micrometers to further improve the optical properties when compared to this embodiment.

According to an embodiments, light emitted from the first and second light emitting structures 2110 and 2120 may not be incident into the first electrode 2141 and the second electrode 2142 but be reflected by the first electrode 2141 and the second electrode 2142. Accordingly, according to an embodiment, a loss of the light generated in and emitted from the first and second light emitting structures 2110 and 2120 because the light is incident into the first electrode 2141 and the second electrode 2142 may be minimized.

The light emitting device according to the embodiment described above has been described with reference to the structure in which the two light emitting structures are connected in series on one substrate. However, the light emitting device according to another embodiment may be provided in a structure in which three or more light emitting structures are connected in series on one substrate.

Figure 20:
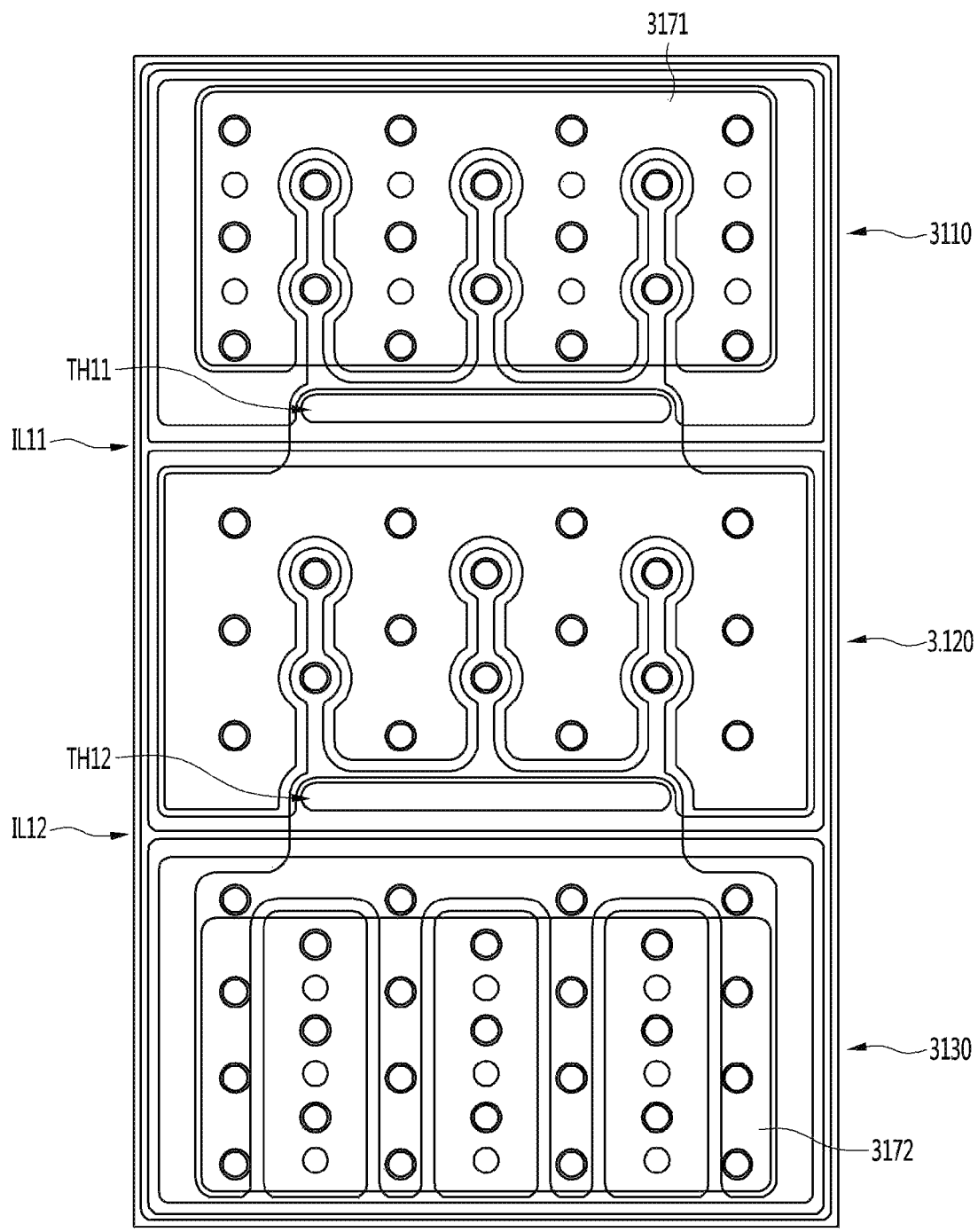
FIG. 20 is a view illustrating further another example of a light emitting device that is applied to the light emitting device package according to an embodiment of the present invention.

For example, the light emitting device illustrated in FIG. 20 illustrates an example in which three light emitting structures are connected in series on a single substrate. FIG. 20 is a view illustrating further another example of a light emitting device that is applied to the light emitting device package according to an embodiment of the present invention.

In the description of the light emitting device according to an embodiment with reference to FIG. 20, descriptions overlapping with those described above may be omitted.

As illustrated in FIG. 20, the light emitting device according to an embodiment may comprise a first light emitting structure 3110, a second light emitting structure 3120, and a third light emitting structure 3130.

The first light emitting structure 3110 and the second light emitting structure 3120 may be spaced apart from each other by a first isolation line IL11. Also, the second light emitting structure 3120 and the third light emitting structure 3130 may be spaced apart from each other by a second isolation line IL12.

A first line opening TH11 may be provided between the first light emitting structure 3110 and the second light emitting structure 3120. A lower semiconductor layer of the first light emitting structure 3110 may be exposed through the first line opening TH11.

The lower semiconductor layer of the first light emitting structure 3110 and an upper semiconductor layer of the second light emitting structure 3120 may be electrically connected to each other through a first connection electrode provided in the first line opening TH11.

A second line opening TH12 may be provided between the second light emitting structure 3120 and the third light emitting structure 3130. The lower semiconductor layer of the second light emitting structure 3120 may be exposed through the second line opening TH12.

The lower semiconductor layer of the second light emitting structure 3120 and the upper semiconductor layer of the third light emitting structure 3130 may be electrically connected to each other through a second connection electrode provided in the second line opening TH12.

According to an embodiment, a first bonding part 3171 may be disposed on the first light emitting structure 3110, and a second bonding part 3172 may be disposed on the third light emitting structure 3130. The first bonding part 3171 may be electrically connected to the upper semiconductor layer of the first light emitting structure 3110. Also, the second bonding part 3172 may be electrically connected to the lower semiconductor layer of the third light emitting structure 3130.

As power is supplied to the first bonding part 3171 and the second bonding part 3172 of the light emitting device according to an embodiment, it is possible that the first bonding part 3171, the upper semiconductor layer of the first light emitting structure 3110, the lower semiconductor layer of the first light emitting structure 3110, the first connection electrode, the upper semiconductor layer of the second light emitting structure 3120, the lower semiconductor layer of the second light emitting structure 3120, the second connection electrode, the upper semiconductor layer of the third light emitting structure 3130, the lower semiconductor layer of the third light emitting structure 3130, and the second bonding part 3172 are electrically connected in series to each other.

Also, according to an embodiment, a plurality of light emitting structures spaced apart from each other may be disposed between the first bonding part and the second bonding part of the light emitting device. In this embodiment, two and three light emitting structures are provided, but this embodiment is not thereto. For example, the more number of light emitting structures may be disposed as necessary.

Thus, the light emitting device according to an embodiment has an advantage in supplying a high voltage to improve the light output and reduce the operation voltage.

The light emitting device package according to an embodiment described above may be applied to the light source device.

In addition, the light source device may comprise a display device, a lighting device, a head lamp, or the like according to an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which semiconductor device emitting red, green, and blue light are disposed, respectively.

As still another example of the light source device, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may include a cover, a light source module, a heat radiator, a power supply, an inner case, and a socket. In addition, the light source device according to an embodiment may further include at least one of a member and a holder. The light source module may include the light emitting device or the light emitting device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device package and the method of manufacturing the semiconductor device package according to the embodiment, there is the advantage in improving the light extraction efficiency, the electrical characteristics, and the reliability.

According to the semiconductor device package and the method of manufacturing the semiconductor device package according to the embodiment, there is the advantage in improving the process efficiency and proposing the new package structure to reduce the manufacturing costs and improve the manufacturing yield.

The semiconductor device package according to the embodiment may be provided with the body having the high reflectance to prevent the reflector from being discolored, thereby improving the reliability of the semiconductor device package.

According to the semiconductor device package and the method of manufacturing the semiconductor device according to the embodiment, there is the advantage in preventing the re-melting phenomenon from occurring in the bonding area of the semiconductor device package while the semiconductor device package is re-bonded on the substrate or thermally treated.

What is claimed is:

1. A light emitting device package comprising:
   a package body comprising a first package body and a second package body, the second package including a first opening, the second package body being disposed on a top surface of the first package body;
   a light emitting device disposed in the first opening and including a first bonding part and a second bonding part;
   a first conductor disposed below the first bonding part;
   a second conductor disposed below the second bonding part;
   a first conductive layer, different from the first conductor, directly contacting a bottom surface of the first bonding part, and disposed on each of a bottom and side surfaces of the first conductor; and
   a second conductive layer, different from the second conductor, directly contacting a bottom surface of the second bonding part, and disposed on each of a bottom and side surfaces of the second conductor,
   wherein the first conductor is electrically connected to the first bonding part,
   wherein the second conductor is electrically connected to the second bonding part, and
   wherein an entirety of the first conductor and an entirety of the second conductor are disposed below the top surface of the first package body.

2. The light emitting device package of claim 1, wherein the light emitting device further includes a substrate, and a sum of areas of the first bonding part and the second bonding part is 0.7% or more of an area of an upper surface of the substrate.

3. The light emitting device package of claim 1, wherein the package body includes a first package body includes a second opening and a third opening.

4. The light emitting device package according to claim 3, wherein
   the first package body has a recess that is recessed from an upper surface of the first package body towards a lower surface of the first package body; and
   a first resin is disposed between the upper surface of the first package body and the light emitting device and disposed in the recess, and an entirety of the first resin is disposed directly below the light emitting device.

5. The light emitting device package according to claim 3, wherein a width of a lower region of the second opening is greater than a width of an upper region of the second opening, or
   wherein a width of a lower region of the third opening is greater than a width of an upper region of the third opening.

6. The light emitting device package according to claim 3, wherein the first conductive layer is disposed in the second opening,
   wherein the second conductive layer is disposed in the third opening,
   wherein the first conductor is electrically connected to the first conductive layer, and
   wherein the second conductor is electrically connected to the second conductive layer.

7. The light emitting device package according to claim 6, wherein a height of the first conductor between a top surface and a bottom surface thereof is smaller than a height of the first conductive layer between a top surface and a bottom surface thereof, and
   wherein a height of the second conductor between a top surface and a bottom surface thereof is smaller than a height of the second conductive layer between a top surface and a bottom surface thereof.

8. The light emitting device package according to claim 6, wherein
   a width of the first conductive layer is greater than a width of the first bonding part, and
   a width of the second conductive layer is greater than a width of the second bonding part.

9. The light emitting device package according to claim 6, wherein
   a lower surface of the first conductor is lower than an upper surface of the first conductive layer, and
   a lower surface of the second conductor is lower than an upper surface of the second conductive layer.

10. The light emitting device package according to claim 1, wherein
    the first conductor and the second conductor are bonded to the first bonding part and the second bonding part through separate bonding materials, respectively.

11. The light emitting device package according to claim 6, wherein the first conductive layer or the second conductive layer includes at least one of Ag, Au, Pt, Sn, Cu, and an alloy thereof.

12. The light emitting device package according to claim 6, wherein the first conductive layer or the second conductive layer is formed of a conductive paste.

13. The light emitting device package according to claim 6, wherein
    the first package body comprises a first frame and a second frame spaced apart from the first frame,
    a first plating layer is formed on surfaces of the first frame, and
    a second plating layer is formed on surfaces of the second frame.

14. The light emitting device package according to claim 13, wherein
    a first alloy layer is disposed in the second opening and formed by the first plating layer and the first conductive layer, and
    a second alloy layer is disposed in the third opening and formed by the second plating layer and the second conductive layer.

15. The light emitting device package according to claim 4, wherein the recess is provided in a closed loop shape under the light emitting device and around the second and third openings.

16. The light emitting device package according to claim 15, wherein when viewed from an upper side of the light emitting device, a size of the light emitting device is greater than a closed loop area provided by the recess.

17. The light emitting device package according to claim 15, wherein the closed loop defined by the recess is provided in an outline connecting four side surfaces of the light emitting device to each other.

18. The light emitting device package according to claim 3, wherein the first package body includes a first lower recess recessed upward from a lower surface of the first package body and spaced from the second opening, and a second lower recess recessed upward from the lower surface of the first package body and spaced from the third opening.

19. The light emitting device package according to claim 3, wherein each of the first conductor and the second conductor or each of the second and third openings includes a first point between an upper portion and a lower portion thereof and that gradually increases in width from a lower region toward the first point and then decreases in width again, and the width gradually increases from an intermediate region in which the width decreases toward the upper region and then decreases again.

20. The light emitting device package according to claim 3, wherein
an adhesion layer is disposed between the first package body and the second package body.

* * * * *